United States Patent
Kaufmann et al.

(10) Patent No.: US 12,431,324 B2
(45) Date of Patent: Sep. 30, 2025

(54) MULTI-BEAM DIGITAL SCAN AND IMAGE ACQUISITION

(71) Applicant: Carl Zeiss MultiSEM GmbH, Oberkochen (DE)

(72) Inventors: Nicolas Kaufmann, Aalen (DE); Andreas Adolf, Aalen (DE); Volker Wieczorek, Neu-Ulm (DE); Nico Kaemmer, Koenigsbronn (DE); Christof Riedesel, Aalen (DE); Stefan Schubert, Oberkochen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 429 days.

(21) Appl. No.: 17/813,518

(22) Filed: Jul. 19, 2022

(65) Prior Publication Data

US 2022/0351936 A1 Nov. 3, 2022

Related U.S. Application Data

(63) Continuation of application No. PCT/EP2021/052293, filed on Feb. 1, 2021.

(30) Foreign Application Priority Data

Feb. 4, 2020 (DE) .......................... 102020102779.6
Nov. 6, 2020 (DE) .......................... 102020213952.0

(51) Int. Cl.
H01J 37/28 (2006.01)
H01J 37/147 (2006.01)
(Continued)

(52) U.S. Cl.
CPC ........ *H01J 37/222* (2013.01); *H01J 37/1474* (2013.01); *H01J 37/244* (2013.01);
(Continued)

(58) Field of Classification Search
None
See application file for complete search history.

(56) References Cited

U.S. PATENT DOCUMENTS 4,130,761 A 12/1978 Matsuda
4,153,843 A 5/1979 Pease
(Continued)

FOREIGN PATENT DOCUMENTS

CN 1708087 A 12/2005
CN 108027499 A 5/2018
(Continued)

OTHER PUBLICATIONS

International Preliminary Report on Patentability for corresponding PCT Appl No. PCT/EP2021/052293, dated Jul. 28, 2022.
(Continued)

*Primary Examiner* — Eliza W Osenbaugh-Stewart
(74) *Attorney, Agent, or Firm* — Fish & Richardson P.C.

(57) ABSTRACT

A multi-beam charged particle microscope and a method of operating a multi-beam charged particle microscope for wafer inspection with high throughput and with high resolution and high reliability are provided. The method of operation and the multi-beam charged particle beam microscope comprises a mechanism for a synchronized scanning operation and image acquisition by a plurality of charged particle beamlets according a selected scan program, wherein the selected scan program can be selected according an inspection task from different scan programs.

22 Claims, 21 Drawing Sheets

Figure 1:
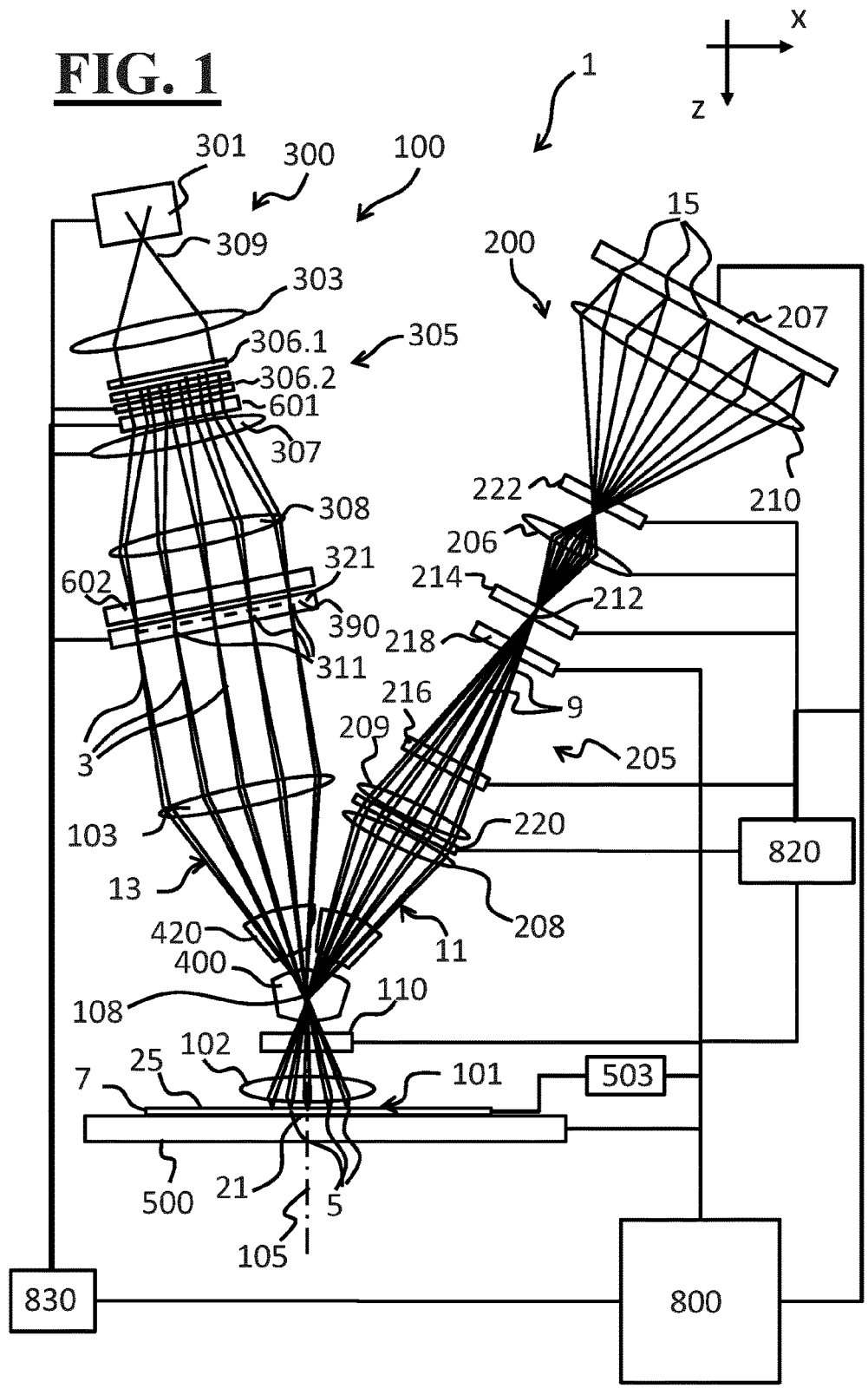

(51) Int. Cl.
  *H01J 37/22* (2006.01)
  *H01J 37/244* (2006.01)
  *H01J 37/26* (2006.01)
(52) U.S. Cl.
  CPC ............ *H01J 37/265* (2013.01); *H01J 37/28* (2013.01); *H01J 2237/1536* (2013.01); *H01J 2237/226* (2013.01); *H01J 2237/2448* (2013.01); *H01J 2237/2803* (2013.01)

(56) References Cited

U.S. PATENT DOCUMENTS

| | | | |
|---|---|---|---|
| 4,200,794 | A | 4/1980 | Newberry |
| 4,338,548 | A | 7/1982 | Bono |
| 4,742,234 | A | 5/1988 | Feldman |
| 5,215,623 | A | 6/1993 | Takahashi |
| 5,864,142 | A * | 1/1999 | Muraki ............... B82Y 10/00 250/491.1 |
| 5,892,224 | A | 4/1999 | Nakasuji |
| 5,905,267 | A | 5/1999 | Muraki |
| 5,981,954 | A | 11/1999 | Muraki |
| 6,107,636 | A | 8/2000 | Muraki |
| 6,124,599 | A | 9/2000 | Muraki |
| 6,137,113 | A | 10/2000 | Muraki |
| 6,323,499 | B1 | 11/2001 | Muraki |
| 6,333,508 | B1 | 12/2001 | Katsap |
| 6,617,595 | B1 | 9/2003 | Okunuki |
| 6,633,366 | B2 | 10/2003 | De Jager |
| 6,696,371 | B2 | 2/2004 | Butschke |
| 6,787,780 | B2 | 9/2004 | Hamaguchi |
| 6,804,288 | B2 | 10/2004 | Haraguchi |
| 6,818,911 | B2 | 11/2004 | Tamamori |
| 6,835,508 | B2 | 12/2004 | Butschke |
| 6,872,950 | B2 | 3/2005 | Shimada |
| 6,903,345 | B2 | 6/2005 | Ono |
| 6,903,353 | B2 | 6/2005 | Muraki |
| 6,917,045 | B2 | 7/2005 | Hashimoto |
| 6,919,574 | B2 | 7/2005 | Hashimoto |
| 6,943,349 | B2 | 9/2005 | Adamec |
| 6,953,938 | B2 | 10/2005 | Iwasaki |
| 6,992,290 | B2 | 1/2006 | Watanabe |
| 7,005,658 | B2 | 2/2006 | Muraki |
| 7,015,467 | B2 | 3/2006 | Maldonado |
| 7,060,984 | B2 | 6/2006 | Nagae |
| 7,084,411 | B2 | 8/2006 | Lammer-Pachlinger |
| 7,091,504 | B2 | 8/2006 | Wieland |
| 7,109,494 | B2 | 9/2006 | Ono |
| 7,126,141 | B2 | 10/2006 | Ono |
| 7,129,502 | B2 | 10/2006 | Kruit |
| 7,244,949 | B2 | 7/2007 | Knippelmeyer |
| 7,285,779 | B2 | 10/2007 | Litman |
| 7,332,730 | B2 | 2/2008 | Heinitz et al. |
| 7,375,326 | B2 | 5/2008 | Sender |
| 7,420,164 | B2 | 9/2008 | Nakasuji |
| 7,468,507 | B2 | 12/2008 | Rogers |
| 7,504,622 | B2 | 3/2009 | Elyasaf |
| 7,535,001 | B2 | 5/2009 | Sender |
| 7,601,972 | B2 | 10/2009 | Nakasuji |
| 7,619,203 | B2 | 11/2009 | Elyasaf |
| 7,696,497 | B2 | 4/2010 | Rogers |
| 8,035,082 | B2 | 10/2011 | Yamazaki |
| 8,134,135 | B2 | 3/2012 | Kruit |
| 8,350,214 | B2 | 1/2013 | Otaki |
| 8,362,425 | B2 | 1/2013 | Han |
| 8,384,051 | B2 | 2/2013 | Ozawa |
| 8,598,525 | B2 | 12/2013 | Zeidler |
| 8,618,496 | B2 | 12/2013 | Wieland |
| 8,704,192 | B2 | 4/2014 | Sano |
| 8,748,842 | B2 | 6/2014 | Ohashi |
| 8,779,399 | B2 | 7/2014 | Yamanaka |
| 8,829,465 | B2 | 9/2014 | Tsunoda |
| 8,963,099 | B2 | 2/2015 | Yamada |
| 9,153,413 | B2 | 10/2015 | Almogy |
| 9,263,233 | B2 | 2/2016 | Zeidler |
| 9,336,981 | B2 | 5/2016 | Knippelmeyer |
| 9,336,982 | B2 | 5/2016 | Zeidler |
| 9,349,571 | B2 | 5/2016 | Kemen |
| 9,368,314 | B2 | 6/2016 | Nakasuji |
| 9,530,613 | B2 | 12/2016 | Rogers |
| 9,536,702 | B2 | 1/2017 | Lang |
| 9,607,805 | B2 | 3/2017 | Liu |
| 9,653,254 | B2 | 5/2017 | Zeidler |
| 9,702,983 | B2 | 7/2017 | Eder |
| 9,922,799 | B2 | 3/2018 | Li |
| 9,991,089 | B2 | 6/2018 | Mueller |
| 10,062,541 | B2 | 8/2018 | Ren |
| 10,141,160 | B2 | 11/2018 | Ren |
| 10,354,831 | B2 | 7/2019 | Kemen |
| 10,388,487 | B2 | 8/2019 | Zeidler |
| 10,535,494 | B2 | 1/2020 | Zeidler |
| 10,541,112 | B2 | 1/2020 | Schubert |
| 10,586,677 | B1 | 3/2020 | Okada |
| 10,600,613 | B2 | 3/2020 | Zeidler |
| 10,622,184 | B2 | 4/2020 | Knippelmeyer |
| 10,643,820 | B2 | 5/2020 | Ren |
| 10,720,306 | B2 | 7/2020 | Yokosuka et al. |
| 10,741,355 | B1 | 8/2020 | Zeidler |
| 10,811,215 | B2 | 10/2020 | Zeidler |
| 10,854,423 | B2 | 12/2020 | Sarov |
| 10,879,031 | B2 | 12/2020 | Ren |
| 10,896,800 | B2 | 1/2021 | Riedesel |
| 2006/0016989 | A1 | 1/2006 | Nakasuji et al. |
| 2009/0014649 | A1 | 1/2009 | Nakasuji |
| 2013/0068959 | A1 | 3/2013 | Suzuki et al. |
| 2013/0143161 | A1 | 6/2013 | Arita et al. |
| 2014/0151570 | A1 | 6/2014 | Kato et al. |
| 2014/0197325 | A1 | 7/2014 | Kato |
| 2014/0226003 | A1 | 8/2014 | Phaneuf et al. |
| 2015/0364291 | A1 | 12/2015 | Ogawa et al. |
| 2016/0071696 | A1* | 3/2016 | Kuiper ............... H01J 37/3177 250/396 R |
| 2016/0268096 | A1 | 9/2016 | Ren et al. |
| 2017/0084424 | A1 | 3/2017 | Masnaghetti et al. |
| 2017/0133198 | A1 | 5/2017 | Kruit |
| 2017/0243715 | A1 | 8/2017 | Ogasawara |
| 2017/0345725 | A1 | 11/2017 | Hu et al. |
| 2018/0068825 | A1 | 3/2018 | Brodie |
| 2019/0172675 | A1 | 6/2019 | Masnaghetti et al. |
| 2019/0333732 | A1 | 10/2019 | Ren |
| 2019/0355544 | A1 | 11/2019 | Riedesel et al. |
| 2019/0360951 | A1* | 11/2019 | Ogawa ............... G01N 23/04 |
| 2020/0211810 | A1 | 7/2020 | Zeidler |
| 2020/0243300 | A1 | 7/2020 | Zeidler |
| 2020/0373116 | A1 | 11/2020 | Zeidler |
| 2021/0005423 | A1 | 1/2021 | Zeidler |
| 2021/0035773 | A1 | 2/2021 | Zeidler |
| 2023/0043036 | A1 | 2/2023 | Zeidler et al. |

FOREIGN PATENT DOCUMENTS

| | | |
|---|---|---|
| CN | 109690726 A | 4/2019 |
| DE | 102014008383 A1 | 12/2015 |
| DE | 102018007455 B4 | 7/2020 |
| DE | 102020102779 A1 | 8/2021 |
| GB | 2519511 A | 4/2015 |
| GB | 2521819 A | 7/2015 |
| JP | 59184524 A | 10/1984 |
| JP | 60042825 A | 3/1985 |
| JP | 60105229 A | 6/1985 |
| JP | 61263217 A | 11/1986 |
| JP | 2014229481 A | 12/2014 |
| JP | 2017-151159 A | 8/2017 |
| TW | 201447288 A | 12/2014 |
| TW | 201704741 A | 2/2017 |
| TW | 201721224 A | 6/2017 |
| TW | 201903813 A | 1/2019 |
| WO | WO2013032949 A1 | 3/2013 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |

(56) References Cited

FOREIGN PATENT DOCUMENTS

WO     WO2020151904 A2    7/2020
WO     WO2020249147 A1    12/2020

OTHER PUBLICATIONS

International Search Report and Written Opinion for corresponding PCT Appl No. PCT/EP2021/052293, dated Jun. 29, 2021.
Office Action in corresponding CN Appln. No. 202180012557.5, dated Feb. 24, 2025, 19 pages (with English translation).
Thong et al., "Reduction of Charging Effects Using Vector Scanning in the Scanning Electron Microscope" Scanning, Nov. 2001, 23(6):395-402.
German Office Action, with translation thereof, for corresponding DE Appl No. 10 2020 213 952.0, dated Aug. 19, 2021.
European Office Action for corresponding Appl No. 21 703 394.3, dated Sep. 26, 2024.
Japanese Office Action, with translation thereof, for corresponding JP 2022-547294, dated Aug. 1, 2023.
Korean Office Action, with translation thereof, for corresponding KR Appl No. 10-2022-7029809, dated Oct. 18, 2024.
Taiwanese Office Action, with translation thereof, for corresponding TW Appl No. 110103844, dated Jan. 21, 2022.
Taiwanese Office Action, with translation thereof, for corresponding TW Appl No. 111131259, dated Sep. 15, 2022.

\* cited by examiner

MULTI-BEAM DIGITAL SCAN AND IMAGE ACQUISITION

CROSS-REFERENCE TO RELATED APPLICATIONS

The present application is a continuation of, and claims benefit under 35 USC 120 to, international application PCT/EP2021/052293, filed Feb. 1, 2021, which claims benefit under 35 USC 119 of German Application No. 10 2020 102 779.6, filed Feb. 4, 2020, and German Application No. 10 2020 213 952.0, filed Nov. 6, 2020. The entire disclosure of these applications are incorporated by reference herein.

FIELD

The present disclosure relates to a multi-beam charged particle beam scanning inspection system including a multi-beam scanning and image acquisition system with high flexibility and throughput and a related method and a computer program product. The multi-beam charged particle beam inspection system comprises a scanner architecture and deflection scanner operation control, as well as an image acquisition module for synchronized image acquisition.

BACKGROUND

There is, in general, a continuous development of ever smaller and more sophisticated microstructures such as semiconductor devices, which can lead to further development and optimization of planar fabrication techniques and inspection systems for fabrication and inspection of the small dimensions of the microstructures. Development and fabrication of the semiconductor devices can involve for example design verification of test wafers, and the planar fabrication techniques can involve process optimization for reliable high throughput fabrication. In addition, recently the analysis of semiconductor wafers for reverse engineering and customized, individual configuring of semiconductor devices is often involved. High throughput inspection tools for the examination of the microstructures on wafers with high accuracy are therefore often desirable.

Typical silicon wafers used in manufacturing of semiconductor devices have diameters of up to 12 inches (300 mm). Each Wafer is segmented in 30-60 repetitive areas ("Dies") of about up to 800 sq mm size. A semiconductor comprises a plurality of semiconductor structures fabricated in layers on a surface of the wafer by planar integration techniques. Due to the fabrication processes involved, semiconductor wafers have typically a flat surface. The feature size of the integrated semiconductor structures extends between few μm down to the critical dimensions (CD) of 5 nm, with even decreasing features sizes expected in the near future, for example feature sizes or critical dimensions (CD) below 3 nm, for example 2 nm, or even below 1 nm. With the small structure sizes mentioned above, it is desirable to detect defects of the size of the critical dimensions in a very large area in a short time. For several applications, the specification for accuracy of a measurement provided by an inspection device is even higher, for example a factor of two or an order of magnitude. For example, it can be desirable to measure a width of a semiconductor feature with an accuracy below 1 nm, for example 0.3 nm or even less, and to determine a relative position of semiconductor structures with an overlay accuracy of below 1 nm, for example 0.3 nm or even less.

A recent development in the field of charged particle microscopes CPM is the MSEM, a multi-beam scanning electron microscope. A multi beam charged particle beam microscope is disclosed, for example, in U.S. Pat. No. 7,244,949 and in US20190355544. In a multi beam charged particle microscope, such as a multi beam electron microscope or MSEM, the sample is irradiated by an array of electron beamlets, comprising for example J=4 up to J=10000 electron beams, as primary radiation, whereby each electron beam is separated by a distance of 1-200 micrometers from its next neighboring electron beam. For example, an MSEM has about J=100 separated electron beams or beamlets, arranged on a hexagonal array, with the electron beamlets separated by a distance of about 10 μm. The plurality of primary charged particle beamlets is focused by a common objective lens on a surface of a sample under investigation, for example a semiconductor wafer fixed on a wafer chuck, which is mounted on a movable stage. During the illumination of the wafer surface with primary charged particle beamlets, interaction products, e.g. secondary electrons, originate from the plurality of intersection points formed by the focus points of the primary charged particle beamlets, while the amount and energy of interaction products depend on the material composition and topography of the wafer surface. The interaction products form a plurality of secondary charged particle beamlets, which is collected by the common objective lens and guided onto a detector arranged at a detector plane by a projection imaging system of the multi-beam inspection system. The detector comprises a plurality of detection areas, comprising for example a plurality of detection pixels and detects an intensity distribution for each of the plurality of secondary charged particle beamlets and a digital image patch of for example 100 μm×100 μm is obtained.

During image acquisition with an MSEM, the plurality of J primary beamlets is scanned over the sample, for example the wafer surface, with a collective charged particle deflection system. At the J scanning positions on the sample surface, secondary electrons are generated, forming a plurality of J secondary electron beamlets. The J secondary beamlets are imaged on an array of at least J detectors, each detector receiving a signal corresponding to the number of secondary electrons or intensity of an individual secondary electron beamlet. Thereby, a plurality of J image subfields is scanned during an image scan. The J digital image segments corresponding to the J image subfields are stitched together to form one or more digital image patches. Known deflection scanners in MSEM systems have been linear image scanners with a linear image processing configured for a linear data stream of intensity values of the plurality of J image subfields.

For single beam electron microscopes, different scan strategies are known. For example, in U.S. Ser. No. 10/720,306 B2, an interlaced scan strategy is applied, which is well known from cathode ray tube (CRT) televisions systems. As with CRT systems, such interlacing scan strategies are known to mitigate charging effects at a sample. Similar methods for single beam microscopes are described in "Reduction of Charging Effects Using Vector Scanning in the Scanning Electron Microscope", by J. T. L. THONG, K. W. LEE, W. K. WONG, SCANNING VOL. 23, 395-402 (2001).

In multi-beam charged particle microscopes, the amount of data generation is generally much higher, and image data are generated for the plurality of beamlets in parallel. Compared to the several years ago, recent desired properties often involve a scanning control and control of the data acquisition of much higher precision. A plurality of subfields is scanned and imaged in parallel. Additional desired properties and limitations can come along, for example the distance or pitch of the plurality of J primary charged particle beamlets are desirably considered, as well as the scanning induced distortion or desired properties for the image postprocessing.

In a single-beam scanning electron microscopes (SEM), a pre-compensation of a scanning induced distortion is generally well known and straight forward. In addition, the selection of a scan path configuration of a single beam scanning microscope is typically almost unlimited. For example, a magnification or resolution can almost arbitrarily be modified by the single beam raster scanner. This is however different in a multi-beam charged particle scanning microscope, with a plurality of J primary charged particle beamlets arranged in a raster configuration with a given pitch. Typically, the plurality of J primary charged particle beamlets is collectively scanned in parallel, and a plurality of J digital image data from a plurality of J image subfields is collected in parallel. For example, in general, a magnification or an orientation of a scanning operation cannot be changed arbitrarily.

SUMMARY

The present disclosure seeks to provide a charged particle system and operation method of a charged particle system that allow high throughput examination of integrated semiconductor features with the resolution of at least the critical dimension during the development or during manufacturing or for reverse engineering of semiconductor devices. The present disclosure also seeks to provide a charged particle system and method of operation of a charged particle system with high throughput, that allows a high precision measurement of semiconductor features with an accuracy below 1 nm, below 0.3 nm or even 0.1 nm.

In some embodiments, the present disclosure provides a multi-beam charged particle scanning inspection system with a plurality of J primary charged particle beamlets for wafer inspection with high imaging precision and with high speed or high throughput. In certain embodiments, the present disclosure provides a multi-beam charged particle inspection system with improved mitigation a charging effects during inspection of a wafer. In some embodiments, the present disclosure provides a multi-beam charged particle inspection system with reduced demand for post processing of the acquired image subfields, and for forming images patches from the image subfields. In certain embodiments, the present disclosure provides a multi-beam charged particle scanning inspection system with a plurality of J primary charged particle beamlets which is configured for a collective scanning imaging of a plurality of J image subfields with different scan programs or scan patterns.

According the disclosure, an improved multi-beam scanning and image acquisition unit for a multi-beam charged particle scanning microscope with a plurality of J primary charged particle beamlets is provided. With the improved multi-beam scanning and image acquisition unit, collective scanning of the plurality of primary charged particle beamlets with high precision and with synchronized, fast image acquisition is enabled. According an aspect of the disclosure, different scan programs or scan patterns are enabled by the improved multi-beam scanning and image acquisition unit with high precision, for example with a distortion below 1 nm. The image acquisition of the plurality of image subfields of an image patch is synchronized with a selected scan program or scan pattern. In an example, the image acquisition is enabled without the need of extensive image postprocessing. According an aspect of the disclosure, the improved multi-beam scanning and image acquisition unit enables different scan programs or scan patterns of the plurality of primary charged particle beamlets and a synchronized, fast image acquisition of the plurality of image subfields of an image patch. According a further aspect of the disclosure, the improved multi-beam scanning and image acquisition unit enables an interruption of scan programs or scan patterns of the plurality of primary charged particle beamlets and image acquisition of the plurality of image subfields of an image patch. During the interruption of a first scan program, further tasks or operations including a collective scanning of the plurality of primary charged particle beamlets according a second scan program are enabled.

With the method according a first embodiment, a method of operation of the improved multi-beam scanning and image acquisition unit is provided, which minimizes a scanning induced distortion of a multi-beam charged particle scanning microscope. With a second embodiment, a method of operation of the improved multi-beam scanning and image acquisition unit is provided, which enables and collective raster scanning and image acquisition according a selected scan program or scan patterns. In a third embodiment, an improved multi-beam scanning and image acquisition unit is provided. With the embodiments of the disclosure, the imaging performance is improved, higher flexibility is provided and throughput of an inspection task is increased.

In a multi-beam scanning and image acquisition method according the second embodiment, a scan program is selected and provided in configuration step. The multi-beam image scanning and acquisition method is separated in a first generic scan processing step, second specific scanning deflection control steps, and a third image data acquisition step.

The first generic scan processing step comprises at least one of a scan command receiving step and a scan command processing step. A selected scan program is received by the improved multi-beam scanning and image acquisition unit and transformed into a sequence of unit scan coordinates in unit subfield coordinates, for example pixel coordinates with integer precision within an image subfield. The first generic scan processing step is further comprising a vertex postprocessing step. According the selected scan program, a sequence of pre-compensation digital scan commands is generated in the first generic scan processing step and provided to second specific scanning deflection control steps. Each scanning deflection control step is comprising at least one of a specific conversion step, a vertex postprocessing step, a digital to analog conversion step and an amplification step. The third image data acquisition step is comprising an AD conversion step, a step of digital image data selection and a digital image data addressing and writing step. In the digital image data addressing and writing step, a plurality of image data is written into a parallel access memory of temporary storage corresponding to the plurality of pixel coordinates of the plurality of image data corresponding to the plurality of image subfields. In a further parallel read out and image processing step, the plurality of image data is read out from the parallel access memory and the image data is post-processed.

The modular separation in the first generic scan processing step and second scanning deflection control steps and has the advantage, that each specific scanning deflection control step can be adjusted or calibrated to different specific first collective multi-beam raster scanning systems or second collective multi-beam raster scanning systems without the need of an adaption or change of the generic scan processing step. It is therefore possible to modify a specific scanning deflection control step as desired for example for a specific first collective multi-beam raster scanning system, depending on whether for example an octupole scanner or a sequence of quadrupole scanners, a sequence of dipole scanners or other collective multi-beam raster scanning systems are used. With the modular separation in the first generic scan processing step and second scanning deflection control steps, systematic aberrations of a multi-beam charged particle system are separated from specific aberrations or nonlinear effects of an actual collective scanning system. The systematic aberrations of a multi-beam charged particle system are pre-compensated in the first generic scan processing step. The specific aberrations or nonlinear effects of an actual collective scanning system, for example first collective multi-beam raster scanner or second collective multi-beam raster scanner, respectively including nonlinearities of voltage amplification during amplification steps in each case, are pre-compensated in specific second scanning deflection control steps. In an example, the multi-beam scanning and image acquisition method comprises at least a first scanning deflection control step for operation control of the first collective multi-beam raster scanner and a second scanning deflection control step for operation control of the second collective multi-beam raster scanner. The multi-beam scanning and image acquisition method can comprise further scanning deflection control steps.

The modular separation in the first generic scan processing step and third image data acquisition step has the advantage, that different and complex scan programs can be selected and configured for an image acquisition of the plurality of J subfields, synchronized with the collective scanning operation of the plurality of J charged particle beamlets. For example, with the generation and provision of unit scan commands to the image data acquisition step, J streams of fluctuating voltages from the image sensor are converted, selected, sorted and written to a parallel access memory at a plurality of J addresses, and at each according the unit scan coordinates. For the different scan programs, a plurality of J sequences of memory address pointers of the plurality of J image data corresponding to the plurality of J image subfields is generated and the plurality of J image data is written to a parallel access memory at the plurality of J sequences of memory address pointers. With this method, different scan programs, including scan programs with arbitrary or random scan patterns, disjunct scan paths, or scan patterns with cascaded increase of resolution are enabled.

In a further aspect of the disclosure, a selected first scan program can be interrupted, and a second scan program or scan pattern can be selected during the interruption of the first scan program. For example, a calibration measurement or a repeated measurement of a plurality of J image segments of the plurality of J image subfields according a second scan pattern is performed during an interruption of a first scan program and an actual performance property such as a drift of the multi-beam charged particle microscope is monitored. The digital image data corresponding to the second scan program or scan pattern is written to different memory addresses as the digital image data of the first scan program.

The method of multi-beam scanning and image acquisition utilizes a common clock signal for synchronization of the operation as well as for clocking and streaming the streams or sequences of data generated during the multi-beam scanning and image acquisition method. The common clock signal is for example generated in the generic scan processing step and provided to the second scanning deflection control steps and the third image data acquisition step. A parallel read out and image processing step can operate at a different or the same clock frequency. The general control unit of the multi-beam charged particle scanning microscope can operate at a different or same clock frequency. Within the multi-beam scanning and image acquisition method, for example the DA conversion steps and the AD conversion steps are synchronized to provide synchronization of raster scanning deflection and image pixel data collection. Delays in the data processing subsequent to the AD conversion step as well as delays of the amplification step and collective deflection step subsequent the DA conversion steps can be calibrated and considered for example in digital image data selection step. Thereby, the plurality of digital image pixel data which are corresponding to actual scan positions in local subfield p,q-coordinates are written to a plurality of memory addresses, and at each of the plurality of memory addresses at addresses corresponding to the unit scan commands, which are corresponding to actual scan positions in subfield-coordinates (p,q).

With a method according the first embodiment, the scanning induced distortion is globally minimized, irrespective of the origin of the scanning induced distortion. According the first embodiment, a method of calibration of a multi-beam charged particle scanning electron microscope is provided, whereby a maximum scanning induced distortion is reduced, the method comprising a first step of performing a calibration measurement by raster scanning a plurality of J primary charged particle beamlets by a collective multi-beam raster scanner with a first driving signal V1(p,q) over the surface of a calibration sample. In a second step of deriving a plurality of scanning induced distortion patterns from the calibration measurement, a scanning induced distortion pattern is derived for each of a plurality of primary charged particle beamlets. In a third step, the plurality of scanning induced subfield distortion patterns is analyzed, for example by statistical methods, and a correction signal C(p,q) is derived. In an example, the third step of analyzing comprises deriving a reference distortion pattern of the plurality of scanning induced distortion patterns by statistical methods, the statistical methods comprise a computation of an average, a weighted average, or a computation of a median. The correction signal C(p,q) is derived from the reference distortion pattern. In a forth step of the method, the first driving signal V1(p,q) is modified with the correction signal C(p,q) and a modified driving signal V2(p,q) for driving the first collective multi-beam raster scanner is derived. By application of the modified driving signal V2(p,q) to the first collective multi-beam raster scanner, the reference distortion pattern is pre-compensated for each of the plurality of scanning induced distortion patterns and a maximum scanning induced distortion is minimized. In an example, the first to forth steps are repeated, until a maximum scanning induced distortion is minimized below a predetermined threshold.

According the first embodiment, a method of calibration of a multi-beam charged particle scanning electron microscope 1 is comprising
    a first step of performing a calibration measurement by raster scanning a plurality of primary charged particle beamlets 3 by a collective multi-beam raster scanner 110 with a first driving signal V1(p,q) over the surface 25 of a calibration sample, a second step of deriving a plurality of scanning induced subfield distortion patterns from the calibration measurement, comprising deriving a scanning induced distortion pattern for each of a plurality of primary charged particle beamlets 3, a third step of analyzing the plurality of scanning induced subfield distortion patterns and deriving a correction signal C(p,q), a forth step of modifying the first driving signal V1(p,q) with the correction signal C(p,q) and deriving a modified driving signal V2(p,q) for driving the collective multi-beam raster scanner 110, whereby a maximum scanning induced distortion is reduced.

In an example, the third step of analyzing comprises the further steps of deriving a reference distortion pattern of the plurality of scanning induced distortion patterns by statistical methods, the statistical methods comprise any of the computations of an average, a weighted average, or a median; and deriving the correction signal C(p,q) from the reference distortion pattern.

In an example, the first to forth steps are repeated, until a maximum scanning induced subfield distortion of each of the plurality of primary charged particle beamlets is minimized below a predetermined threshold. In an example, most of the maximum scanning induced subfield distortions of the plurality of primary charged particle beamlets 3 are reduced below the predetermined threshold, and a maximum scanning induced subfield distortion of a few individual primary charged particle beamlets exceeds the predetermined threshold. The few individual primary charged particle beamlets exceeding the predetermined threshold are flagged and the scanning induced subfield distortions of the image subfields corresponding to the flagged primary charged particle beamlets is for example compensated by a digital image post-processing. In an example, the correction signal C(p,q) is stored in a memory of a control unit of the collective multi-beam raster scanner, for pre-compensation of a scanning induced distortion according a selected scan program. During a scanning operation, the control unit applies the correction signal C(p,q) during collective raster scanning of the plurality of primary charged particle beamlets according a selected scan program and an average scanning induced distortion according the reference distortion pattern is pre-compensated.

With the method of the first embodiment, a correction function C(p,q) is generated, by which a scanning induced subfield distortion of a plurality of primary charged particle beamlets is minimized for example by a factor of two or for example to achieve a residual scanning induced distortion below a threshold, for example below 1 nm or below 0.5 nm. The correction function C(p,q) is applied during use to the scanning voltage signal.

According the second embodiment, a multi-beam scanning and image acquisition method for controlling a collective scanning of a plurality of J primary charged particle beamlets over a plurality of J image subfields and acquiring a plurality of J digital image data corresponding to a plurality of J image subfields with a multi-beam charged particle microscope is provided. The method comprises a configuration step for providing a plurality of scan programs and for selection of a selected scan program;

a generic scan processing step, during which the selected scan program is received and at least a first sequence of pre-compensation digital scan commands and a selection control signal is generated from the selected scan program;

a specific scanning deflection control step, during which at least a first amplified sequence of drive voltages is generated from the at least first sequence of pre-compensation digital scan commands and during which the at least first amplified sequence of drive voltages is provided to a collective deflection step, the collective deflection step for collective deflection of the plurality of J primary charged particle beamlets over the plurality of J image subfields on a surface of a sample;

an image data acquisition step, during which J streams of fluctuating voltages, collected during an analog data collection step from an image sensor unit, are converted and selected to form J streams of digital image data values, the J streams of digital image data values being written into a common access memory at a plurality of J memory locations to form the plurality of J digital image data corresponding to the plurality of J image subfields, whereby the selection and writing is controlled by the selection control signal generated in and provided by the generic scan processing step.

The method further comprises a parallel read out and image processing step, during which the plurality of J digital image data corresponding to the plurality of J image subfields is read out from the common access memory and image processing is performed. The image processing can comprise one of an image filtering, an image registration, a threshold operation, an object detection, dimension measurement of image objects, a distortion compensation, a contrast enhancement, a deconvolution operation, or an image correlation. The image processing can further comprise a stitching operation to form a single digital image file from the plurality of J digital image data.

In an example, during the generic scan processing step, at least a first sequence of unit scan commands is generated in normalized subfield coordinates (u,v). The first sequence of unit scan commands is converted to the sequence of pre-compensation digital scan commands in image subfield coordinates (p,q) by application of operations including one of a rotation, a change of scale, or a consideration of pre-determined correction function C(p,q), which is received from a memory.

In an example, the selection control signal generated during the generic scan processing step comprises the at least the first sequence of unit scan commands and during image data acquisition step, the J streams of digital image data values are written to the common access memory at a plurality of J memory locations corresponding to the plurality of J image subfield coordinates and the first sequence of unit scan commands.

In an example, during the generic scan processing step, a synchronized control command is exchanged with a scanning synchronized control step.

In an example, the plurality of J primary charged particle beamlets is configured in a raster configuration which is during use rotated by a rotation angle with respect to an orientation of a coordinate system of a stage or a sample mounted on the stage, and wherein during the generic scan processing step, the sequence of unit scan commands is adjusted to compensate the rotation of the raster configuration.

The method of operation and the multi-beam charged particle beam microscope comprises a mechanism for a synchronized scanning operation and image acquisition by a plurality of charged particle beamlets according a selected scan program, wherein the selected scan program can be selected according an inspection task from different scan programs, stored in a memory of a control unit of the multi-beam charged particle scanning microscope.

According an embodiment, a multi-beam charged particle microscope is provided which is configured to perform any of the methods or method steps of the first or second embodiments.

According the third embodiment, an improved multi-beam scanning and image acquisition unit comprises a scan control unit, which is connected to an image acquisition unit. The scan control unit is configured to generate during use at least a stream of digital signals representing scan coordinates in each image subfields according a selected scan program, and to convert the streams of digital signals into at least a sequence or stream of driving voltages for driving a collective multi-beam raster scanner. During use, the collective multi-beam raster scanner is configured to scanning deflect a plurality or J primary charged particle beamlets over a plurality of J image subfields according the sequence of driving voltages. A digital image acquisition unit is configured to acquire a plurality of J sequences or streams of digital image data corresponding to the plurality of J image signals from the plurality of J image subfields. The digital image acquisition unit is connected to the scan control unit and is configured to synchronize the image acquisition with the selected scan program and to write the plurality of J streams of digital image data in a plurality of J memory positions according the sequence of scan coordinates of a selected scan program. The selected scan program can be one out of several different scan programs and is described by a sequence of scan commands, comprising for example line and point coordinates, or by a functional description, for example comprising repetitive functional loops. Different scan programs can be stored in a memory of a control unit and selected for specific inspection tasks with the multi-beam charged particle scanning microscope 1.

According an embodiment of the disclosure, a multi-beam charged particle microscope 1 is comprising
- at least a first collective raster scanner 110 for collective scanning a plurality of J primary charged particle beamlets 3 over a plurality of J image subfields 31.11 to 31.MN; and
- a detection system 200, comprising a detector 207 for detecting a plurality of J secondary electron beamlets 9, each corresponding to one of the J image subfields 31.11 to 31.MN; and
- an imaging control module 820, the imaging control module 820 comprising:
- a scan control unit 930, connected to the first collective raster scanner 110 and configured for controlling during use a raster scanning operation of a plurality of J primary charged particle beamlets 3 with the first collective raster scanner 110 according a first selected scan program 762,
- an image data acquisition unit 810, connected to the scan control unit 930 and the detector 207, configured for acquiring and selecting during use a plurality of J image data from a detector 207 synchronized with a clock signal provided by the scan control unit 930, and configured for writing the plurality of J image data into a parallel access memory 1816 at memory locations corresponding according the first selected scan program 762.

In an example, the scan control unit 930 comprises a clock signal generator 938, configured to provide during use the clock signal to scan control unit 930 and image acquisition unit 810. The scan control unit 930 can further be connected to at least a further system 960, which is configured for synchronized operation with the raster scanning operation. A further system 960 can be a collective deflector 350, configured for collectively deflecting during use the plurality of J primary charged particle into a beam-dump 130.

The multi-beam charged particle microscope 1 can further comprise a second collective raster scanner 222, arranged in the detection system 200. The scan control unit 930 is further connected to the second collective raster scanner 222.

The imaging control module 820 of the third embodiment can comprise a voltage supply 925, configured to supply voltages to the scan control unit 930 and image acquisition unit 810, and configured to supply during use driving voltages to the first collective raster scanner 110 or the second collective raster scanner 222.

According an embodiment, the scan control unit 930 of a multi-beam charged particle scanning microscope 1 comprises
- a scan generator module 932, connected to the clock unit 938; and
- a first amplifier module 936.1, connected to the first collective raster scanner 110; and
- a second amplifier module 936.2, connected to the second collective raster scanner 222;
- the scan generator module 932 being configured to generate and provide during use a sequence of pre-compensation digital scan commands to the first amplifier module 936.1 and the second amplifier module 936.2; and
- the first amplifier module 936.1 being configured to generate during use at least a first amplified sequence of drive voltages to an electrode of the first collective raster scanner 110;
- the second amplifier module 936.2 being configured to generate during use at least a second amplified sequence of drive voltages to an electrode of the second collective raster scanner 110.

The scan control unit 930 can further comprise at least a further amplifier module 936.3, connected to a system 960.3 configured for synchronized operation during use with the raster scanning deflection. The scan generator module 932 can further be connected to the image acquisition module 810.

According an embodiment, an image data acquisition unit 810 of a multi-beam charged particle scanning microscope 1 comprises
- an ADC module 1808, comprising a plurality of AD converters connected to the image sensor 207 and configured for converting during use the plurality of S fluctuation voltages 786 into a plurality of S streams of digital sensor data 788; and
- an acquisition control unit 1812, connected to the ADC module 1808 and the scan control unit 930 and configured for selecting during use a plurality of S streams of digital image data values 790 from the plurality of S streams of digital sensor data 788 and from a selection control signal 744 provided during use by the scan control unit 930 according the selected scan program 762; and
- and image data sorter 1820, connected to the acquisition control unit 1812, the scan control unit 930, and to the parallel access memory 1816;
- wherein the image data sorter 1820 is configured for writing during use the plurality of S streams of digital image data values 790 into the parallel access memory 1816 at a plurality of memory addresses corresponding to scan positions of the plurality of S primary charged particle beamlets 3 according the selected scan program 762. In an example, an imaging control module 820 comprises a plurality of L image data acquisition units 810, with S×L=J, with J being the number of the plurality of primary beamlets 3 generated and utilized during use of the multi-beam charged particle microscope 1. In an example, an imaging control module 820 comprises an image data acquisition unit 810, with S=J, with J being the number of the plurality of primary beamlets 3 generated and utilized during use of the multi-beam charged particle microscope 1. In an example, the number L of image data acquisition units 810 is selected according a number S of fluctuation voltages 786, each corresponding to primary beamlet 3, which can be processed by a single image data acquisition unit 810. The number S can for example be S=6, 8, 10, 12 or more fluctuation voltages 786. The number L can be L=1, 8, 10, 12, 20 or more, for example L can be 100.

The ADC module can be connected to clock unit and can be configured to receive during use a clock signal from clock unit 938 and to synchronize an operation of the plurality of AD converters for converting during use the plurality of J fluctuation voltages 786 into a plurality of J streams of digital sensor data 788. The clock unit 938 can be connected to control unit 800 and can be configured to receive a control signal from the control unit 800 and can be configured to change during use a clock frequency of the clock unit 938.

A multi-beam charged particle microscope 1 according an embodiment is comprising
- a multi-beam generator 300 for generation of a plurality of primary charged particle beamlets,
- a first collective raster scanner 110 and a second collective raster scanner 222, and
- a detection unit 200 including a detector 207, and
- an imaging control module 820, comprising a scan control unit 930 and an image acquisition unit 810, for scanning and imaging an inspection site of a sample with a selected scan program 762;
- the scan control unit 930 is comprising a generic scan generator module 932 and at least a first amplifier module 936.1 for providing at least a sequence of high voltages to an electrode of the first collective raster scanner 110 and a second amplifier module 936.2 for providing at least a sequence of high voltages to an electrode of the second collective raster scanner 220, wherein the scan control unit 930 is adapted to optionally include a third or a further amplifier module 936.3 or 936.n for control of a third or further operating unit 960.3 or 960.n for synchronized operation during use with the selected scan program 762.

In an example, the generic scan generator module 932 comprises a vertex postprocessing unit which is configured during use for a pre-compensation of a systematic scanning induced aberration of the multi-beam charged particle microscope 1. Each amplifier module comprises a vertex postprocessing unit, a digital to analog converter and an amplifier, whereby in each amplifier module, a nonlinearity of an operation of the amplifier module in conjunction with the operating unit 960.i for synchronized operation is pre-compensated individually for each operating unit 960.i. An operating unit 960.i can be the first collective multi-beam raster scanner 110 or second collective multi-beam raster scanner 222.

In an example, a multi-beam charged particle microscope is comprising a multi-beam generator configured to generate a plurality of primary charged particle beamlets in a hexagonal raster configuration, and the imaging control module is configured for scanning and imaging an inspection site of a sample such as a wafer with a plurality of image subfields, each of the plurality of image subfields having a hexagonal shape. A multi-beam charged particle microscope 1 is therefore comprising
- a multi-beam generator 300 for generation of a plurality of J primary charged particle beamlets 3 in a hexagonal raster configuration,
- a first collective raster scanner 110 and a second collective raster scanner 222, and
- a detection unit 200 including a detector 207, and
- an imaging control module 820, comprising a scan control unit 930 and an image acquisition unit 810, for scanning and imaging an inspection site of a sample with a plurality of J image subfields 31, each of the plurality of J image subfields 31 having a hexagonal shape.

In an example, a multi-beam charged particle microscope is comprising
- a multi-beam generator 300 for generation of a plurality of J primary charged particle beamlets 3,
- a first collective raster scanner 110 and a second collective raster scanner 222, and
- a detection unit 200 including a detector 207, and
- an objective lens 102,
- an imaging control module 820, comprising a scan control unit 930 and an image acquisition unit 810, for controlling of the scanning the plurality of J primary charged particle beamlets 3 and for controlling the acquisition of an image patch of a surface of a sample with a plurality of scanning lines arranged in a plurality of J image subfields 31, wherein the imaging control module 820 is configured to change an orientation of the plurality the scanning lines with respect to an orientation of the sample. In an example, the imaging control module 820 is further configured to change the at least a length of a scanning line or the number of scanning lines in order to change the size of the plurality of J image subfields 31 for covering the image patch. In an example, the multi-beam charged particle microscope 1 further comprises a control unit 800 for controlling an operation condition of the objective lens 102 and wherein the change of the orientation of the plurality the scanning lines is in accordance with a rotation of the raster configuration of the plurality of J primary charged particle beamlets 3 induced by the change of an operation condition of the objective lens 102. The change of an operation condition can for example be a change of a working distance between the sample surface and a reference surface of the multi-beam charged particle microscope 1 or a change of focus plane of the multi-beam charged particle microscope 1, or a change of magnification of the multi-beam charged particle microscope 1.

According an embodiment, the multi-beam scanning and image acquisition method comprises a selection of a selected scan program and collectively deflecting the plurality of J primary charged particle beamlets over the plurality of J image subfields on a surface of a sample according the selected scan program. The method further comprises acquiring J streams of fluctuating voltages and converting the J streams of fluctuating voltages with a clock rate to form J streams of digital image data values. The method further comprises processing at least two digital image data values from each of the J streams of digital image data values to form a sum, an average digital image data value, or a difference of the digital image data values, and writing the J streams of digital image data values including the sum, an average digital image data value, or a difference of the digital image data values into a common access memory at predefined memory locations. In the example, each pixel location within each of the plurality of image subfield is illuminated by a primary charged particle beamlet with an extended dwell time. The extended dwell time can correspond to G times the inverse of a clock rate, with G being an integer with G=2, 3, 4 or more. In another example, the scan program comprises an individual scan pattern and further comprises a repeated scanning illumination of each pixel location 55 within the individual scan. With this method, for example comprising a pixel or line averaging, it is possible to increase the signal to noise ratio (SNR) for the digital image data collected from the surface area of the object, and it is for example possible to achieve an overview image of the surface area of an object in combination with an image of a selected area with higher SNR.

With the embodiments of the disclosure, a more flexible image scanning and acquisition method is enabled, and a more flexible image scanning and data processing architectures is given. With the examples and embodiments of the disclosure, the imaging precision and the throughput of a multi-beam charged particle is increased. For example, a scanning induced aberration is minimized, for example by pre-compensation of a scanning nonlinearity. For example, by utilizing hexagonal image subfields, the maximum amount of a scanning deflection is reduced compared to rectangular image subfields, and a large surface area of an image patch is scanning imaged with lower induced aberrations and increased imaging performance at the same throughput or time per image acquisitions. For example, each image subfield is segmented in different, optionally disjunct scan patterns, and a charging of a sample is controlled. For example, a demand for an image post-processing is reduced and the image data are generated with higher precision with high throughput.

Further details are described at the example of the embodiments. Further embodiments comprise combinations or variations of the examples and embodiments described below. More details will be disclosed with reference to the attached drawings. Thereby shows:

FIG. 1: An illustration of a multi-beam charged particle microscope system according an embodiment.

Figure 2:
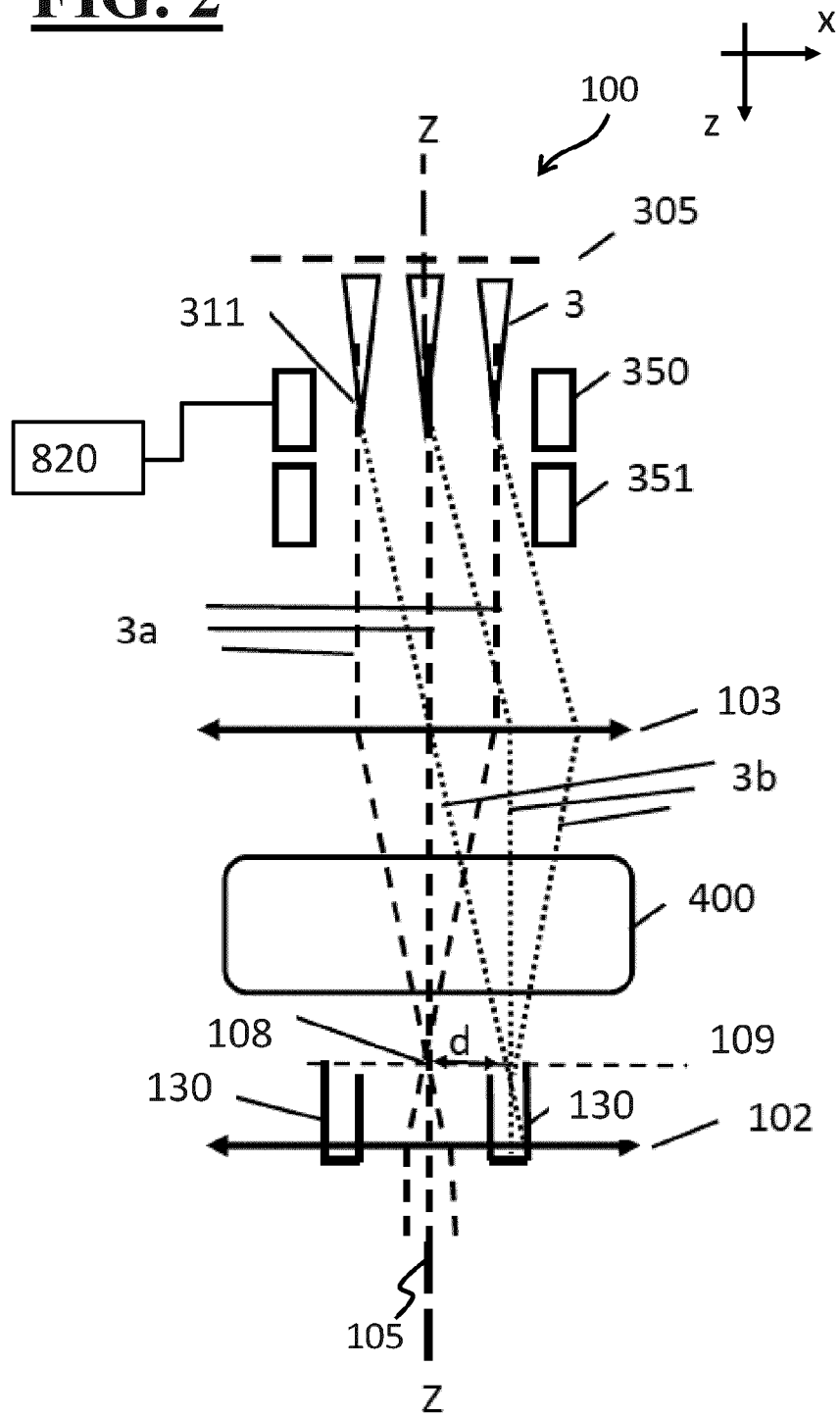

FIG. 2: An illustration of further details of a multi-beam charged particle microscope system comprising a deflector and a beam dump.

Figure 3:
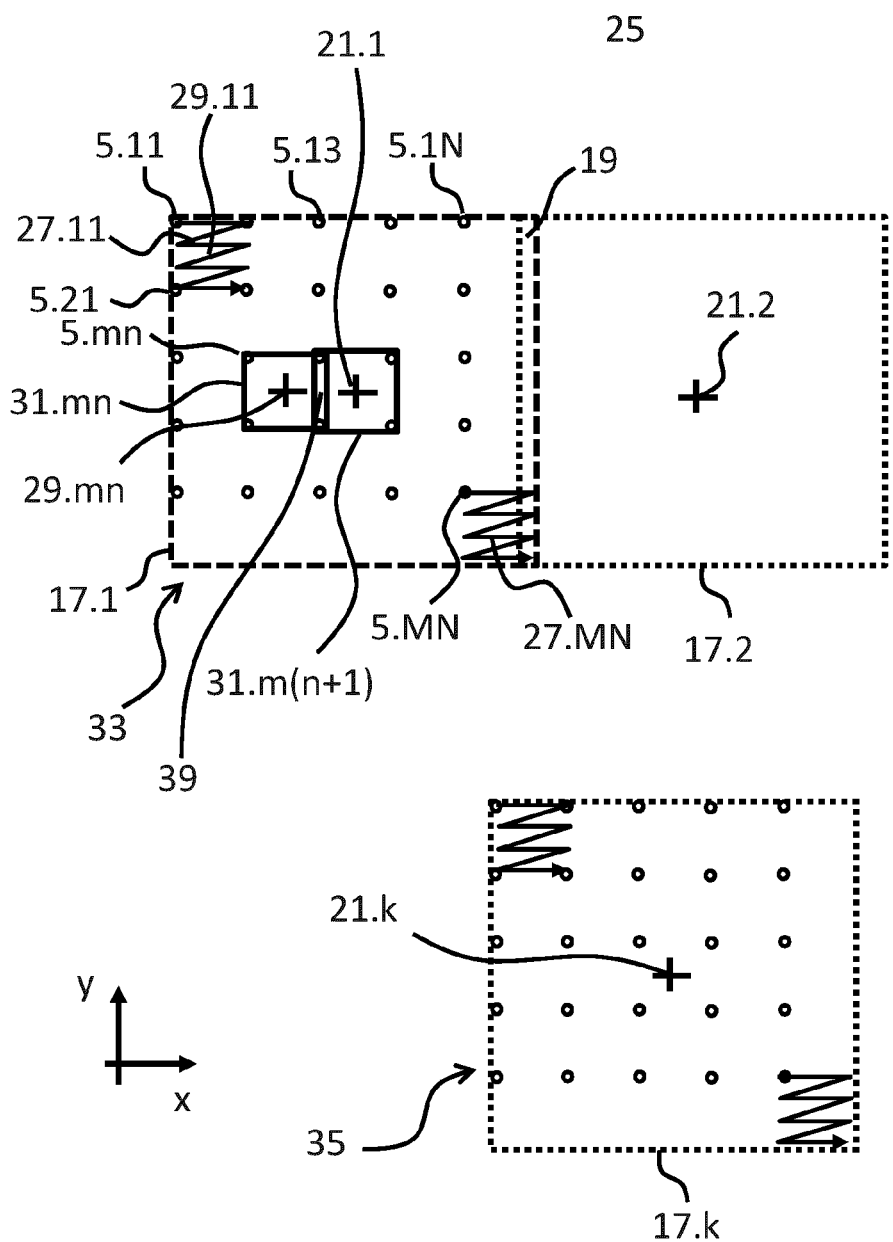

FIG. 3: Illustration of the coordinates of a first inspection site comprising a first and a second image patch and a second inspection site.

Figure 4:
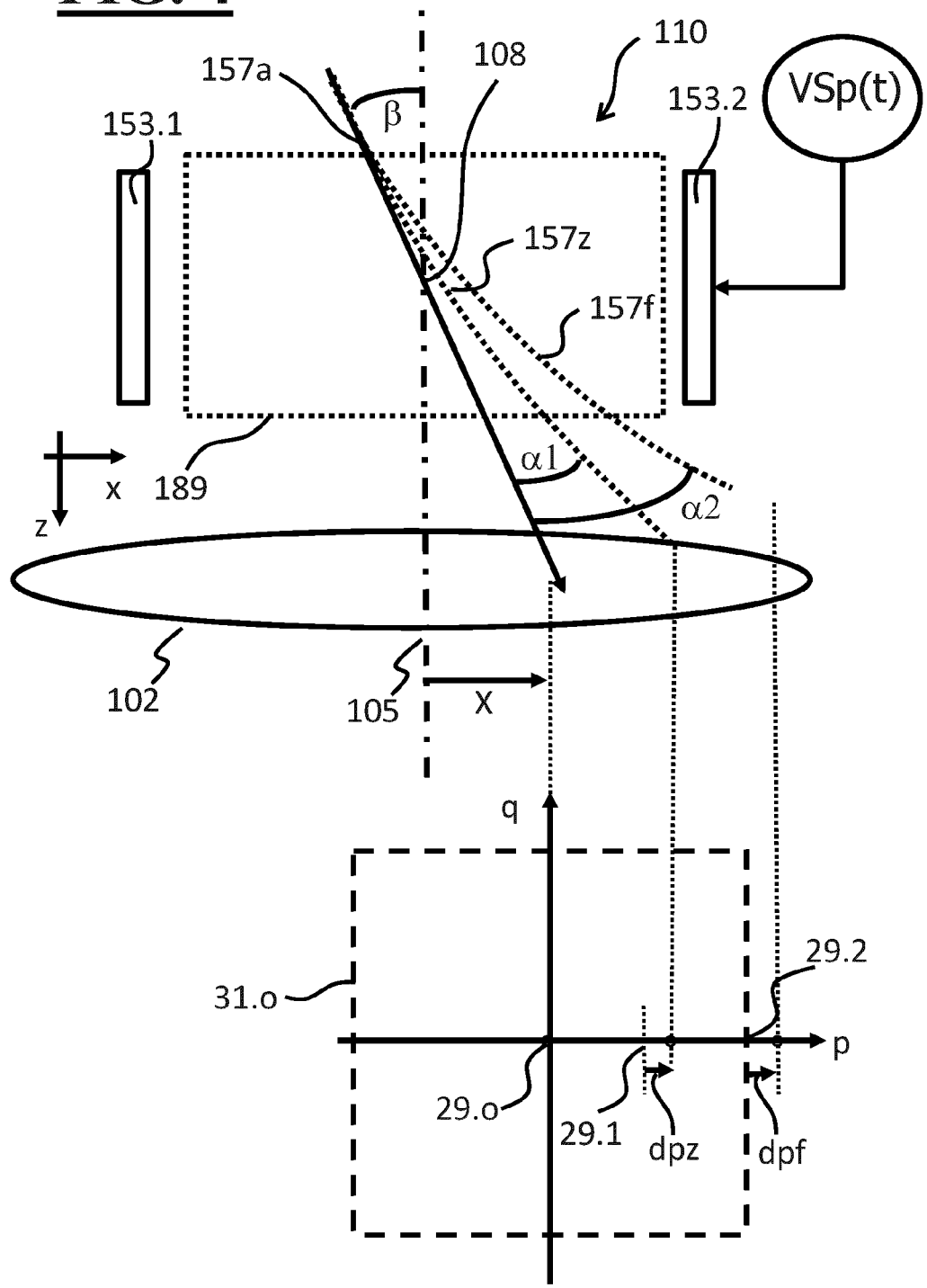

FIG. 4: Illustration of the operation of a first collective multi-beam raster scanner at the example of a selected primary charged particle beamlet.

Figure 5A:
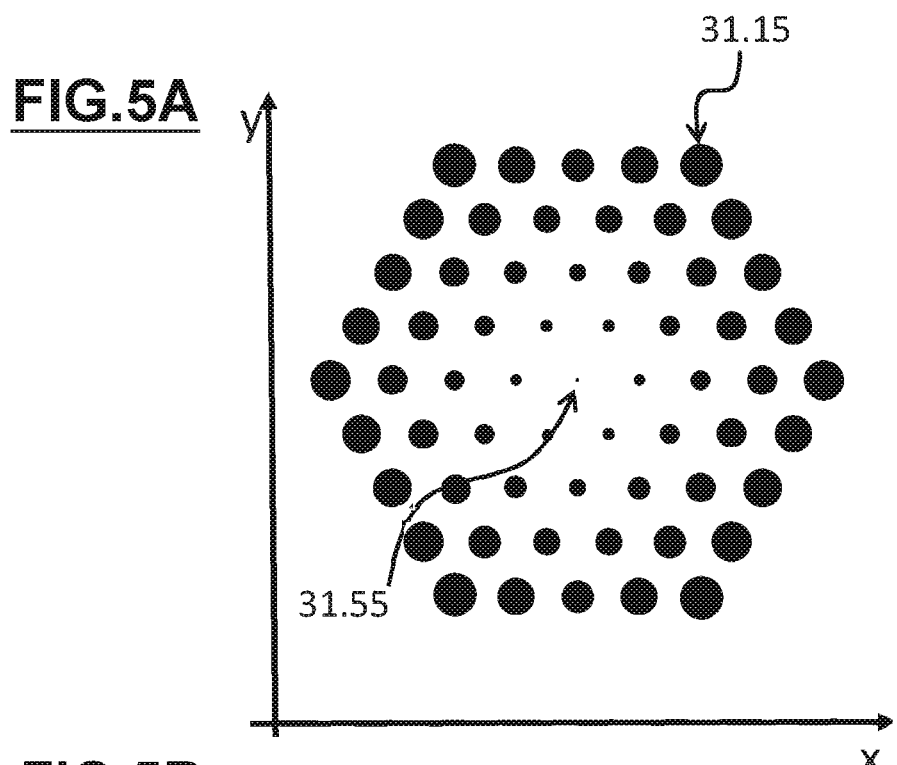
Figure 5B:
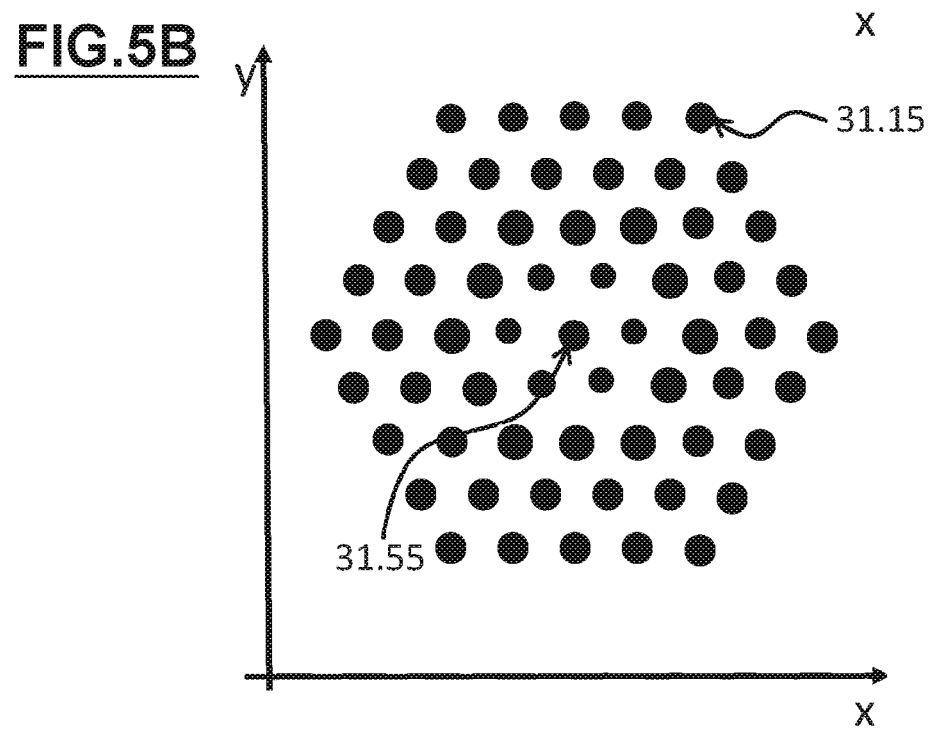

FIGS. 5A-5B: Illustration of a maximum scanning induced distortion for each of the plurality of primary charged particle beamlets (A) before pre-compensation and (B) after pre-compensation of a scanning induced distortion.

Figure 6:
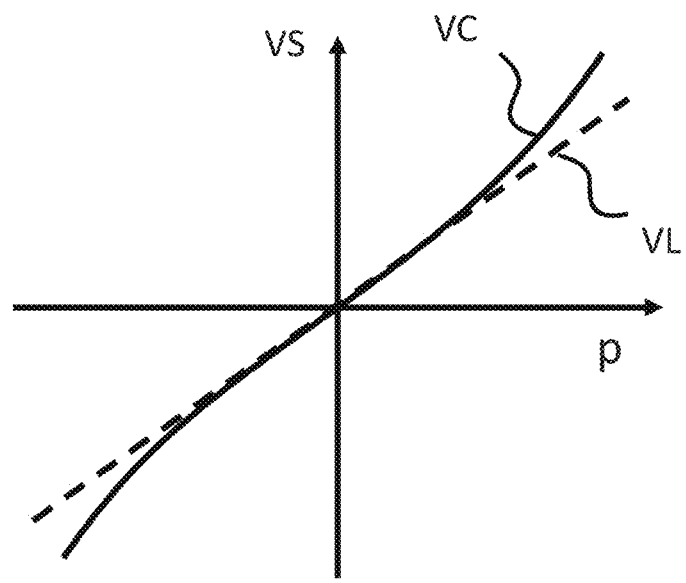

FIG. 6: Illustration of a compensation of the non-linear behavior of the first collective multi-beam raster scanner by a non-linear driving voltage.

Figure 7:
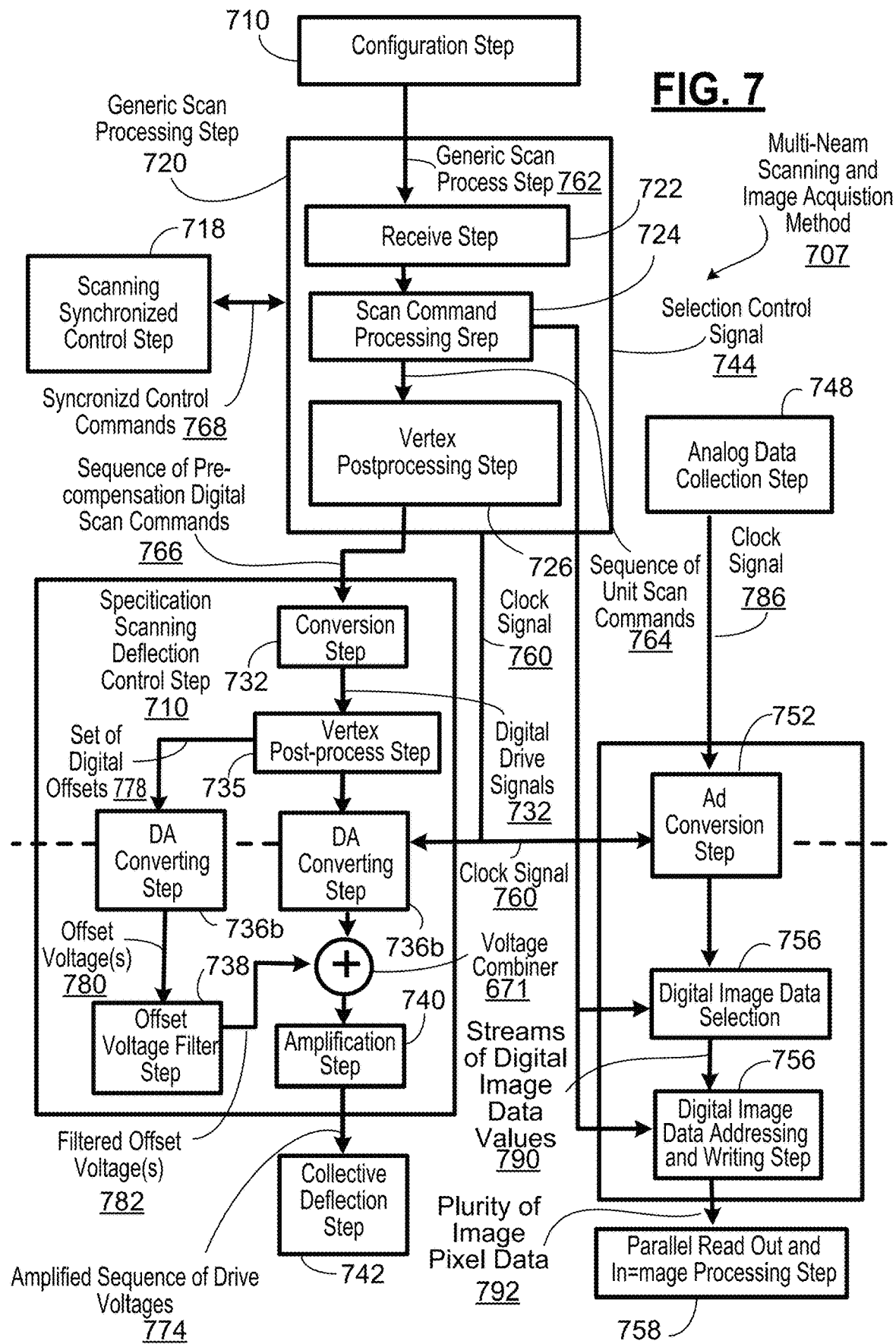

FIG. 7: Illustration of a multi-beam scanning and image acquisition method.

Figure 8:
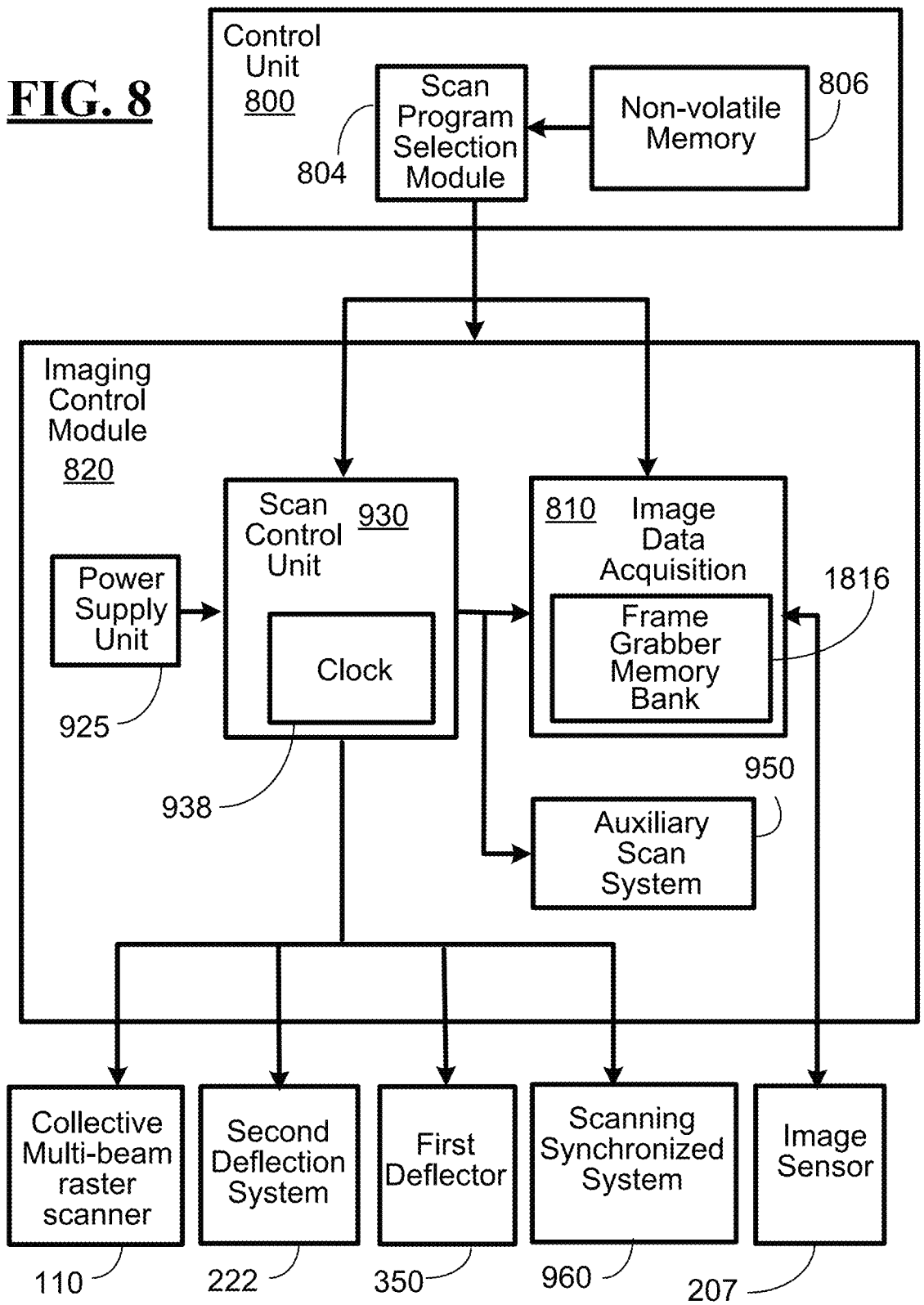

FIG. 8: Illustration of an architecture of an imaging control module and related modules.

Figure 9:
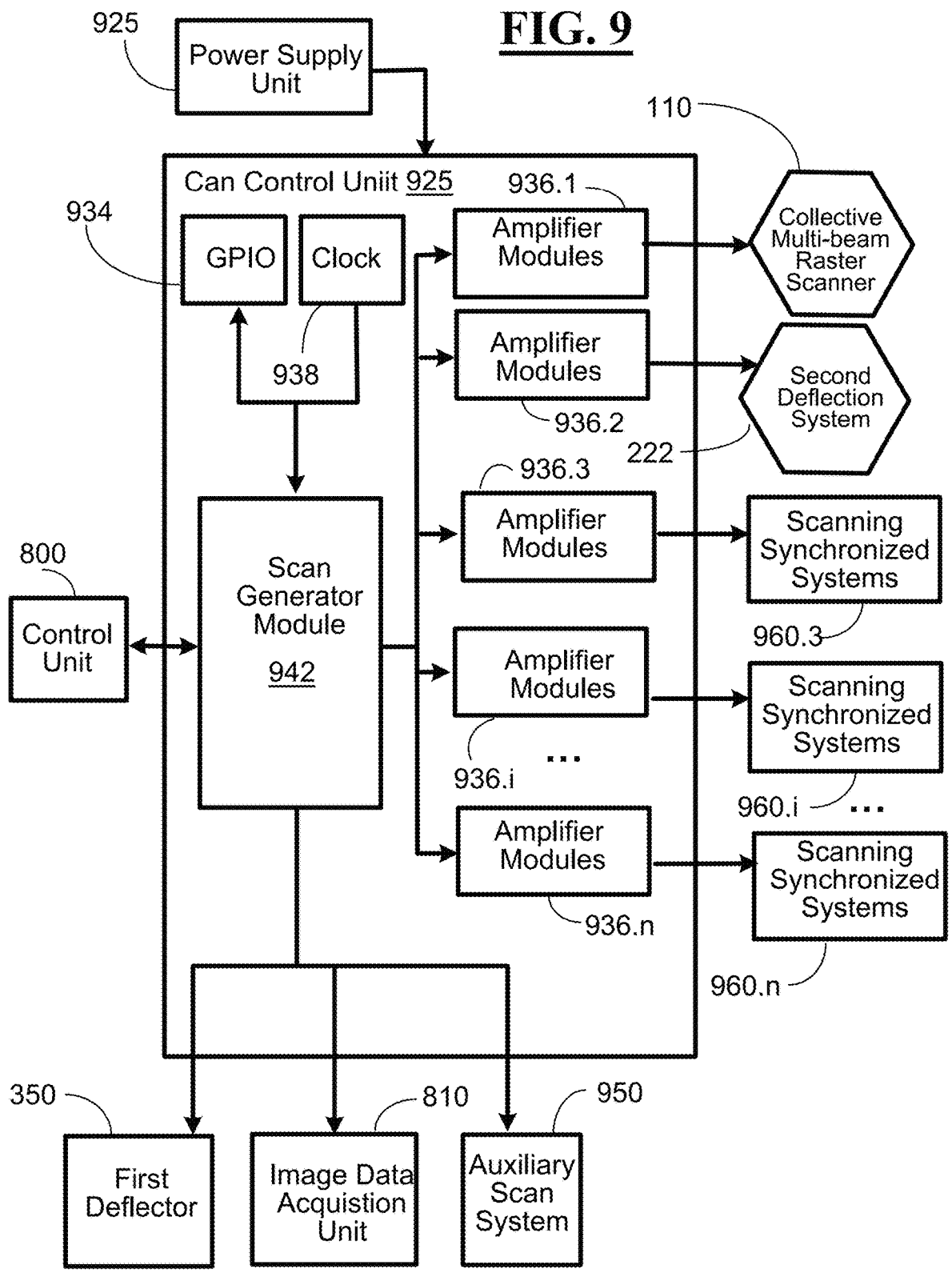

FIG. 9: Illustration of a scan control unit and related units or modules.

Figure 10:
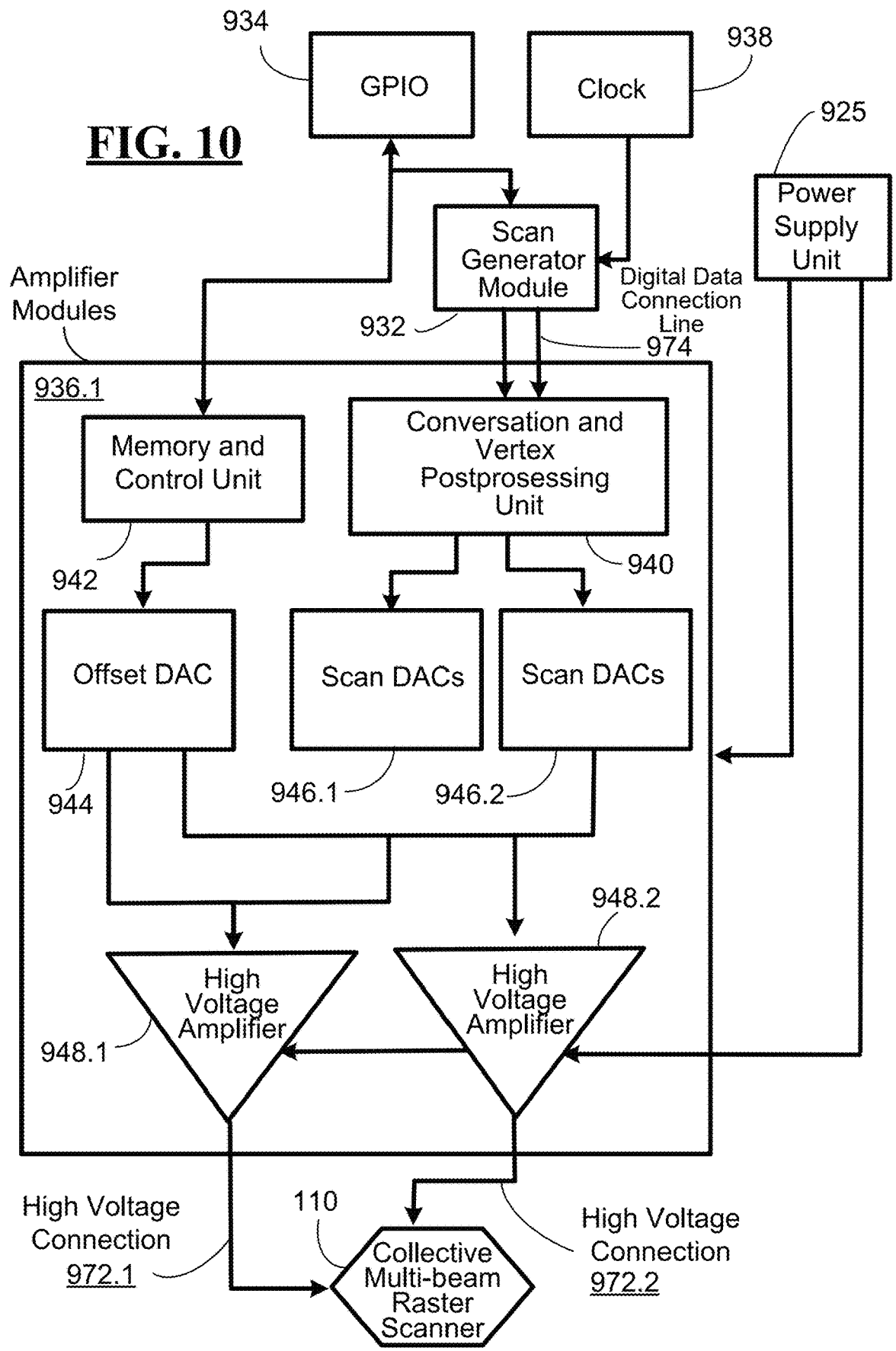

FIG. 10: Illustration of an amplifier module

Figure 11:
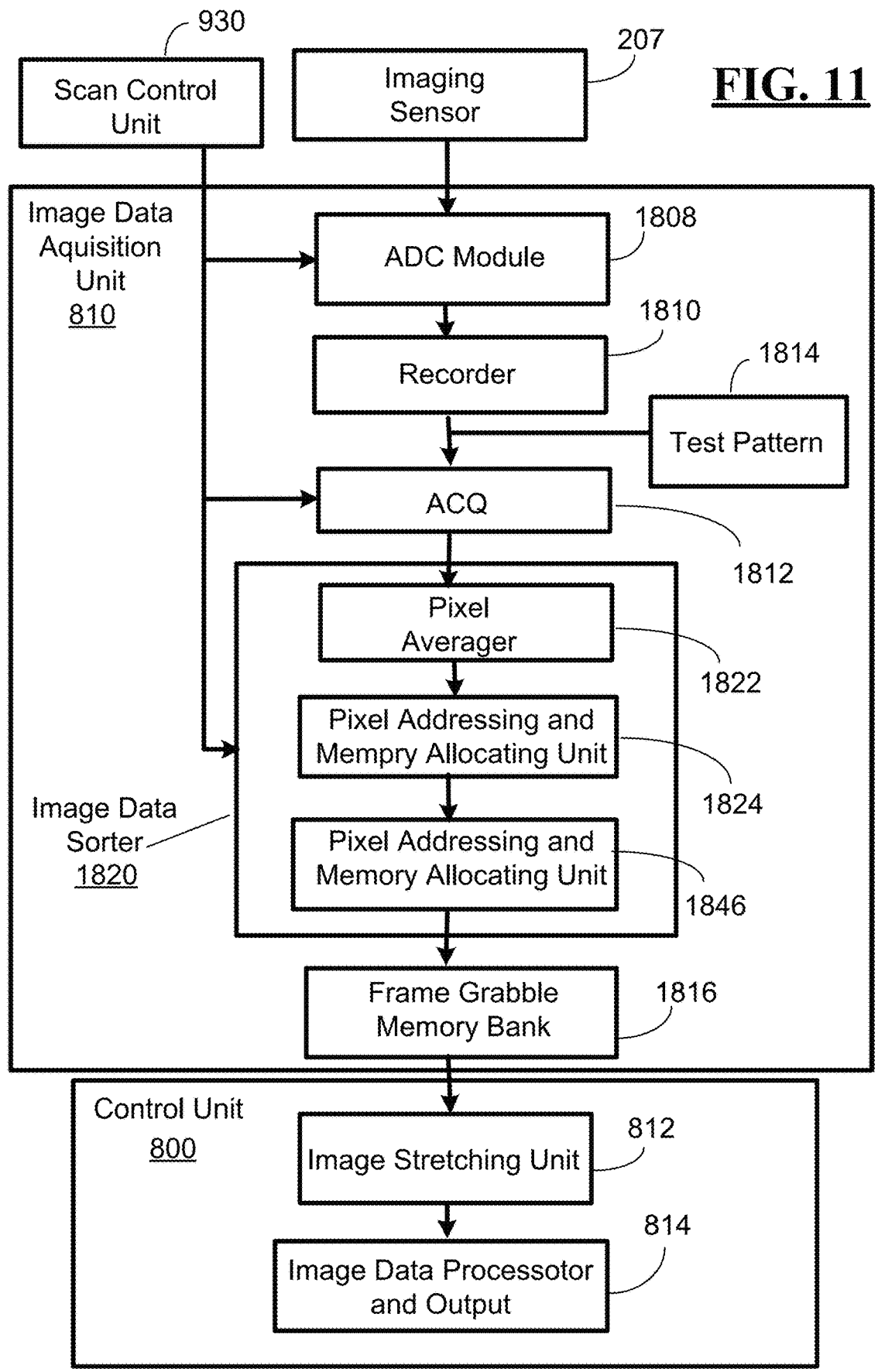

FIG. 11: Illustration of an image data acquisition unit and related units or modules.

Figure 12A:
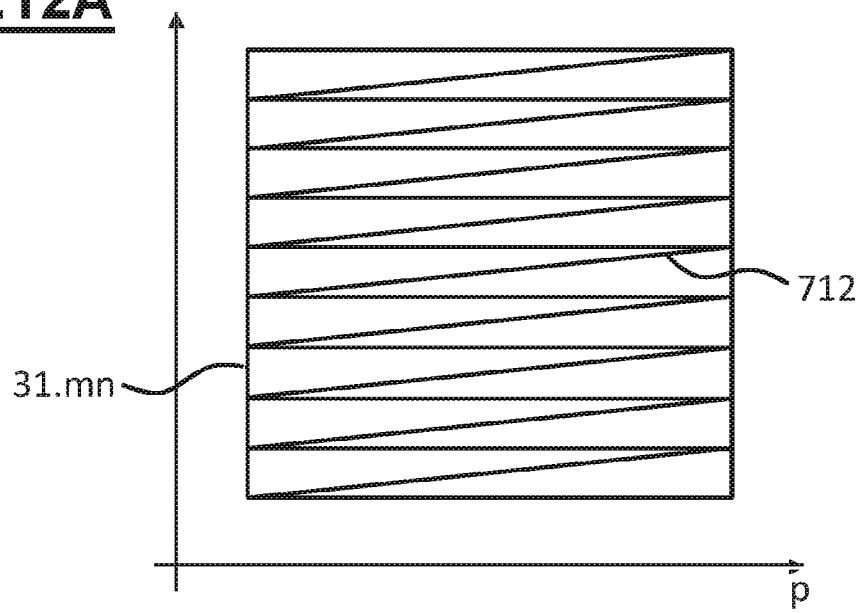
Figure 12B:
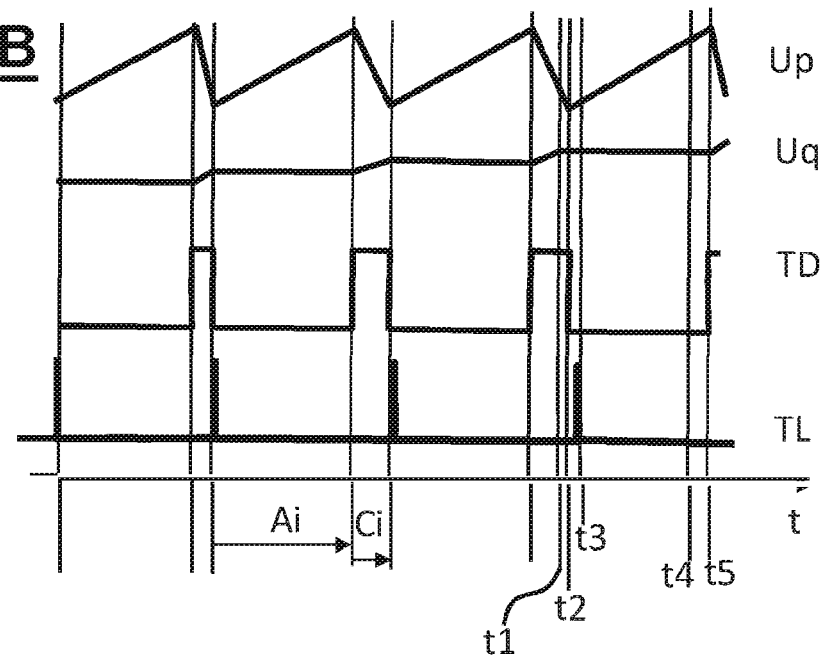

FIGS. 12A-12B: Illustration of (A) a scanning path of an exemplary primary beamlet according a first scan program and (B) some signals exchanged within the imaging control module and related modules.

Figure 13A:
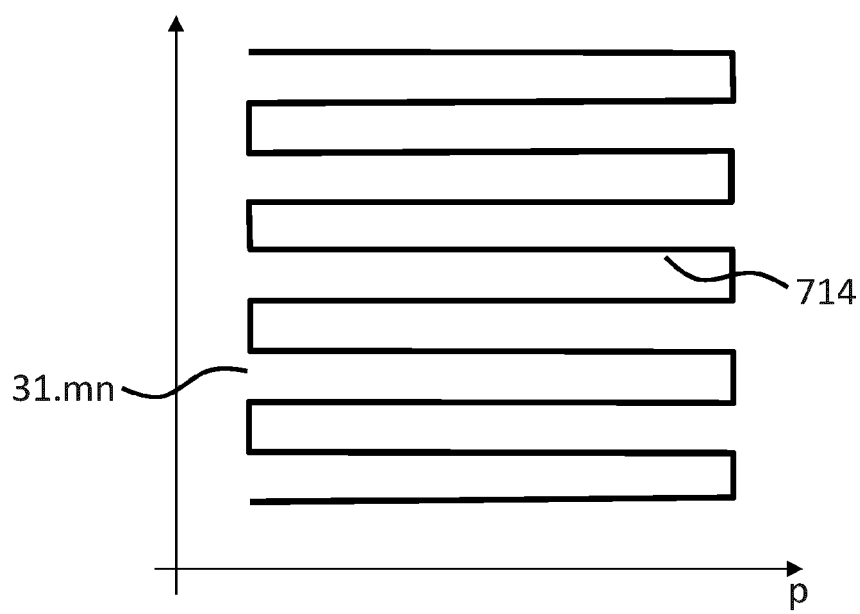
Figure 13B:
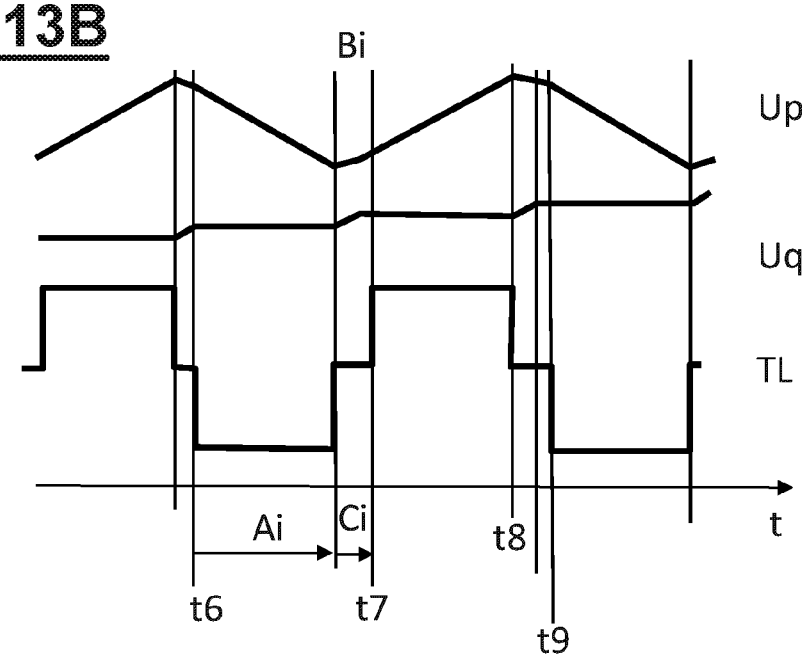

FIGS. 13A-13B: Illustration of (A) a scanning path of an exemplary primary beamlet according a scan program and (B) some signals exchanged within the imaging control module and related modules.

Figure 14:
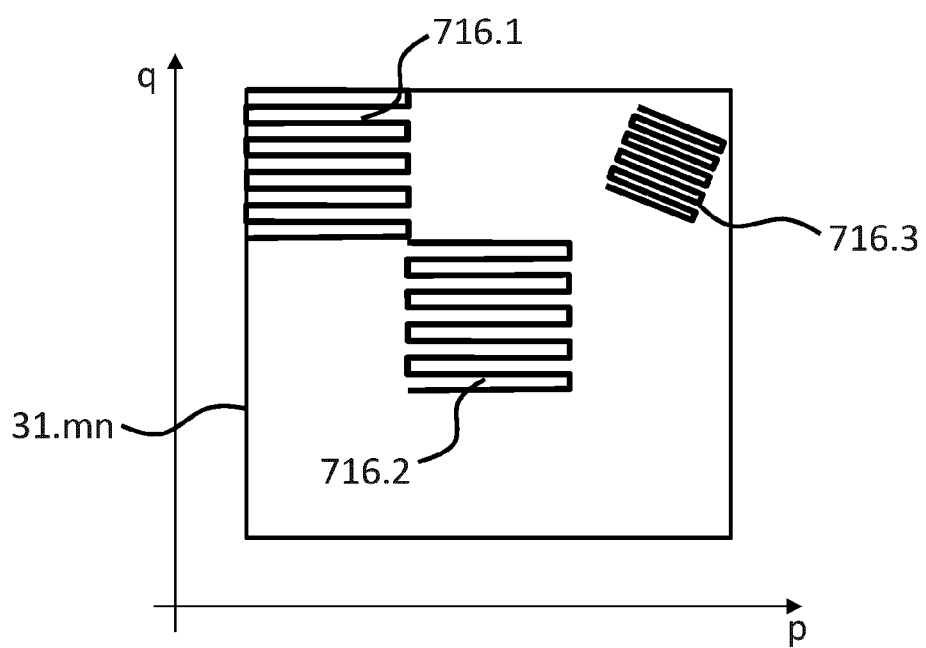

FIG. 14: Illustration of a scanning path of a further scan program.

Figure 15:
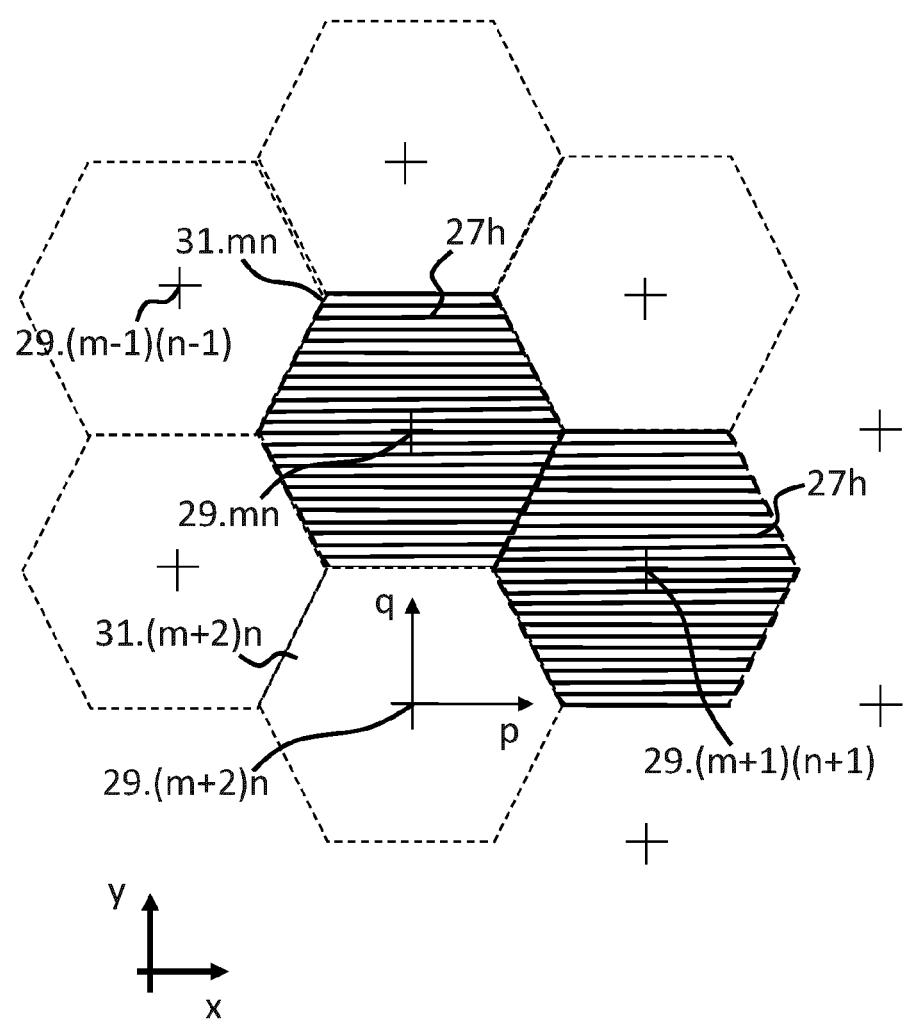

FIG. 15: Illustration of a scan program according hexagonal image subfields with a hexagonal raster configuration of primary charged particle beamlets FIGS. 16A-16B: Illustration of a compensation of a rotation of the hexagonal raster configuration with an adapted scan program.

Figure 17:
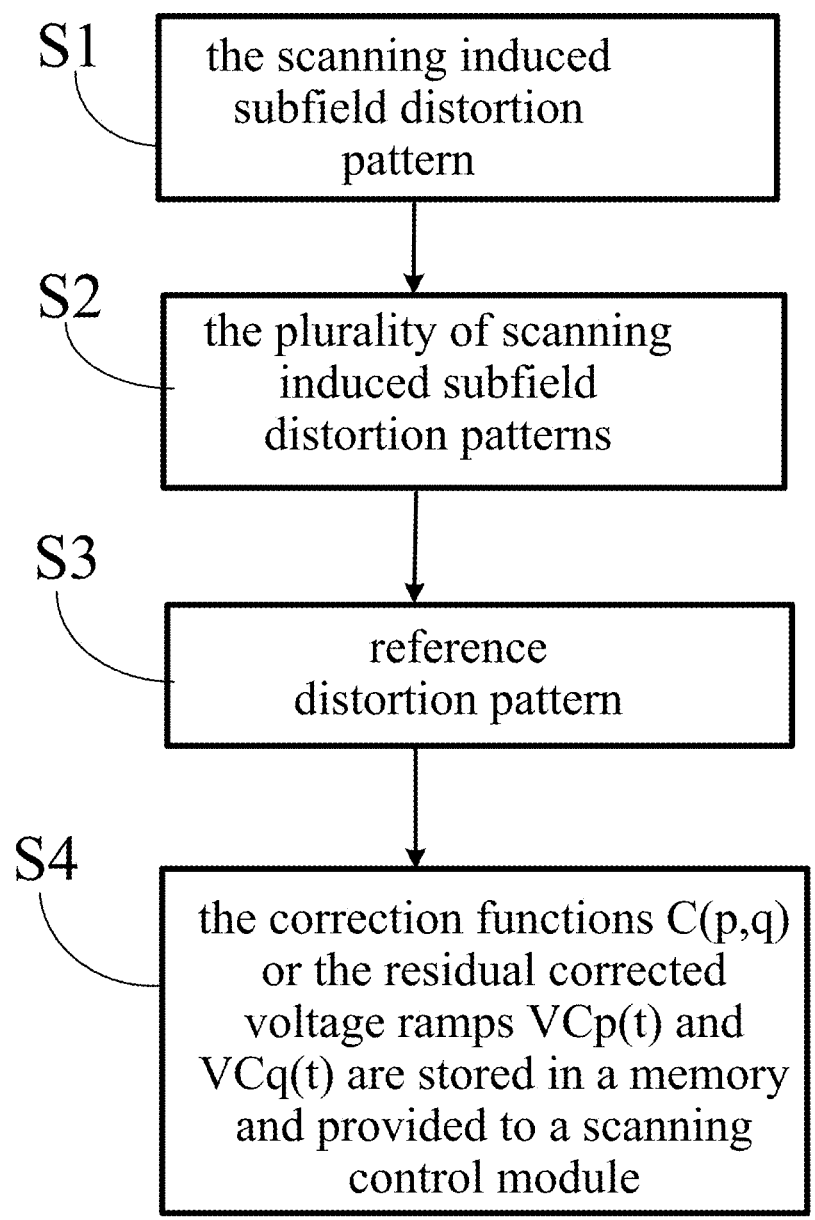

FIG. 17: Illustration of the method according the first embodiment

Figure 18:
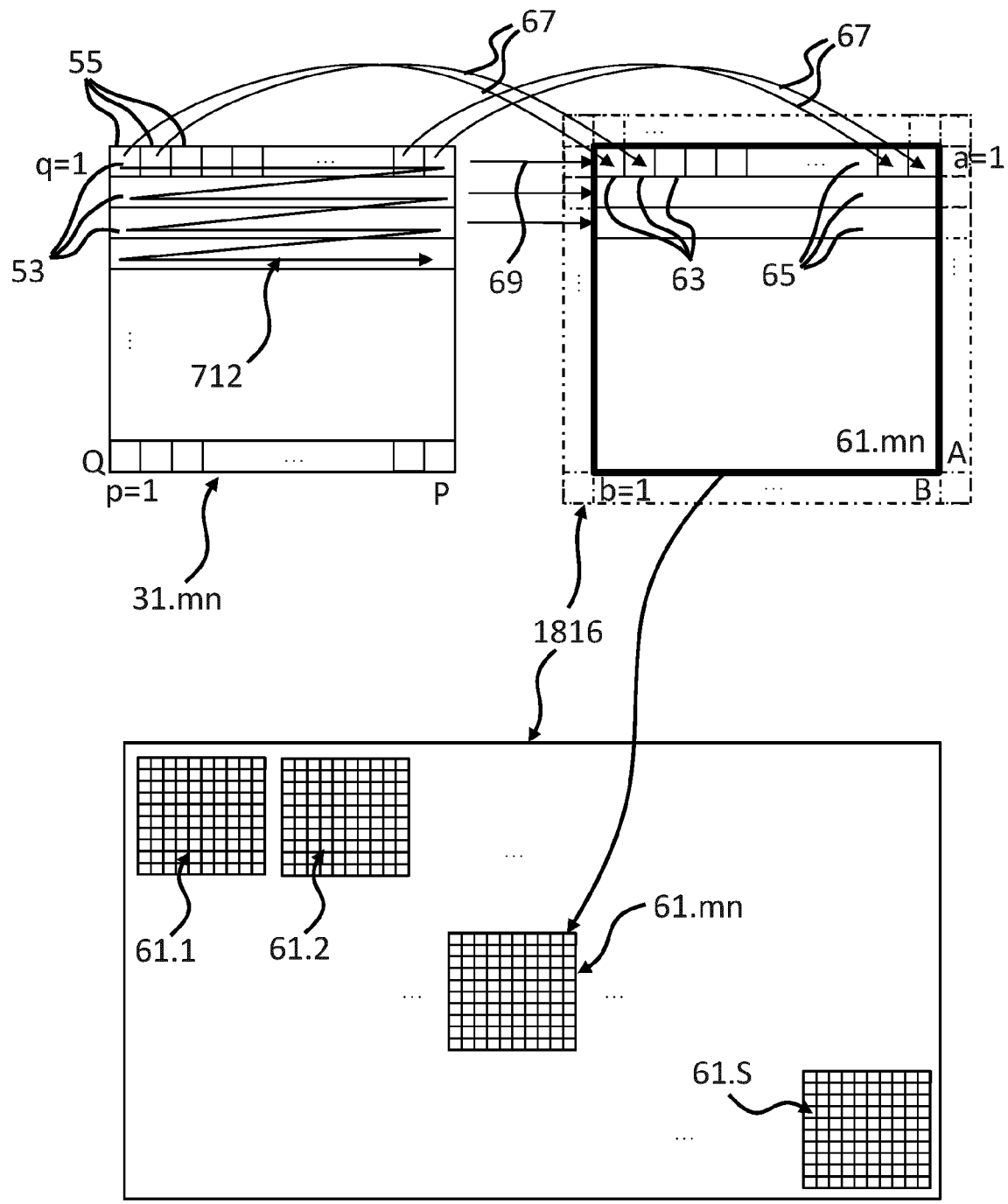

FIG. 18: Illustration of the memory allocation according the multi-beam scanning and image acquisition method.

Figure 19:
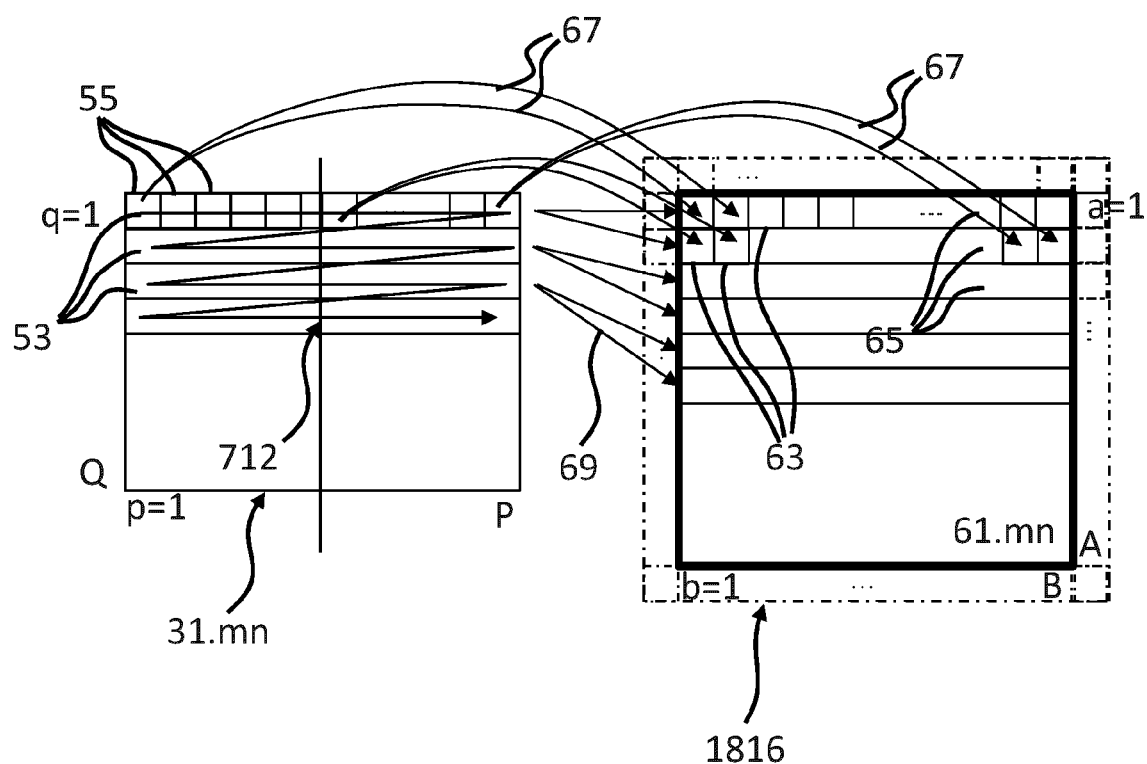

FIG. 19: Illustration of the memory allocation according the multi-beam scanning and image acquisition method utilizing a pixel averaging.

Figure 20:
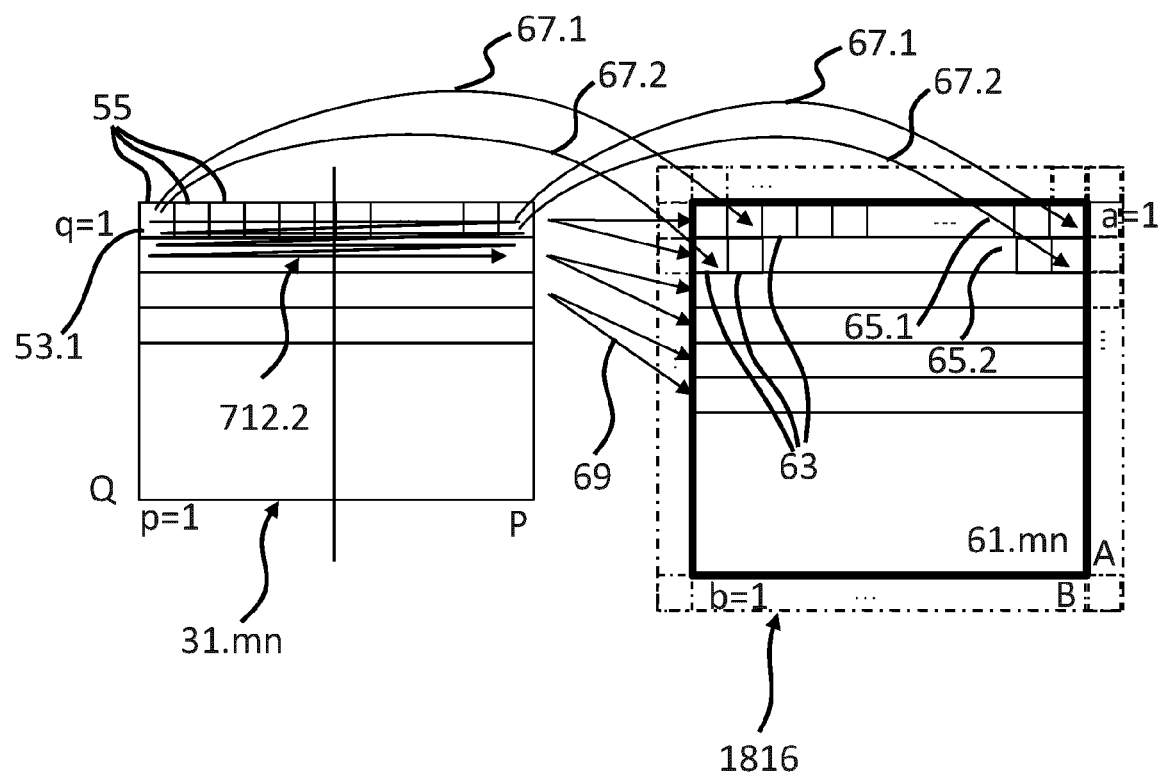

FIG. 20: Illustration of the memory allocation according the multi-beam scanning and image acquisition method utilizing a line averaging.

Figure 21A:
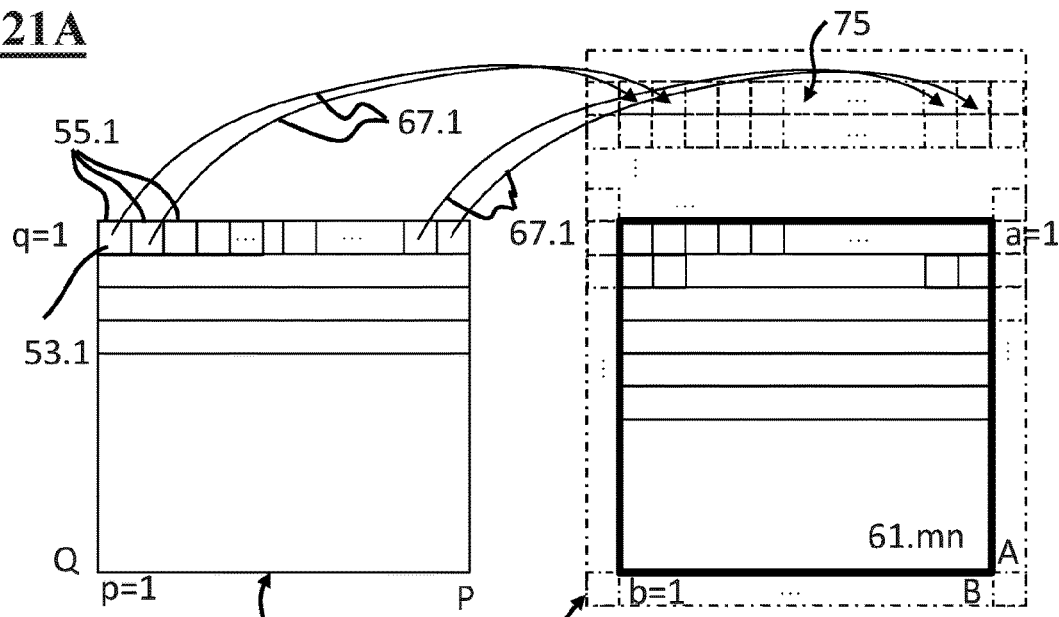
Figure 21B:
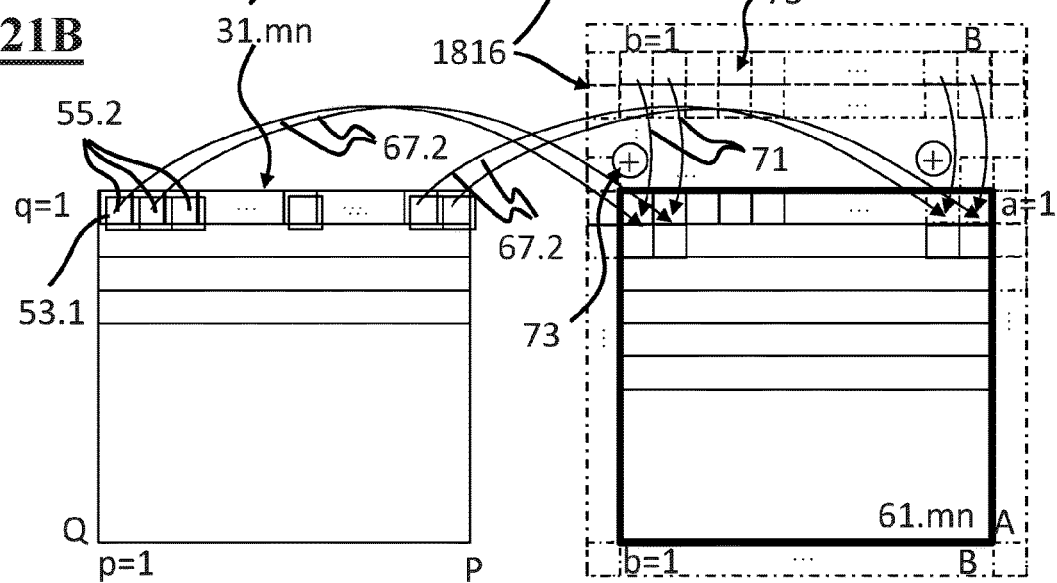

FIGS. 21A-21B: Illustration of the memory allocation according the multi-beam scanning and image acquisition method utilizing a temporary memory.

In the exemplary embodiments of the disclosure described below, components similar in function and structure are indicated as far as possible by similar or identical reference numerals.

The schematic representation of FIG. 1 illustrates basic features and functions of a multi-beam charged-particle microscopy system 1 according the embodiments of the disclosure. It is to be noted that the symbols used in the figure have been chosen to symbolize their respective functionality. The type of system shown is that of a multi-beam scanning electron microscope (MSEM or Multi-SEM) using a plurality of primary electron beamlets 3 for generating a plurality of primary charged particle beam spots 5 on a surface 25 of an object 7, such as a wafer located with a top surface 25 in an object plane 101 of an objective lens 102. For simplicity, only five primary charged particle beamlets 3 and five primary charged particle beam spots 5 are shown. The features and functions of multi-beamlet charged-particle microscopy system 1 can be implemented using electrons or other types of primary charged particles such as ions, including Helium ions. Further details of the microscopy system 1 are provided in German Patent application 102020209833.6, filed on Aug. 5, 2020, which is hereby fully incorporated by reference.

The microscopy system 1 comprises an object irradiation unit 100 and a detection unit 200 and a beam splitter unit 400 for separating the secondary charged-particle beam path 11 from the primary charged-particle beam path 13. Object irradiation unit 100 comprises a charged-particle multi-beam generator 300 for generating the plurality of primary charged-particle beamlets 3 and is adapted to focus the plurality of primary charged-particle beamlets 3 in the object plane 101, in which the surface 25 of a wafer 7 is positioned by a sample stage 500.

The primary beam generator 300 produces a plurality of primary charged particle beamlet spots 311 in an intermediate image surface 321, which is typically a spherically curved surface to compensate a field curvature of the object irradiation unit 100. The primary beamlet generator 300 comprises a source 301 of primary charged particles, for example electrons. The primary charged particle source 301 emits a diverging primary charged particle beam 309, which is collimated by at least one collimating lens 303 to form a collimated beam. The collimating lens 303 is usually consisting of one or more electrostatic or magnetic lenses, or by a combination of electrostatic and magnetic lenses. The collimated primary charged particle beam is incident on the primary multi-beam forming unit 305. The multi-beam forming unit 305 basically comprises a first multi-aperture plate 306.1 illuminated by the primary charged particle beam 309. The first multi-aperture plate 306.1 comprises a plurality of apertures in a raster configuration for generation of the plurality of primary charged particle beamlets 3, which are generated by transmission of the collimated primary charged particle beam 309 through the plurality of apertures. The multi-beamlet forming unit 305 comprises at least further multi-aperture plates 306.2 located, with respect to the direction of movement of the electrons in beam 309, downstream of the first multi-aperture plate 306.1. For example, a second multi-aperture plate 306.2 has the function of a micro lens array and can be set to a defined potential so that a focus position of the plurality of primary beamlets 3 in intermediate image surface 321 is adjusted. A third, active multi-aperture plate arrangement (not illustrated) comprises individual electrostatic elements for each of the plurality of apertures to influence each of the plurality of beamlets individually. The active multi-aperture plate arrangement consists of one or more multi-aperture plates with electrostatic elements such as circular electrodes for micro lenses, multi-pole electrodes or sequences of multi-pole electrodes to form static deflector arrays, micro lens arrays or stigmator arrays. The multi-beamlet forming unit 305 is configured with an adjacent first electrostatic field lenses 307, and together with a second field lens 308 and the first or second multi-aperture plate, the plurality of primary charged particle beamlets 3 is focused in or in proximity of the intermediate image surface 321. Downstream of the multi-beamlet forming unit 305, a scanning distortion compensator array 601 can be arranged.

In or in proximity of the intermediate image plane 321, a static beam steering multi aperture plate 390 is arranged with a plurality of apertures with electrostatic elements, for example deflectors, to manipulate individually each of the plurality of charged particle beamlets 3. The apertures of the beam steering multi aperture plate 390 are configured with larger diameter to allow the passage of the plurality of primary charged particle beamlets 3 even in case the focus spots of the primary charged particle beamlets 3 deviate from their design position. In proximity of the intermediate image plane 321, a scanning compensator array 602 for compensation of a scanning induced telecentricity error can be arranged. The primary charged-particle source 301 and active multi-aperture plate arrangement 306.1 ... 306.2, the scanning distortion compensator array 601, the beam steering multi aperture plate 390 and the scanning compensator array 602 for compensation of a scanning induced telecentricity error are controlled by primary beamlet control module 830, which is connected to control unit 800.

The plurality of focus points of primary charged particle beamlets 3 passing the intermediate image surface 321 is imaged by field lens group 103 and objective lens 102 in the image plane 101, in which the surface 25 of the wafer 7 is positioned. The object irradiation system 100 further comprises a collective multi-beam raster scanner 110 in proximity to a first beam cross over 108 by which the plurality of charged-particle beamlets 3 can be deflected in a direction perpendicular to the direction of the beam propagation direction. The collective multi-beam raster scanner 110 is configured for scanning deflection of the plurality of primary charged particle beamlets 3 passing the collective multi-beam raster scanner 110 at different propagation angles ß. Objective lens 102 and collective multi-beam raster scanner 110 are centered at an optical axis 105 of the multi-beamlet charged-particle microscopy system 1, which is perpendicular to wafer surface 25. The plurality of primary charged particle beamlets 3, forming the plurality of beam spots 5 arranged in a raster configuration, is scanned synchronously over the wafer surface 101. In an example, the raster configuration of the focus spots 5 of the plurality of primary charged particle 3 is a hexagonal raster of about hundred or more primary charged particle beamlets 3. The primary beam spots 5 have a distance about 6 µm to 15 µm and a diameter of below 5 nm, for example 3 nm, 2 nm or even below. In an example, the beam spot size is about 1.5 nm, and the distance between two adjacent beam spots is 8 µm. At each scan position of each of the plurality of primary beam spots 5, a plurality of secondary electrons is generated, respectively, forming the plurality of secondary electron beamlets 9 in the same raster configuration as the primary beam spots 5. The intensity of secondary charged particle beamlets 9 generated at each beam spot 5 depends on the intensity of the impinging primary charged particle beamlet 3, illuminating the corresponding spot 5, the material composition and topography of the object 7 under the beam spot 5, and the charging condition of the sample at the beam spot 5. Secondary charged particle beamlets 9 are accelerated by an electrostatic field generated by a sample charging unit 503, and collected by objective lens 102, directed by beam splitter 400 to the detection unit 200. Detection unit 200 images the secondary electron beamlets 9 onto the image sensor 207 to form there a plurality of secondary charged particle image spots 15. The detector or image sensor 207 comprises a plurality of detector pixels or individual detectors. For each of the plurality of secondary charged particle beam spots 15, the intensity is detected separately, and the material composition of the wafer surface 25 is detected with high resolution for a large image patch of the wafer with high throughput. For example, with a raster of 10×10 beamlets with 8 µm pitch, an image patch of approximately 88 µm×88 µm is generated with one image scan with collective multi-beam raster scanner 110, with an image resolution of for example 2 nm or below. The image patch is sampled with half of the beam spot size, thus with a pixel number of 8000 pixels per image line for each beamlet, such that the image patch generated by 100 beamlets comprises 6.4 gigapixel. The digital image data is collected by control unit 800. Details of the digital image data collection and processing, using for example parallel processing, are described in German patent application 102019000470.1 and in U.S. Pat. No. 9,536,702, which are hereby incorporated by reference.

The plurality of secondary electron beamlets 9 passes the first collective multi-beam raster scanner 110 and is scanning deflected by the first collective multi-beam raster scanner 110 and guided by beam splitter unit 400 to follow the secondary beam path 11 of the detection unit 200. The plurality of secondary electron beamlets 9 is travelling in opposite direction from the primary charged particle beamlets 3, and the beam splitter unit 400 is configured to separate the secondary beam path 11 from the primary beam path 13 usually via magnetic fields or a combination of magnetic and electrostatic fields. Optionally, additional magnetic correction elements 420 are present in the primary as well as in the secondary beam paths. Projection system 205 further comprises at least a second collective raster scanner 222, which is connected to scanning and imaging control unit 820. Control units 800 and imaging control unit 820 are configured to compensate a residual difference in position of the plurality of focus points 15 of the plurality of secondary electron beamlets 9, such that the position of the plurality secondary electron focus spots 15 are kept constant at image sensor 207.

The projection system 205 of detection unit 200 comprises further electrostatic or magnetic lenses 208, 209, 210 and a second cross over 212 of the plurality of secondary electron beamlets 9, in which an aperture 214 is located. In an example, the aperture 214 further comprises a detector (not shown), which is connected to imaging control unit 820. Imaging control unit 820 is further connected to at least one electrostatic lens 206 and a third deflection unit 218. The projection system 205 further comprises at least a first multi-aperture corrector 220, with apertures and electrodes for individual influencing each of the plurality of secondary electron beamlets 9, and an optional further active element 216, connected to control unit 800 or imaging control unit 820.

The image sensor 207 is configured by an array of sensing areas in a pattern compatible to the raster arrangement of the secondary electron beamlets 9 focused by the projecting lens 205 onto the image sensor 207. This enables a detection of each individual secondary electron beamlet independent from the other secondary electron beamlets incident on the image sensor 207. The image sensor 207 illustrated in FIG. 1 can be an electron sensitive detector array such as a CMOS or a CCD sensor. Such an electron sensitive detector array can comprise an electron to photon conversion unit, such as a scintillator element or an array of scintillator elements. In another embodiment, the image sensor 207 can be configured as electron to photon conversion unit or scintillator plate arranged in the focal plane of the plurality of secondary electron particle image spots 15. In this embodiment, the image sensor 207 can further comprise a relay optical system for imaging and guiding the photons generated by the electron to photon conversion unit at the secondary charged particle image spots 15 on dedicated photon detection elements, such as a plurality of photomultipliers or avalanche photodiodes (not shown). Such an image sensor is disclosed in U.S. Pat. No. 9,536,702, which is cited above and incorporated by reference. In an example, the relay optical system further comprises a beam splitter for splitting and guiding the light to a first, slow light detector and a second, fast light detector. The second, fast light detector is configured for example by an array of photodiodes, such as avalanche photodiodes, which are fast enough to resolve the image signal of the plurality of secondary electron beamlets 9 according the scanning speed of the plurality of primary charged particle beamlets 3. The first, slow light detector can be a CMOS or CCD sensor, providing a high-resolution sensor data signal for monitoring the focus spots 15 or the plurality of secondary electron beamlets 9 and for control of the operation of the multi-beam charged particle microscope 1.

During an acquisition of an image patch by scanning the plurality of primary charged particle beamlets 3, the stage 500 is optionally not moved, and after the acquisition of an image patch, the stage 500 is moved to the next image patch to be acquired. In an alternative implementation, the stage 500 is continuously moved in a second direction while an image is acquired by scanning of the plurality of primary charged particle beamlets 3 with the collective multi-beam raster scanner 110 in a first direction. Stage movement and stage position is monitored and controlled by sensors is generally known, such as Laser interferometers, grating interferometers, confocal micro lens arrays, or similar.

According an embodiment of the disclosure, a plurality of electrical signals is created and converted in digital image data and processed by control unit 800. During an image scan, the control unit 800 is configured to trigger the image sensor 207 to detect in predetermined time intervals a plurality of timely resolved intensity signals from the plurality of secondary electron beamlets 9, and the digital image of an image patch is accumulated and stitched together from all scan positions of the plurality of primary charged particle beamlets 3. More details will be described below.

Further aspects of the object irradiation unit 100 are illustrated in FIG. 2. In addition to the elements described in FIG. 1, the object irradiation unit 100 comprises a set of deflectors comprising at least a first and a second deflector 350 and 351 for deflecting the plurality of primary beamlets 3 from a first beam path along primary beam paths 3a to a second beam path along primary beam paths 3b, and a beam dump 130 arranged in the cross over plan 109. The beam dump 130 is arranged off axis with to the central z-axis 105 and is configured to absorb the plurality of primary charged particle beamlets 3. At least the first deflector 350 is connected to the imaging control unit 820. With the at least first deflector 350 in an off state, the plurality of primary beamlets 3 follows beam paths 3a pass the beam dump 130 and are focused by objective lens 102 onto the sample surface. With the at least first deflectors 350 in an on state, the plurality of primary beamlets 3 is selectively deflected and guided into a beam dump 130, arranged near the beam cross over 108 in beam cross over plane 109 and off axis with a distance d to z-axis.

The method of wafer inspection by acquisition of image patches is explained in more detail in FIG. 3. The wafer is placed with its wafer surface 25 in the focus plane of the plurality of primary charged particle beamlets 3, with the center 21.1 of a first image patch 17.1. The predefined position of the image patches 17.1 . . . k corresponds to inspection sites of the wafer for inspection of semiconductor features. The predefined positions of the first inspection site 33 and second inspection site 35 are loaded from an inspection file in a standard file format. The predefined first inspection site 33 is divided into several image patches, for example a first image patch 17.1 and a second image patch 17.2, and the first center position 21.1 of the first image patch 17.1 is aligned under the optical axis 105 of the multi-beam charged-particle microscopy system 1 for the first image acquisition step of the inspection task. The first center of a first image patch 21.1 is selected as the origin of a first local wafer coordinate system for acquisition of the first image patch 17.1. Methods to align the wafer 7, such that the wafer surface 25 is registered and a local coordinate system of wafer coordinates is generated, are generally well known.

The plurality of primary beamlets 3 is distributed in a regular raster configuration in each image patch 17.1 . . . k and is scanned by a raster scanning mechanism to generate a digital image of the image patch. In this example, the plurality of primary charged particle beamlets 3 is arranged in a rectangular raster configuration with N primary beam spots 5.11, 5.12 to 5.1N in the first line with N beam spots, and M lines with beam spots 5.11 to beam spot 5.MN. Only M=five times N=five beam spots are illustrated for simplicity, but the number of beam spots J=M times N can be larger, for example J=61 beamlets, or about J=100 beamlets or more, and the plurality of beam spots 5.11 to 5.MN can have different raster configurations such as a hexagonal or a circular raster.

Each of the primary charged particle beamlets is scanned over the wafer surface 25, as illustrated at the example of primary charged particle beamlet with beam spot 5.11 and 5.MN with scan path 27.11 and scan path 27.MN. Scanning of each of the plurality of primary charged particles is performed for example in a back-and forth movement along scan paths 27.11 . . . 27.MN, and each focus point 5.11 . . . 5.MN of each primary charged particle beamlet is moved by the collective multi-beam scanning deflector system 110 collectively in x-direction from a start position of an image subfield line, which is in the example the most left image point of for example image subfield 31.*mn*. Each focus point 5.11 . . . 5.MN is then collectively scanned by scanning the primary charged particle beamlets 3 collectively to the right position, and then the collective multi-beam raster scanner 110 moves each of the plurality of charged particle beamlets 3 in parallel to the line start positions of the next lines in each respective subfield 31.11 . . . 31.MN. The movement back to line start position of a subsequent scanning line is called fly-back. In an example, during fly-back, the plurality of primary beamlets 3 is selectively deflected by the first deflector 350 and guided to beam dump 130. It is understood that in this example the primary charged particle beamlets 3 do not reach the sample surface 25.

The plurality of primary charged particle beamlets 3 follow in parallel scan paths 27.11 to 27.MN, and thereby a plurality scanned images of the respective subfields 31.11 to 31.MN is obtained in parallel. For the image acquisition, as described above, a plurality of secondary electrons is emitted at the focus points 5.11 to 5.MN, and a plurality of secondary electron beamlets 9 is generated. The plurality of secondary electron beamlets 9 are collected by the objective lens 102, pass the first collective multi-beam raster scanner 110 and are guided to the detection unit 200 and detected by image sensor 207. A sequential stream of data of each of the plurality of secondary electron beamlets 9 is transformed synchronously with the scanning paths 27.11 . . . 27.MN in a plurality of 2D datasets, forming the digital image data of each image subfield 31.11 to 31.MN. The plurality of digital images of the plurality of image subfields 31.11 to 31.MN is finally stitched together by an image stitching unit to form the digital image of the first image patch 17.1. Each image subfield 31.11 to 31.MN is configured with small overlap area with adjacent image subfield, as illustrated by overlap area 39 of subfield 31.*mn* and subfield 31.*m*(*n*+1).

It is clear that the raster configuration of the plurality of primary charged particle beamlets is not limited to the rectangular raster configuration of FIG. 3, but also other raster configuration are possible, such as one-dimensional raster configurations with a plurality of primary charged particle beamlets in a line, circular raster configurations with a plurality of primary charged particle beamlets arranged on at least a circle, or hexagonal raster configurations as illustrated below in FIGS. 15 and 16.

Next, the desired properties or specifications of a wafer inspection task are illustrated. For a high throughput wafer inspection, the time for image acquisition of each image patch 17.1 . . . *k* including the time for image postprocessing are desirably fast. On the other hand, tight specifications of image qualities such as the image resolution, image accuracy and repeatability are desirably maintained. For example, the desired image resolution is typically 2 nm or below, and with high repeatability. Image accuracy is also called image fidelity. For example, the edge position of features, in general the absolute position accuracy of features is to be determined with high absolute precision. Typically, the position accuracy is about 50% of the resolution or even less. For example, measurement tasks involve an absolute precision of the dimension of semiconductor features with an accuracy below 1 nm, below 0.5 nm or even 0.3 nm. Therefore, a lateral position accuracy of each of the focus spots 5 of the plurality of primary charged particle beamlets 3 are desirably below 1 nm, for example below 0.5 nm or even below 0.3 nm. Under high image repeatability it is understood that under repeated image acquisition of the same area, a first and a second, repeated digital image are generated, and that the difference between the first and second, repeated digital image is below a predetermined threshold. For example, the difference in image distortion between first and second, repeated digital image are desirably below 1 nm, for example 0.5 nm or even below 0.3 nm, and the image contrast difference are desirably below 10%. In this way a similar image result is obtained even by repetition of imaging operations. This is important for example for an image acquisition and comparison of similar semiconductor structures in different wafer dies or for comparison of obtained images to representative images obtained from an image simulation from CAD data or from a database or reference images.

One of the desired properties or specifications of a wafer inspection task is throughput. The measured area per acquisition time is determined by the dwell time, resolution and the number of beamlets. Typical examples of dwell times are between 20 ns and 80 ns. The pixel rate at the fast image sensor 207 is therefore in a range between 12 Mhz and 50 MHz and each minute, about 15 to 20 image patches or frames could be obtained. For 100 beamlets, typical examples of throughput in a high-resolution mode with a pixel size of 0.5 nm is about 0.045 sqmm/min (square-millimeter per minute), and with larger number of beamlets, for example 10000 beamlets and 25 ns dwell time, a throughput of more than 7 sqmm/min is possible. However, in certain known systems of the digital image processing limits the throughput significantly. For example, digital compensation of a scanning distortion in some known systems is very time consuming and therefore unwanted. In the embodiments of the disclosure, the image postprocessing can be reduced and throughput of a measurement task with high precision can be enhanced. The embodiments of the disclosure can enable high throughput with a pixel scan speed exceeding 2 Tpixel/h, for example of about 8 to 10 Tpixel/h, of a wafer inspection task while maintaining a desired image performance specification well within those described above. For example, with the embodiments of the disclosure, a position accuracy of each image pixel is maintained below 1 nm.

The collective multi-beam raster scanner 110 typically shows a nonlinear behavior, and deflection angles α generated by the collective multi-beam raster scanner 110 are not linear with the applied voltage to the electrodes of the collective multi-beam raster scanner 110. In addition, deflection angles α are different for each of the plurality of primary charged particle beamlets. The deviation of deflection angles α increases with increasing angle of incidence B of a primary beamlet, and an increasing scanning induced distortion is generated by the collective multi-beam raster scanner 110. In a first embodiment of the disclosure, the scanning induced distortion is reduced by a modified voltage signal provided to the deflection scanner, a modified design of the control circuitry of the deflection scanner and an improved operation of the collective multi-beam raster scanner 110.

In a multi-beam system 1, a plurality of charged particle beamlets 3 is scanned in parallel with the same, collective multi-beam raster scanner 110 and the same voltage differences VSp(t) applied to the deflection electrodes for each primary beamlet 3 according the functional dependency of the deflection angle sin(a) from the scanning voltage difference VSp(t). FIG. 4 illustrates a scanning induced distortion at the example of a selected primary beamlet 3, which enters the collective multi-beam raster scanner 110 with propagation angle ß. The collective multi-beam raster scanner 110 is represented by deflection electrodes 153.1 and 153.2 and a voltage supply according the embodiment, providing the scanning voltage difference VSp(t). For sake of simplicity, only the deflection scanner electrodes for raster scanning deflection in the first direction are illustrated. During use, a scanning deflection voltage difference VSp(t) is applied and an electrostatic field is formed in an intersection volume 189 between the electrodes 153.1 and 153.2. With a first voltage VSp(t1)=0V, the primary beamlet traverses the intersection volume 189 along path 157a and is not deflected. Objective lens 102 forms a focus point or beam spot a center position 29.o of image subfield 31.o. With a second voltage VSp(t2)=V1, primary beamlet traverses the intersection volume 189 along path 157z and is deflected by angle α1 to form beam spot at a position slightly displaced by distortion vector dpz from the ideal position 29.1. With a third voltage VSp(t3)=V2, primary beamlet traverses the intersection volume 189 along path 157f and is deflected by angle α2 to form beam spot at a position slightly displaced by distortion vector dpf from the ideal position 29.2. The subfield coordinates are given in relative coordinates (p,q) relative to the center point 29.o of the subfield 31.o. The subfield center coordinate X or 29.o is proportional to angle of incidence ß of the primary charged particle beamlet 157a.

Distortion vectors dpz and dpf depend from the angle of incidence angle ß. As a result, a specific scanning induced subfield distortion pattern for each primary charged particle beamlet 3 is obtained, and in general, the scanning induced subfield distortion patterns are slightly different for each primary beamlet and each image subfield. The differences in the scanning induced subfield distortion can be about few nm, for example up to 2 nm or 3 nm.

The first embodiment is illustrated in FIG. 17. According the first embodiment, the nonlinearities of the deflector is minimized for the plurality of primary charged particle beamlets. In a first step S1, the scanning induced subfield distortion pattern is determined, for example by measuring a calibration pattern of predetermined shape. Thereby, a plurality of scanning induced subfield distortion patterns is measured by application of a linear voltage ramps VLp(t), VLq(t) to the collective deflection scanner for collective scanning deflection of the plurality of beamlets in the first or p-direction and the second of q-direction.

In a second step S2, the plurality of scanning induced subfield distortion patterns is analyzed by statistical methods, and a reference distortion pattern is generated. In a first example, the reference distortion pattern is generated by averaging over the plurality of scanning induced subfield distortion patterns. In a second example, the reference distortion pattern is optimized with a maximum threshold, which will be described in more detail below.

In a third step S3, the reference distortion pattern is converted to a correction function C(p,q).

In an optional iteration step, the correction function C(p,q) is applied to the linear voltage ramps VLp(t), VLq(t) and first corrected voltage ramps VCp(t) and VCq(t) are obtained. With the repetition of step S1 with the first corrected voltage ramps VCp(t) and VCq(t) and step S2, a residual average distortion pattern is obtained. The iteration step is repeated until the residual average distortion pattern does not show any deviation larger than a threshold of for example below 0.3 nm.

In step S4, the correction functions C(p,q) or the residual corrected voltage ramps VCp(t) and VCq(t) are stored in a memory and provided to a scanning control module, as will be described in the second embodiment of the disclosure. With the optimized correction functions C(p,q) or residual corrected voltage ramps VCp(t) and VCq(t), a scanning induced distortion pattern is generated with a reduced maximum scanning induced distortion for the plurality of primary charged particle beamlets 3. It is understood that the scanning induced distortion patterns shows in general two-dimensional distortion vectors D=[dp, dq](p,q) as a function from local subfield coordinates p and q for each subfield, and the voltage signals to generate a deflection to a specific (p,q)-coordinate may depend of p and q.

In a second example of step S2, the reference distortion pattern is optimized with a maximum threshold. In this example, the reference distortion pattern is optimized from the plurality of scanning induced subfield distortion patterns to achieve a minimum value of a scanning induced distortion. A reference distortion pattern is subtracted from plurality of scanning induced subfield distortion patterns and the reference distortion pattern is changed as longs as the residual distortion exceeds a predetermined threshold of for example 1 nm or 0.5 nm. In an example, it is possible that not for all primary beamlets a residual distortion below the threshold can be achieved, and certain image subfields with residual distortion exceeding the threshold are flagged as exceeding the desired precision of a metrology task.

As a result of the process described above, the multi-beam scanning induced distortion is globally minimized and for example reduced by a factor of 2 or more. It should be noted that by the minimization of the multi-beam scanning induced distortion, individual residual scanning induced subfield distortions, for example of the axial primary beamlet with ß=0, can be increased at the expense of a reduction of the residual scanning induced subfield distortions of peripheral primary beamlets with ß>0. An example is illustrated in FIG. 5. FIG. 5A shows the maximum value of each scanning induced subfield distortion for J=61 primary charged particle beamlets. FIG. 5B shows the residual maximum value of the scanning induced subfield distortions after correction with correction function C(p,q). The maximum distortion value for subfield 31.15 is significantly reduced, for example by a factor of 2, while the scanning induced distortion of the central beamlet 31.55 is increased. FIG. 6 illustrates an example of a corresponding voltage difference to applied to the collective deflection scanner 110 in dependency to the subfield coordinate p. The linear dependency VL is corrected by C(p,q) to the nonlinear deflection voltage VC, by which the minimized residual scanning induced subfield distortion is obtained.

Scanning induced subfield distortion of a plurality of primary charged particle beamlets 3 arise not only due to the nonlinear behavior of a collective deflection scanner 110, but also due to distortion or other aberrations of other charged particle optical elements, for example the objective lens 102. Objective lens 102 can be an electro-dynamic or electrostatic optical immersion lens and can be utilizing electrostatic and magnetic fields to form the plurality of focus spots 5 on the surface 25 of the sample 7. Such elements can contribute the scanning distortion in addition to the collective scanning deflector 110. With the method according the first embodiment, the scanning induced distortion is globally minimized, irrespective of the origin of the scanning induced distortion.

According the first embodiment, a method of calibration of a multi-beam charged particle scanning electron microscope 1 is provided, whereby a maximum scanning induced distortion is reduced, the method comprising
- a first step of performing a calibration measurement by raster scanning a plurality of primary charged particle beamlets 3 by a collective multi-beam raster scanner 110 with a first driving signal V1(p,q) over the surface 25 of a calibration sample,
- a second step of deriving a plurality of scanning induced distortion patterns from the calibration measurement, comprising deriving a scanning induced distortion pattern for each of a plurality of primary charged particle beamlets 3,
- a third step of analyzing the plurality of scanning induced subfield distortion patterns and deriving a correction signal C(p,q),
- a forth step of modifying the first driving signal V1(p,q) with the correction signal C(p,q) and deriving a modified driving signal V2(p,q) for driving the collective multi-beam raster scanner 110.

In an example, the third step of analyzing comprises deriving a reference distortion pattern of the plurality of scanning induced distortion patterns by statistical methods, the statistical methods comprise any of the computations of an average, a weighted average, or a median; and deriving the correction signal C(p,q) from the reference distortion pattern. By application of the modified driving signal V2(p, q) to the collective multi-beam raster scanner 110, the reference distortion pattern is pre-compensated in each of the plurality of scanning induced distortion patterns and a maximum scanning induced distortion is minimized.

In an example, the first to forth steps are repeated, until a maximum scanning induced distortion is minimized below a predetermined threshold. In an example, most of the maximum scanning induced distortions of the plurality of primary charged particle beamlets is reduced below the predetermined threshold, and a maximum scanning induced distortion of a few individual primary charged particle beamlets can exceed the predetermined threshold. The individual primary charged particle beamlets exceeding the predetermined threshold can be flagged or marked as exceeding the threshold. In an example the flagged primary charged particle beamlets are not used for high precision metrology tasks, or a digital compensation is applied to the digital image data obtained by the flagged primary charged particle beamlets.

In an example, the correction signal C(p,q) is stored in a memory of a control unit of the collective multi-beam raster scanner 110, for pre-compensation of a scanning induced distortion according a selected scan program.

With the method of the first embodiment, a correction function C(p,q) is generated, by which a scanning induced subfield distortion of a plurality of primary charged particle beamlets 3 can minimized. The correction function C(p,q) is applied during use to the scanning voltage signal to generate for example nonlinear voltage ramps. The second embodiment of the disclosure illustrates an improved method or control of the collective deflection scanner 110 by an imaging control system 820, which enables the generation and the application of the pre-compensated voltages to the collective multi-beam raster scanner 110 for high speed raster scanning multi-beam charged particle microscopes 1 with improved throughput and reduced scanning induced distortion. The second embodiment of a multi-beam scanning and image acquisition method 707 by control system 820 is illustrated in FIG. 7. The method of control of the collective multi-beam raster scanner 110 by imaging control module 820 comprises a configuration step 710. In the configuration step 710, a scan program 762 is selected and configured, an provided to generic scan processing step 720. In the generic scan processing step 720, the scan program 762 is received in receiving step 722 by a bus receiver and provided to a scan command processor, which derives a sequence of unit scan commands 764 in the scan command processing step 724. During the scan command processing step 724, the scan program 762 is segmented in unit point commands or line commands, described by the unit start point (ui,vi) and end point (ue,ve) of a line and the raster spacing or step sizes (du, dv) for a plurality of points between the start point and the end point. In an example, a line command is represented by k scan points at coordinates according u(k+1)=u(k)+du with u(k=0)=ui and v(k+1)=v(k)+dv with v(k=0)=vi. The sequences of unit scan commands 764 are derived in normalized or unit coordinates (u,v), which can for example be computed and described with integer precision. In an example, normalized or unit coordinates (u,v) represent the pixel coordinates of the digital images of each of the plurality of image subfield. The unit scan commands 764 are for example two synchronized streams of normalized subfield coordinates u and v. An example of a short segment of a unit scan commands 764 is given by two synchronized streams of the two subsequent scan coordinates [ . . . , u(i−1), u(i), u(i+1), . . . ] and [ . . . , v(i−1), v(i), v(i+1), . . . ].

The sequences of unit scan commands 764 are provided to vertex postprocessing step 726, in which the sequence of unit scan commands 764 is transformed by first order group transformations to adjust scale and rotation of the sequence of unit scan commands 764. In an example of the vertex postprocessing step 726, the unit normalized subfield coordinates u,v are scaled to the real image subfield coordinates p, q with floating point precision. The scaling can in general be obtained by scaling and rotation of the unit normalized subfield coordinates u,v into values proportional to the real image subfield coordinates p, q. In an example, the real image subfield coordinates (p, q) are obtained by $$p = A10*u + A01*v + A00$$

$$q = B10*u + B02*v + B00$$

with scalar values $A_{mn}$ and $B_{mn}$ determined in a calibration step and stored in the memory of the scan control unit. In an example of the vertex postprocessing step 726, an average or reference scanning induced distortion is pre-compensated with correction signal C(p, q), which is determined and stored according the first embodiment of the disclosure and read out from a memory. In an example, the correction with the correction signal C(p,q) generates from a linear line with start point and end point a vector or stream of points p(i), q(i) on a curved line, and thereby a scanning induced distortion is pre-compensated and a real scanning line of a primary charged particle beamlet follows a linear line on the surface of the sample. In an example, the correction signal C(p,q) is represented by a power series expansion, and a linear line command with start and end point is transformed in a polygonal line of for example $5^{th}$ order. In general, (p,q) can depend on a power series expansion of (u,v) according $$p = \Sigma_{m,n} A_{mn} u^m v^n$$

$$q = \Sigma_{m,n} B_{mn} u^m v^n$$

From the polygonal line, the stream or sequence of points p(i), q(i) on a curved line is generated. As a result, a sequence of pre-compensation digital scan coordinates is generated corresponding to the subfield scan coordinates (p,q), modified by the correction signal C(p,q), such that an average scanning induced distortion of the plurality of image subfields is minimized. The output of vertex postprocessing step 726 is a sequence or stream of pre-compensation digital scan commands 766 [ . . . , p(i−1), p(i), p(i+1), . . . ] and [ . . . , q(i−1), q(i), q(i+1), . . . ].

In parallel to the unit scan commands 764 or the sequences of pre-compensation digital scan commands 766, synchronized control commands 768 are generated during generic scan processing step 720, for example in vertex postprocessing step 726, and provided to a scanning synchronized control step 718, which controls operations of the multi-beam charged particle microscope 1 which act in dependence of the collective scanning, such as a beam deflection step by beam deflector 350 or other elements configured for a synchronized operation with the scanning process. In scanning synchronized control step 718, further scanning control signals 768 can be generated and provided back to generic scan processing step 720. For example, during scanning synchronized control step 718 a deflection of the plurality of primary charged particle beamlets 3 is triggered and a scanning control signal 768 is provided to generic scan processing step 720 during the time the plurality of primary charged particle beamlets 3 are deflected into beam dump 130. In another example, a calibration step or a system measurement step may be involved during the performance of a scan program 762. By common scanning control signals 768 the generic scan processing step 720 is triggered to interrupt the scan program 762 and further digital scan signals are inserted in the string of pre-compensation digital scan commands 766, which for example are configured to hold a current scan position for a longer period or to scan a predetermined calibration target. In an example, during scan command processing step 724, further unit scan commands are inserted into the streams of a unit scan commands 764, for example by repetition of a unit scan command several times and therefore providing a hold signal [ . . . {u(i), u(i), u(i), u(i), . . . } . . . ] and [ . . . {v(i), v(i), v(i), v(i), . . . } . . . ] in the streams of a unit scan commands 764. Streams of a unit scan commands 764 [ . . . , u(i−1), u(i), {u(i), u(i), u(i), u(i), . . . }, u(i+1), . . . ] and [ . . . , v(i−1), v(i), {v(i), v(i), v(i), v(i), . . . }, v(i+1), . . . ] with included hold signal is then provided to the further steps downstream the flow of data streams. The hold signal is generated and inserted until generic scan processing step 720 determines from the scanning control command 768 that the scan program 762 can be continued and continues the scan program 762 by stopping the insertion of hold signals. The synchronized scanning control commands 768 provided by scanning synchronized control steps 718 and scan processing step 720 can utilize a common access data bus. The synchronized control scanning commands 768 provided to scanning synchronized control steps 718 and the scanning control command 769 provided by scanning synchronized control steps 718 are described below in more detail at an example.

The sequence of pre-compensation digital scan commands 766 is provided by scan processing step 720 to specific scanning deflection control step 730. In a first conversion step 732 of specific scanning deflection control step 730, the sequence of pre-compensation digital scan commands 766 is transformed in digital drive signals 770 to drive each of the deflection electrodes of collective raster scanning deflector 110. In an example, the collective raster scanning deflector 110 comprises an octupole deflector with 8 electrodes. In this example, during first conversion step 732, a plurality of 8 streams of digital drive signals 770 are generated corresponding to the pre-compensated subfield scan coordinates p(i),q(i) provided in the sequence of pre-compensation digital scan commands 766, one for each of the plurality of eight electrodes:

$$[p(i),q(i)] \rightarrow [a(i),b(i),c(i),d(i),e(i),f(i),g(i),h(i)] = CM^* [p(i),q(i)]$$

The first conversion step 732 converts the pre-compensation digital scan commands 766 into digital drive signals 770 for example by linear equations or look up tables. An example of a linear equation is given above with a 2 by 8 conversion matrix CM. The 8 streams of digital drive signals 770 include the pre-compensation with correction signal C(p,q), such that in the subsequent DA converting step 736a of digital to analog conversion, 8 streams of pre-compensated voltage signals 772 are generated. In the example of a line scan, such a stream of voltage signal 772 can for example be a voltage ramp with a small deviation from linearity. An example is illustrated below in more detail.

The sequence of for example 8 streams of non-linear voltage signals 772 from digital to analog conversion step 736a is provided to amplification step 740. During the amplification step 740, the 8 sequences or streams of voltage signals 772 are amplified for example by a set of 8 amplifiers. The resulting plurality of 8 amplified sequences of drive voltages 774 is provided to the 8 electrodes of the collective multi-beam raster scanning deflector 110 for collective scanning deflection of the plurality of primary charged particle beamlets 3. In the collective deflection step 742, the plurality of primary charged particle beamlets 3 is collectively raster scanned according the sequence of amplified drive voltages 774 corresponding to the sequence of scan positions of the selected scan program 762 within each of the plurality of image subfields. With the method steps describes above, for each electrode of the multi-beam raster scanning deflector 110, for example a non-linear voltage ramps VC(t) as illustrated in FIG. 6 is generated and provided to the respective electrode and a collective raster scanning of the plurality of primary charged particle beamlets is achieved with high flexibility and high speed. In an analogous manner as described above, amplified sequences of drive voltages 774 are generated and provided to the second collective multi-beam raster scanning deflector 222 for compensation of the residual scanning of the plurality of secondary electrons 9.

Typically, the amplification step 740 exhibits nonlinearities according a nonlinear behavior during use of the amplifiers. The nonlinearity of the 8 amplifiers can be predetermined and 8 digital nonlinear amplification transformations can be stored in a memory. During the second vertex postprocessing step 734, the nonlinearity of the 8 amplifiers is pre-compensated by application of the 8 digital nonlinear amplification transformations to the sequence of 8 digital drive signals 770. As a result, nonlinearities of individual amplifiers are compensated individually. The sequence of 8 digitally corrected drive signals 776 is then provided to digital to analog converter 736a and nonlinearities of amplifiers are pre-compensated.

During second vertex postprocessing step 734, also a set of digital offsets 778 can be generated and provided to digital to analog conversion step 736b. An offset voltage 780 provided by digital to analog conversion step 736b is filtered by offset voltage filter step 738. The sequence of for example 8 non-linear voltage signals from digital to analog conversion step 736a is combined with at least one offset voltage 782 by voltage combining step 641 and provided to amplification step 740. The digital offsets and the corresponding offset voltages 782 can for example be derived and stored in memory from a calibration step or an adjustment step (not shown) of adjustment or calibration of the multi-beam charged particle microscopy system 1. Thereby, an offset deflection or correction of the plurality of primary charged particle beamlets 3 is achieved.

In an example, a set of digital offsets 778 provided to digital to analog conversion step 736b can comprise a shift of a center of a pattern of a scan program 764. As illustrated an example below in FIG. 14, a scan program 764 con comprise several scan patterns, which can for example be disjunct. In general, a scan program can be grouped in for example into a first scan pattern with a first center and a second scan pattern with second center coordinates. During the second vertex postprocessing step 734, the plurality of 8 streams of digital drive signals 770 for scanning of the first scan pattern can be derived relative to the first center coordinate and the plurality of 8 streams of digital drive signals 770 for scanning of the second scan pattern can be derived relative to the second center coordinate. During providing the plurality of 8 streams of digital drive signals 770 for scanning of the first scan pattern to the digital to analog conversion step 736a, a set of digital offsets 778 representing the first center coordinates is provided to digital to analog conversion step 736b. During providing the plurality of 8 streams of digital drive signals 770 for scanning of the second scan pattern to the digital to analog conversion step 736a, a set of digital offsets 778 representing the second center coordinates is provided to digital to analog conversion step 736b. By this method, the amplitude of the plurality of 8 streams of digital drive signals 770 is reduced. With this method, it is therefore possible to increase the resolution of the specific scanning deflection control step 730.

In an example, the response of the voltage amplification step 740 and response of the electrical connections and electrodes depends from the change of a voltage or the frequency of the voltage signal. For example, each amplifier can have a low pass filtering characteristic. As a consequence, fast and large changes of the driving voltages suffer from a delay or overshooting of the driving voltages. For example, in a scan pattern following a meander path (see below), the real scan positions can deviate from the design scan positions due to a low pass filtering of the stream of driving voltages in the time domain. In an example, such deviations of real scan positions from design scan positions are compensated during the second vertex postprocessing step 734. In the second vertex postprocessing step 734, the scan program or scan pattern is analyzed by a temporal frequency analysis of the sequence of voltage signals to be generated. The frequency response of the voltage amplifier, the electrical connections and electrodes is considered and pre-compensated for example by an inverse filtering technique. In another examples the voltage changes to be generated in given time intervals are computed. For given voltage changes per time interval, a frequency response of the voltage amplifier, the electrical connections and electrodes is considered and pre-compensated by application of corresponding corrections to the sequence of digital drive signals 776. In another example, a predefined correction pattern is applied to the digital drive signals 776, with the predefined correction pattern stored in a memory and corresponding to a selected scan program 762. The frequency response or the predefined correction pattern can be determined in advance during a system calibration of the multi-beam charged particle microscope 1 and stored in a memory of the imaging control module 820. In this example, a trigger signal (not shown) representing a selected scan program 762 can be provided during the generic scan processing step 720 to the vertex postprocessing step 734 and a selection of the predefined correction pattern is activated by the trigger signal.

In an example, during second vertex postprocessing step 734, further drive signals are added to the 8 digital drive signals provided by conversion step 732. Thereby, for example other multi-beam parameters are corrected in parallel to the collective scanning operation. This is especially possible with a collective multi-beam raster scanner 110 with more degrees of freedom as desired for collective raster scanning, as for example with a collective multi-beam raster scanner 110 with eight electrodes as described above.

Generally, it is optional to operate at constant acceleration voltages of the plurality of primary charged beamlets 3. The acceleration voltage of the plurality of primary charged beamlets 3 can for example be at a constant acceleration voltage between 15 kV and 35 kV, such as between 20 kV and 30 kV. However, in an example, the acceleration voltage of the plurality of primary charged beamlets 3 can be selected or changed via the control unit 800. In the example of a variably adjustable acceleration voltage of the plurality of primary charged beamlets 3, an acceleration voltage of the plurality of primary charged beamlets 3 is for example increased or reduced by 10%, and an amplification gain is selected in amplification step 740 corresponding to the selected or adjusted acceleration voltage. In this example, a signal corresponding to the desired amplification gain is provided to the amplification step 740 and the amplification of the voltage signals for deflection of the plurality of primary charged beamlets 3 is adjusted according the selected acceleration voltage of the plurality of primary charged beamlets 3. The acceleration voltage of the plurality of primary charged beamlets 3 can be adjusted by known methods, for example by the voltages applied to any acceleration electrodes within the multi-beam charged particle microscope system 1.

The first generic scan processing step 720 is further connected to the image data acquisition step 750. During collective deflection step 742, the plurality of J primary charged particle beamlets 3 are impinging in parallel to respective J image subfields of an image patch and thereby generate at the J focus points secondary electrons, which form J secondary electron beamlets 9. The plurality of J secondary electron beamlets 9 are collected by objective lens 102, are passing the collective multi-beam raster scanner 110 and the beam splitter or beam separator unit 400 in direction opposite to the propagation direction of the primary charged particle beamlets 3 and are imaged by projective system 200 onto detector 207. In the analog data collection step 748, for each of the J secondary beamlets, the secondary electrons are detected and converted in a plurality of J fluctuating voltages representing the amounts of secondary electrons for each of the secondary electron beamlet 9 per scan position in the plurality of J image subfields. As a result, J streams of fluctuating voltages 786 are generated and provided to the image data acquisition step 750. In the first image analog to digital (AD) conversion step 752 of the image acquisition step 750, the J streams of fluctuating voltages 786 are converted into streams of digital signals representing the actual values of the J streams of fluctuating voltages 786 at a fixed sequence of AD-conversion times at a constant AD conversion frequency. The sequence of AD-conversion times is synchronized with the DA conversion in DA converting step 736 (illustrated by the dashed line in FIG. 7). The synchronization is achieved by a clock signal 760 generated for example during first generic scan processing step 720 by a clock signal generator (see below) and providing the clock signal 760 from first generic scan processing step 720 to second specific scanning deflection control step 730 and to the image data acquisition step 750. In the example of FIG. 7, the clock signal 760 is directly provided to the DA conversion steps 736*a* and the AD conversion step 752. In an example, the clock signal 760 of 200 MHz can be an integer multiple of the frequency of the stream of digital data of for example 100 MHz, which is in this case equivalent the DA conversion frequency of DA converting step 736, and the AD conversion frequency of the AD conversion during step 752. The AD conversion during step 752 and DA conversion during step 736*a* and 736*b* can be synchronized at times corresponding to every single, every second, every third, every $n^{th}$ signal of the clock signal 760, with n being an integer.

By AD conversion step, J streams of digital sensor data 788 are provided to digital image data selection step 754. The digital image data selection step 754 receives from scan command processing step 720 a selection control signal 744, representing the scan program 762. With the selection control signal 744, during digital image data selection step 754, J streams of digital image data values 790 are selected from J streams of digital sensor data 788, thereby for example the digital sensor data collected during an interruption of the scan program 762 and corresponding to the hold signals described above are skipped. In a similar manner, the digital sensor data collected during scan signals for example corresponding to a fly back are skipped. In an example, the selection control signal 744 is equivalent to the sequence of unit scan commands 764. In an example, a sequence of flag signals is generated which provide a label for each of the unit scan commands of the stream of unit scan commands 764 which correspond to the scan points contributing to a digital image pixel to be collected by image data acquisition step 750. During digital image data selection step 754, only the digital sensor data corresponding to labelled scan commands are selected. The J streams of digital image data values 790 are provided to the digital image data addressing and writing step 756. In this step, the J streams of digital image data values 790 are written into a parallel access memory at a plurality of addresses corresponding to the sequence of unit scan commands 764 and separated for each of the J image subfields. In a first example, the J streams of digital image data values 790 are pre-processed in digital image data addressing and writing step 756 and sorted in a sequence of pixels to be written to a sequence of memory addresses. In an alternative example, the J streams of digital image data values 790 are directly written to memory addresses computed from the unit scan commands 764.

In an example of the digital image data addressing and writing step 756, a plurality of J sequences of memory address pointers of the plurality of J image data corresponding to the plurality of J image subfields is generated. In other words, each of the plurality of J image data corresponding to the plurality of J image subfields is written in individual memory address, and, corresponding to a selected scan program, and the plurality of J image data is written to a parallel access memory at the plurality of J different and non-overlapping sequences of memory address pointers. The plurality of J different and non-overlapping sequences of memory address pointers can be configured and allocated in the parallel access memory according the desired image pixel number according a scan program and the number J of the plurality of J image subfields. In an example, only segments or parts of the plurality of J image data corresponding to the plurality of J image subfields is written to the parallel access memory at once, and read out during the parallel read out and image processing step 758, before new segment of other parts of the plurality of J image data corresponding to the plurality of J image subfields is written at same memory locations in the parallel access memory.

With this method, different scan programs, including scan programs with arbitrary or random scan patterns, disjunct scan paths, or scan patterns with cascaded increase of resolution are enabled. The different scan programs can comprise a known scan pattern with a scanning of a plurality of scanning lines in the same direction. In such case, each of the plurality of J image data is written in the parallel access memory consecutively in a linear sequence synchronized with a scanning time controlled by scanning clock intervals. In another example of a scan program, scanning lines are scanned in alternating directions and each second of the plurality of J sequences of memory address pointers decreases linear from a memory address corresponding to a line end coordinate. In another example of a disjunct scan program, for example if each second or third scanning line is skipped, and the plurality of J sequences of memory address pointers comprises jumps or gaps of memory addresses. Further examples are described below.

In the parallel read out and image processing step 758, the plurality of image pixel data 792 stored in the parallel access memory are read out and further data processing is performed. The read out of the plurality of image pixel data 792 can be in a different order as the writing of the J streams of digital image data values 790 during addressing and writing step 756 and can be delayed with respect to the writing of the J streams of digital image data values 790 during addressing and writing step 756. The multi-beam scanning and image acquisition method 707 can provide a control signal to the control unit 800 to identify when blocks of digital image data are actualized and completed in the digital image data addressing and writing step 756. The control unit 800 is configured to receive the control signal. During the parallel read out and image processing step 758, the control signal triggers a read out of actualized or completed blocks of digital image data from the image frame memory. Examples of image processing comprise at least one of an image filtering, an image registration, a threshold operation, an object detection, dimension measurement of image objects, a distortion compensation, a contrast enhancement, a deconvolution operation, or an image correlation. The image processing can further comprise a stitching operation to form a single image file from the plurality of J image subfields generated by synchronous scanning of the plurality of J charged particle beamlets 3 over the sample by the scan and image acquisition method according the second embodiment.

In the multi-beam scanning and image acquisition method 707 according the second embodiment, a scan program 762 is selected and provided in configuration step 710. The multi-beam image scanning and acquisition method 707 is separated in a first generic scan processing step 720, second specific scanning deflection control steps 730, and a third image data acquisition step 750. The method 707 of multi-beam scanning and image acquisition utilizes a common clock signal 760 for synchronization of the operation as well as for clocking and streaming the streams or sequences of data generated during the multi-beam scanning and image acquisition method 707. The common clock signal 760 is for example generated in the generic scan processing step 720 and provided to second and third steps 730 and 750. The parallel read out and image step 758 can operate at a different or the same clock frequency. The control unit 800 can operate at a different or same clock frequency.

Within the multi-beam scanning and image acquisition method 707, for example the DA conversion step 736 and the AD conversion step 752 are synchronized to provide synchronization of raster scanning deflection and image pixel data collection. Delays in the data processing subsequent to AD conversion step 752 as well as delays of the amplification step 740 and collective deflection step 742 can be calibrated and considered for example in digital image data selection step 754. Thereby, the digital image pixel data which are corresponding to actual scan positions in local subfield p,q-coordinates are written to memory addresses corresponding to the unit scan commands corresponding to actual scan positions in p,q-coordinates.

The first generic scan processing step 720 is comprising at least one of a scan command receiving step 722, a scan command processing step 724 and a vertex postprocessing step 726. From the scan program 762, a sequence of pre-compensation digital scan commands 766 is generated by scan processing step 720 and provided to a specific scanning deflection control step 730. Each scanning deflection control step 730 is comprising at least one of a specific conversion step 732, a vertex postprocessing step 734, a digital to analog conversion step 736 and an amplification step 740. The third image data acquisition step 750 is comprising an AD conversion step 752, a step of digital image data selection 754 and a digital image data addressing and writing step 756.

The modular separation in the first and second steps 720 and 730 has the advantage, that each specific scanning deflection control step 730 can be adjusted or calibrated to different specific collective multi-beam raster scanning systems 110 or second collective multi-beam raster scanning systems 222 without the need of an adaption or change of the generic scan processing step 720. It is therefore possible to modify a specific scanning deflection control step 730 as desired for example for a specific collective multi-beam raster scanning system 110, depending on whether for example an octupole scanner or a sequence of quadrupole scanners, a sequence of dipole scanners or other collective multi-beam raster scanning systems 110 are used. With the modular separation in the first and second steps 720 and 730, systematic aberrations of a multi-beam charged particle system 1 are separated from specific aberrations of nonlinear effects of an actual collective scanning system. The systematic aberrations of a multi-beam charged particle system 1 are pre-compensated in the first generic scan processing step 720. The specific aberrations or nonlinear effects of an actual collective scanning system, for of the collective multi-beam raster scanner 110 or second collective multi-beam raster scanner 222, respectively including nonlinearities of voltage amplification during amplification steps 740 in each case, is pre-compensated in each specific scanning deflection control step 730. In an example, the multi-beam scanning and image acquisition method 707 comprises at least a first scanning deflection control step 730.1 for operation control of the collective multi-beam raster scanner 110 and a second scanning deflection control step 730.2 for operation control of the second collective raster scanner 220. The multi-beam scanning and image acquisition method 707 can comprise further scanning deflection control step 730.3 to 730.n.

The modular separation in the first and third steps 720 and 750 has the advantage, that complex scan programs 762 can be selected and configured for an image acquisition of the plurality of J subfields, synchronized with the collective scanning operation of the plurality of J charged particle beamlets. For example, with the generation and provision of flagged unit scan commands to the image data acquisition step 750, the J streams of fluctuating voltages 786 from sensor 207 are converted, selected, sorted and written to a parallel access memory at memory addresses corresponding to unit scan coordinates. With this method, different scan programs, including scan programs with arbitrary or random scan patterns, disjunct scan paths, or scan patterns with cascaded increase of resolution are enabled. Some examples of scan programs 762 are illustrated below in more detail.

In an example, a selected first scan program 762 is interrupted and a second scan program can be selected during the interruption of the first scan program 762. Thereby, for example a calibration measurement or a repeated measurement of a plurality of J image segments of the plurality of J image subfields is performed and a property such as a drift of the multi-beam charged particle microscope 1 is monitored. By repeated measurement of a plurality of J image segments and monitoring the image data corresponding to the plurality of J image segments, for example a stage movement or stage drift, an image rotation, a focus drift or other changes of the multi-beam charged particle microscope 1 can be detected. In a further example, a repeated collective scanning of the plurality of J primary charged particle beamlets 3 is performed over of a plurality of J image segments of the plurality of J image subfields and a charging of the sample 7 is changed.

With the method 707 according the second embodiment, a general digital scan command 766 is generated in real time and provided in real time to the specific scanning deflection control step 730 and to the image acquisition step 750. During a specific scanning deflection control step 730, a plurality of drive voltages 772 and 782 and amplified drive voltages 774 is generated and provided for example to the electrodes of the collective multi-beam raster scanner 110 in real time. In parallel, other digital control commands 768 are generated and provided to at least a scanning synchronized control step 718 in real time. According a third embodiment of the disclosure, the methods according the first or second embodiments are implemented in a hardware system comprising at least one FPGA (Field-programmable gate array) or equivalent systems as for example an ASIC or CPLD (complex programmable logic device). Actual devices of these types allow a stream processing of sequences of digital data at a clock frequency of about 1.5 GHz and more. FIG. 8 illustrates the third embodiment at an example of an improved imaging control module 820. The imaging control module 820 is connected to operation control module 800. The connection between operation control unit 800 and imaging control unit 820 can be an ethernet connection with high data rate in the range of at least 1 Gbit/s. The operation control module 800 comprises a scan program selection module 804, which is configured such that either by user input or by other input devices a scan program 762 can be selected. A scan program 762 can also be automatically selected by commands provided with an inspection task, and for example provided together with a sample or by external control commands. Different scan programs 762 can be defined for example by external devices and can be stored in a non-volatile memory 806 of the operation control module 800. A selected scan program 762 can for example be a meander scan program, a zig-zag-scan program or any other scan program, as described above. More examples of different scan programs 762 are described below. During use, the selected scan program 762 is selected by scan program selection module 804 from the memory 806 and provided to imaging control module 820 via the ethernet connection, and within the imaging control module 820 it is provided to a scan control unit 930 and an image data acquisition unit 810. The scan control unit 930 of the imaging control module 820 is configured to receive and store a first selected scan program 762 and configured to generate and provide the drive voltages 774 for example to the collective multi-beam raster scanning system 110 for example by the method described in the second embodiment. In an example, the image data acquisition unit 810 is connected to imaging detector 207 via a plurality of shielded data connections and the image data acquisition unit 810 is configured to receive a plurality of J streams of fluctuating voltages 786 from the imaging detector 207 and to generate a set of 2D images from the stream of image data synchronized with the scanning of the plurality of primary charged particle beamlets 3 according the first selected scan program 762. The image data acquisition unit 810 is therefore connected to the scan control unit 930 and scan control unit 930 comprises a clock signal generator 938 which is configured to provide during use a clock signal for synchronization of the image data acquisition unit 810 with the scan control unit 930. The image data acquisition unit 810 comprises a parallel access memory 1816 and is configured to write during use the set of 2D images or 2D image data into a parallel access memory 1816. The image data acquisition unit 810 and the synchronized operation of the image acquisition unit 810 is described below in more detail.

The scan control unit 930 is connected to the second collective raster scanning system 222 of the projection system 205, to other systems 960, and for example deflector 350 (see FIG. 2). The scan control unit 930 is further configured to generate and provide drive voltages 774 to the second collective raster scanning system 222 of the projection system 205, and to other systems 960 which involve synchronized control with the scanning operation according the scan program 762. An example of such other system is the deflector 350, which is configured to deflect the plurality of primary charged particle beamlets 3 to the position of the beam dump 130 during an optional fly-back of the plurality of primary charged particle beamlets 3, if a selected scan program 762 comprises a fly-back or other scanning commands of the plurality of primary charged particle beamlets 3 without parallel and synchronized image acquisition. In an example, the deflector 350 provides during use a trigger signal back to the scan control unit 930 and the scan control unit 930 is configured to perform a controlled delay in the scanning program 762 synchronized with the collective deflection of the plurality of primary charged particle beamlets 3 into the beam dump 130 and back to the optical axis 105. In the example illustrated in FIG. 8, the scan control unit 930 is configured to directly provide drive voltages to the electrodes of the deflector 350. In an alternative example, the scan control unit 930 can be connected to an external control unit of the beam deflector 350 and is configured to provide a trigger signal for beam deflection by beam deflector 350 to the external control unit of the beam deflector 350.

The imaging control module 820 further comprises a power supply unit 925 configured to provide during use the desired voltages to the collective multi-beam raster scanner 110, the collective deflection system 222 or other systems 960.

The scan control unit 930 is further connected to auxiliary scan system 950. In an example, the auxiliary scan systems 950 can be correction systems for individual correction of a scanning induced distortion, as described in German patent application 102020209833.6, filed on Aug. 5, 2020, cited above.

According the third embodiment, a multi-beam charged particle microscope 1 is comprising
at least a first collective raster scanner 110 for collective scanning a plurality of J primary charged particle beamlets 3 over a plurality of J image subfields 31.11 to 31.MN; and
a detection system 200, comprising a detector 207 for detecting a plurality of J secondary electron beamlets 9, each corresponding to one of the J image subfields 31.11 to 31.MN; and
an imaging control module 820, the imaging control module 820 comprising:
a scan control unit 930, connected to the first collective raster scanner 110 and configured for controlling during use a scanning operation of a plurality of J primary charged particle beamlets 3 with the first collective raster scanner 110 according a first selected scan program 762,
an image data acquisition unit 810, connected to the scan control unit 930 and the detector 207, configured for acquiring and selecting during use a plurality of J image data from a detector 207 synchronized with a clock signal provided by the scan control unit 930, and configured for writing the plurality of J image data into a parallel access memory 1816 at memory locations according the first selected scan program 762.

In an example, the scan control unit 930 is configured to generate a sequence of unit scan commands 764 according the first selected scan program 762 and the image data acquisition unit 810 is configured to write during use the plurality of J image data into a parallel access memory 1816 at memory locations according the sequence of unit scan commands 764 according the first selected scan program 762. In an example, the scan control unit 930 comprises a clock signal generator 938, configured to provide during use the clock signal to scan control unit 930 and image acquisition unit 810. In an example, the scan control unit 930 is further connected to at least a further system 960, which is configured for synchronized operation with the raster scanning operation. In an example, the at least a further system 960 is a collective deflector 350, configured for collectively deflecting during use the plurality of J primary charged particle into a beam-dump 130. In an example, the multi-beam charged particle microscope 1 comprises in the detection system 200 a second collective raster scanner 222, and the scan control unit 930 is further connected to the second collective raster scanner 222. In an example, the imaging control module 820 further comprises a voltage supply 925, configured to supply voltages to the scan control unit 930 and image acquisition unit 810, and configured to supply during use driving voltages to the first collective raster scanner 110 or the second collective raster scanner 222.

FIG. 9 illustrates further details of the scan control unit 930 according the third embodiment. The scan control unit 930 comprises a scan generator module 932, which is configured to the perform during use the generic scan processing step 720 of the second embodiment. Scan generator module 932 is connected to control unit 800. Control unit 800 is configured to provide during use the scan program 762 and a trigger signal to initiate or interrupt the operation of the scan generator module 932. The scan generator module 932 is further connected to a general purpose in and out interface (GPIO) 934, which is configured for the exchange of control data with the scan generator module 932.

Control data can for example be information from a system calibration according a method described in the first embodiment, for example including the pre-compensation C(p,q) according the reference or average scanning induced distortion.

The scan control unit 930 comprises a clock unit 938. The clock unit 938 provides during use a clock signal 760. The scan generator module 932 is connected to clock unit 938 and is configured to synchronize the operation of devices controlled by scan control unit 930. The clock signal can for example have a frequency in a range between 100 MHz and 400 MHz, such as between 150 MHz and 200 MHz.

The scan control unit 930 comprises a plurality of scanning signal amplifier modules 936.1 to 936.n, each of which is configured to the perform a specific scanning deflection control step 730.1 to 730.n. The scan generator module 932 is connected to at least a first scanning signal amplifier module 936.1 and a second scanning signal amplifier module 936.2. The first scanning signal amplifier module 936.1 is connected to the electrodes, for example electrodes 153.1 and 153.2 of the first collective multi-beam raster scanner 110 of the primary charged particle beam-path (see FIGS. 1 and 4). The first collective multi-beam raster scanner 110 is illustrated in FIG. 9 simplified as an octupole scanner by an octagon. The second scanning signal amplifier module 936.2 is connected to the electrodes of the second collective multi-beam raster scanner 222 of the secondary electron beam path. The second collective multi-beam raster scanner 222 is illustrated simplified as an octupole scanner by an octagon. For ease of illustration, instead of a plurality of 8 shielded voltage lines between the first scanning signal amplifier module 936.1 and the eight electrodes of the first collective multi-beam raster scanner 110, only a single line representing the high voltage connections 972 is illustrated. Each voltage connection, including the high voltage connections 972, can be electrically shielded and cross talk is minimized.

The amplifier modules 936.1 or 936.2 each are configured to perform the specific scanning deflection control step 730 according the second embodiment. Each amplifier module 936 therefore comprises a converting unit for performing the conversion step 732, and a vertex postprocessing unit for performing the vertex postprocessing step 734; both units can be implemented in an FPGA. Each amplifier modules further comprises a digital to analog converter for conversion of the sequence of digital scan coordinates to analog voltages. Each amplifier module 936.i further comprises an amplifier, which is connected to the voltage supply 925, for performing during use the amplification step 740. In an example, the eight amplifiers of the first scanning signal amplifier module 936.1 are typically configured to provide 8 high voltages of about up to +/−80V, for example +/−50V to each of the eight electrodes of the first collective multi-beam raster scanner 110. Such amplifiers typically have a low pass characteristic. Typically, the response of the amplifier of a scanning signal amplifier module 936.i is between 1 MHz and 10 MHz. The low pass characteristic of the amplifiers can be pre-compensated, as described above. The vertex postprocessing unit of the amplifier module for performing the vertex postprocessing step 734 is therefore configured to perform a scanning signal analysis and to provide a pre-compensation of the low-pass characteristic of the first scanning signal amplifier module 936.1. In an example, low-pass characteristic is determined and stored in a memory of for example control unit 800 and a scan program is adjusted by control unit 800 according the low-pass characteristic of the first scanning signal amplifier module 936.1. For example, delay times can be inserted in a selected scan program to consider a low frequency response of large voltage changes to be generated by the first scanning signal amplifier module 936.1.

The scan generator module 932 is further connected to a third scanning signal amplifier module 936.3 and further scanning signal amplifier modules 936.i to 936.n. Generally, the plurality of at least the first and second scanning signal amplifier modules 936.1 ... 936.n are connected to a plurality of scanning synchronized systems 960.1 ... 960.n, with first collective multi-beam raster scanner 110 of the primary charged particle beam-path and the second collective multi-beam raster scanner 222 of the secondary electron beam path being two examples of the plurality of scanning synchronized systems 960.1 ... 960.n. An example of scanning synchronized systems 960.i can be a scanning multi-aperture array corrector 601 or 602, or a set of correction electrodes provided in a corrected collective multi-beam raster scanner 110 as described in German patent application 102020209833.6, filed on Aug. 5, 2020, which is hereby incorporated by reference. Alternatively, for example a scanning multi-aperture array corrector 601 or 602 can be controlled by auxiliary scan system 950, which is digitally connected to scan generator module 932 and configured for synchronized operation for example by the same clock signal provided by clock unit 938.

The scan control unit 930 is connected to the power supply unit 925. The power supply 925 is configured to provide during use the power to the scan control unit 930 and to the plurality of scanning signal amplifier modules 936. The power supply 925 is configured to provide a low voltage support of scan control unit 930 and the low voltage and low current part of the scanning signal amplifier modules 936 as well as the high current signals involved for scanning deflection of the plurality of primary charged particle beamlets with for example the first collective multi-beam raster scanner 110. In an example, the scan generator module 932 is further connected to deflection unit 350, as described above.

The scan generator module 932 is further connected to image data acquisition unit 810 and is configured to provide during use to image acquisition unit 810 control signals including the clock signal from clock unit 938 for synchronization of the scanning image acquisition according a selected scan program 762. Details of the image data acquisition unit 810 are described in more detail below.

According the third embodiment, the scan control unit 930 comprises
 a scan generator module 932, connected to the clock unit 938; and
 a first amplifier module 936.1, connected to the first collective raster scanner 110; and
 a second amplifier module 936.2, connected to the second collective raster scanner 222;

the scan generator module 932 being configured to generate and provide during use a sequence of pre-compensation digital scan commands to the first amplifier module 936.1 and the second amplifier module 936.2; and the first amplifier module 936.1 being configured to generate during use at least a first amplified sequence of drive voltages to an electrode of the first collective raster scanner 110;

the second amplifier module 936.2 being configured to generate during use at least a second amplified sequence of drive voltages to an electrode of the second collective raster scanner 110.

In an example, the scan generator module 932 is further connected to the image acquisition module 810. In an example, the scan control unit 930 comprises at least a further amplifier module 936.3, connected to a system 960.3 configured for synchronized operation during use with the raster scanning deflection.

FIG. 10 illustrates further details of the amplifier modules 936.1 . . . 936.n at the example of the first amplifier module 936.1. The amplifier module 936.1 comprises a conversion and vertex postprocessing unit 940, which is connected to scan generator module 932 via digital data connection line 974, which comprises for example two data lines for two sequences of pre-compensation digital scan commands 766, one for each of the two scanning directions p and q. The conversion and vertex postprocessing unit 940 is further connected to a memory and control unit 942, which provides additional control signals for the conversion and vertex postprocessing, which is for example determined in a previous calibration step of the multi-beam charged particle microscope 1 and stored in the memory of the memory and control unit 942. The conversion and vertex postprocessing unit 940 is configured to perform during use the conversion step 732 and the vertex postprocessing step 734. The conversion and vertex postprocessing unit 940 is connected to a plurality of scanning digital to analog converters 946.1 to 946.8 (only two are illustrated) for providing during use the sequence of digitally corrected drive signals 776, generated during use by the conversion and vertex postprocessing unit 940. Each output line of each scanning digital to analog converters 946.1 to 946.8 is connected to an individual amplifier 948.1 to 948.8 (only two shown), for example the first output line of the first scanning digital to analog converters 946.1 is connected to an amplifier 948.1.

The amplifiers 948.1 to 948.8 are connected to power supply 925 for amplification of the eight non-linear voltage signals 772 provided by the scanning digital to analog converters 946.1 to 946.8 to the eight amplified sequences of drive voltages 774. The output lines of each amplifier 948.1 to 948.8 are connected to the eight electrodes of the octupole scanner 110 via eight high voltage connection 972.1 to 972.8 (only two shown).

The memory and control unit 942 can further provide a digital offset signal to an offset DAC 944, which generates in this example 8 offset voltages provided to the input lines of the amplifiers 948.1 to 948.8. The offset DAC 944 is therefore connected to the input lines of the amplifiers 948.1 to 948.8. The memory and control unit 942 is further connected to the general purpose input and output device (GIPO) 934 and is configured to receive control commands or control signals to be stored in the memory of the memory and control unit 942.

The scan generator module 932 can be implemented in a first FPGA. The conversion and vertex postprocessing unit 940 and the memory and control unit 942 of the first amplifier modules 936.1 can be implemented in a second FPGA. The corresponding conversion and vertex postprocessing unit 940 and corresponding the memory and control unit 942 of amplifier modules 936.2 can be implemented in a third FPGA. The image data acquisition unit 810 comprises units which are implemented in a forth FPGA, as will be shown below.

According the third embodiment, multi-beam charged particle microscope 1 comprises at least two amplifier modules 936.1 and 936.2, wherein at least the first amplifier module 936.1 is comprising a conversion and vertex postprocessing unit 940, configured for converting during use at least two sequence of pre-compensation digital scan commands 766 into at least a first and a second sequence of digitally corrected drive signals 776, the conversion and vertex postprocessing unit 940 being connected to scan control unit 930 for receiving the at least two pre-compensation digital scan commands 766;

at least a first and a second scanning digital to analog converters 946.1 and 946.2, being connected to the conversion and vertex postprocessing unit 940 for receiving during use the at least first and a second sequence of digitally corrected drive signals 776 and for converting during use the at least first and a second sequence of digitally corrected drive signals 776 into at least a first and a second non-linear voltage signal 772;

at least a first and a second amplifiers 948.1 and 948.2, wherein each of it is connected to a power supply unit 925;

wherein the first amplifier 948.1 is connected the first scanning digital to analog converter 946.1 and is configured to convert during use the first non-linear voltage signal 772.1 into a high voltage output, and wherein the first amplifier 948.1 is further connected to a first electrode of a collective scanning deflector 110 via a first high voltage connection 972.1;

wherein the second amplifier 948.2 is connected the second scanning digital to analog converter 946.2 and is configured to convert during use the second non-linear voltage signal 772.2 into a high voltage output, and wherein the second amplifier 948.2 is further connected to a second electrode of a collective scanning deflector 110 via a second high voltage connection 972.2.

FIG. 11 describes the architecture and the components of the image data acquisition unit 810, more details of the components and operation during use of the image data acquisition unit 810 will be explained below.

The image data acquisition unit 810 comprises an analog to digital conversion module or ADC module 1808, which comprises a plurality of analog to digital (AD) converters. In an example, the image sensor 207 comprises a plurality of J photodiodes corresponding to the plurality of J secondary electron beamlets. Each of the J photodiodes, for example avalanche photo diodes (APD), is connected to an individual analog to digital converter. The image sensor 207 can further comprise an electron-to-photon converter, as for example described in DE 102018007455 B4, which is hereby fully incorporated by reference.

The J photodiodes generate J fluctuating voltages corresponding to the generated electrons at the J image subfields. Between the photodiodes and the ADC module 1808, a plurality of amplifiers can be arranged. For each of the plurality of J imaging channels of each of the plurality of J secondary electron beamlets, offset and gain can be adjusted separately in a calibration step, and a plurality of J calibrated and fluctuating sensor voltages is generated. Details of the configuration and method are described in DE 102018007455 B4 cited above. The plurality of J calibrated sensor voltages is provided to ADC unit 1808. A plurality of J AD converters of the ADC module 1808 are configured to generate a plurality of J digital data streams from the calibrated J sensor voltages. The ADC module 1808 is configured to generate and provide the plurality of J digital data streams at a constant ADC clock between 60 MHz to 400 MHz or even more.

The plurality of J AD converters of the ADC module 1808 are controlled by an ADC clock signal. The ADC module 1808 is connected to the scan control unit 930. In an example, the ADC clock signal is for example synchronized with the scanning clock signal generated by clock unit 938 and provided by the scan control unit 930 to the ADC module 1808. In an alternative example, the ADC module 1808 comprises a separate clock signal generator and the clock signal generator is configured to generate the ADC clock signal in response to control data provided by scan control unit 930.

The recorder 1810 is connected to ADC module 1808 and provides an interface to the ADC module 1808 and is configured to receive the plurality of J digital data streams. The recorder 1810 is configured to provide the plurality of J digital data streams to the acquisition module (ACQ) 1812. The ACQ 1812 is configured to receive the scanning clock signal generated by clock unit 938 and provided by the scan control unit 930. The ACQ 1812 is therefore connected to the scan control unit 930. The ACQ 1812 is configured to synchronize the plurality of digital data streams with the scanning clock signal and to provide the plurality of J synchronized digital data streams to an image data sorter 1820. The image data sorter 1820 is connected to ACQ 1812 and configured to sort and write the plurality of synchronized digital data streams to a parallel access memory 1816. The image data sorter 1820 comprises a pixel averaging unit 1822 and a line averaging unit 1824 and a pixel addressing unit 1826. The three units 1822, 1824 and 1826 can be arranged in sequence or in parallel. The image data sorter 1820 is connected to the scan control unit 930 and is configured to receive control data corresponding to the selected scan program 762. The pixel averaging unit 1822 and the line averaging unit 1824 are configured to perform a processing over a plurality of digital data of each digital data stream in response to the control data provided by scan control unit 930. The processing can for example be an averaging or a computation of a difference. The pixel addressing unit 1826 is configured to receive the plurality of J streams of averaged digital data from the pixel averaging unit 1822 and the line averaging unit 1824 and to derive and assign to each of the digital data a pixel address. Some examples of a pixel or line averaging are described below in more detail. The pixel addressing unit 1826 is connected to the frame grabber memory or parallel access memory 1816 and is configured to write each digital data value of the streams of J digital data to a pixel address in the parallel access memory 1816 corresponding to the pixel address according the selected scan program 762.

In an example, the clock frequency provided by the scanning clock unit 938 or the clock frequency of the ADC unit 1808 is adjustable. By adjustment of for example the scanning clock frequency by the scanning clock unit 938, a dwell time for each of the plurality of image pixels can be variably adjusted. In an example, the scanning clock frequency by the scanning clock unit 938 is 200 MHz and each scan position is hold by scan control unit 930 for H=2 clock signals. The dwell time per scan position is therefore 10 ns. With a change of the hold interval from H=2 to H=3, the dwell time is increased to 15 ns. A finer adjustment of the dwell time can be reached by an adjustment of the scanning clock frequency by the scanning clock unit 938 from 200 MHz to for example 180 MHz and H=2 with a dwell time of about 11 ns or with a change from 200 MHz to for example 220 MHz and H=3 with a dwell time of about 13.6 ns. With the fine adjustment of the scanning clock frequency and optionally the amount of pixel averaging by pixel averaging unit 1822, the effective pixel dwell time can be adjusted and a predetermined signal to noise ratio (SNR) can be achieved.

The frame grabber memory bank 1816 is connected for parallel read out to control unit 800, which is configured to read out the plurality of J digital images corresponding to the J image subfields 31.11 to 31.MN (see FIG. 3). An image stitching unit 812 of the control unit 800 is configured to stitch the J digital images to one digital image file corresponding to one image patch, e.g. image patch 17.$k$. Image stitching unit 812 is connected to image data processor and output 814, which is configured to extract information from the digital image file and is configured to write the digital image file to a memory or to provide information from the digital image file to a display.

According the third embodiment, the image data acquisition unit 810 comprises
- an ADC module 1808, comprising a plurality of AD converters connected to the image sensor 207 and configured for converting during use the plurality of J fluctuation voltages 786 into a plurality of J streams of digital sensor data 788; and
- an acquisition control unit 1812, connected to the ADC module 1808 and the scan control unit 930 and configured for selecting during use a plurality of J streams of digital image data values 790 from the plurality of J streams of digital sensor data 788 and from a selection control signal 744 provided during use by the scan control unit 930 according the selected scan program 762; and
- and image data sorter 1820, connected to the acquisition control unit 1812, the scan control unit 930, and to the parallel access memory 1816;

wherein the image data sorter 1820 is configured for writing during use the plurality of J streams of digital image data values 790 into the parallel access memory 1816 at a plurality of memory addresses corresponding to scan positions of the plurality of J primary charged particle beamlets 3 according the selected scan program 762.

In an example, the ADC module 1808 is connected to clock unit 938 and configured to receive during use a clock signal from clock unit 938 and to synchronize an operation of the plurality of AD converters for converting during use the plurality of J fluctuation voltages 786 into a plurality of J streams of digital sensor data 788. In an example, the clock unit 938 is connected to control unit 800 and configured to receive a control signal from the control unit 800 and is configured to change during use a clock frequency of the clock unit 938. Thereby, a clock signal and a dwell time of the scanning imaging operation is changed during use or the multi-beam charged particle microscope 1.

The imaging control module 820 of a multi-beam charged particle microscope 1 can comprise a plurality of L image data acquisition units 810.$n$, comprising at least a first image data acquisition unit 810.1 and a second image data acquisition unit 810.2 arranged in parallel. Each of the image data acquisition units 810.$n$ can be configured to receive the sensor data of image sensor 207 corresponding to a subset of S beamlets the plurality of J primary charged particle beamlets and produce a subset of S streams of digital image data values of the plurality of J streams of digital image data values. The number of S beamlets attributed to each of the L image data acquisition unit 810.n can be identical and S×L=J. The number of S is for example between 6 and 10, for example S=8. The number L of parallel image data acquisition unit 810.n can for example be 10 to 100 or more, depending on the number J of primary charged particle beamlets. By the modular concept of the imaging control module 820, the number J of charged particle beamlets in a multi-beam charged particle microscope 1 can be increased by the addition of parallel image data acquisition units.

According the embodiments, a scanning operation and image acquisition by a multi-beam charged particle microscope 1 is enabled according a selected scan program 762. In an example, during a wafer inspection task, a plurality of inspection sites, for example inspection site 33 and inspection site 35 (see FIG. 3) is subject of an inspection task. For the first inspection site 33, a first selected scan program 762.1 can be selected and for the second inspection site 35, a different, second selected scan program 762.2 can be selected. In an example, a first inspection site 33 is inspected in a first measurement according a first selected scan program 762.1 and in a second measurement the first inspection site 33 is inspected in a second measurement according a third selected scan program 762.3. During each image acquisition, a selected scan program can be interrupted and continued, for example for an intermediate monitoring task. With the multi-beam scanning and image acquisition method 707 and the imaging control module 820, a flexible scanning control and synchronized image acquisition with a multi-beam charged particle microscope is enabled, allowing the operation according a plurality of different scan programs with increased throughput and high precision. The modular architecture of the imaging control module 820 allows a dedicated adaption of the imaging control module 820 to a configuration of a multi-beam charged particle microscope 1, for example for a more simple multi-beam charged particle microscope 1 without additional mechanisms for beam deflection or scanning correction or a more complex multi-beam charged particle microscope 1 including several kinds of scanning compensators for compensation of scanning induced aberrations such as multi-aperture correctors 601 or 602 and including a beam deflector 350 with beam dump 130.

A multi-beam charged particle microscope 1 according the disclosure therefore comprises
- a multi-beam generator 300 for generation of a plurality of primary charged particle beamlets,
- a first collective raster scanner 110 and a second collective raster scanner 222, and
- a detection unit 200 including a detector 207, and
- an imaging control module 820, comprising a scan control unit 930 and an image acquisition unit 810, for scanning and imaging an inspection site of a sample with a selected scan program 762;
- the scan control unit 930 is comprising a generic scan generator module 932 and at least a first amplifier module 936.1 for providing at least a sequence of high voltages to an electrode of the first collective raster scanner 110 and a second amplifier module 936.2 for providing at least a sequence of high voltages to an electrode of the second collective raster scanner 220, wherein the scan control unit 930 is adapted to optionally include a third or a further amplifier module 936.3 or 936.n for control of a third or further operating unit 960.3 or 960.n for synchronized operation during use with the selected scan program 762.

In an example, the generic scan generator module 932 comprises a vertex postprocessing unit which is configured during use for a pre-compensation of a systematic scanning induced aberration of the multi-beam charged particle microscope 1. In an example, each amplifier module comprises a vertex postprocessing unit, a digital to analog converter and an amplifier, whereby in each amplifier module, a nonlinearity of an operation of the amplifier module in conjunction with the operating unit 960.i for synchronized operation is pre-compensated individually for each operating unit 960.i, for example first collective multi-beam raster scanner 110 or second collective multi-beam raster scanner 222.

Examples of scan programs and image acquisition according a selected scan programs are illustrated in FIGS. 12 to 15. The examples are illustrated at a single image subfield 31.mn, and it is understood that the plurality of N primary charged particle beamlets 3 is raster scanned by collective multi-beam raster scanner 110 in parallel (see also FIG. 3), and the plurality of N secondary electron beamlets 9 is raster scanned by collective multi-beam raster scanner 110 and second collective multi-beam raster scanner 222 in parallel and focused on detector array 207 to receive the plurality of N data streams.

FIG. 12A illustrates a first example of a scan program 712 of a zig-zag raster scan pattern according a conventional scan program. The scan program 712 comprises a sequence of line scans, each with a start point of a line and end-point of a line at the same p-coordinates, and each line with a subsequently increased p-coordinate of a raster distance dq of for example dq=1 nm. Between the end-point of a line and the start point of a subsequent line, the plurality of primary charged particle beamlets is quickly moved back to the start position of the subsequent line ("fly back").

FIG. 12B illustrates some of the signals generated of received by scanning control unit 930. The scanning voltage Up represents a voltage for repeated collective scanning deflection of the plurality of primary charged particle beamlets from start point of a line to an end-point of a line in p-direction. The illustration represents a collective raster scanning deflector with a pair of electrodes for scanning in x or p-direction and a pair of electrodes for scanning in y or q-direction. For a collective raster scanner with for example eight electrodes, the corresponding voltages can be derived in accordingly. In each time interval Ai, a single scan line is raster scanned in each image subfield 31.11 to 31.MN. The scanning voltage Uq represents a voltage for collective scanning deflection of the plurality of primary charged particle beamlets in a stepwise manner in q-direction. TD illustrates the trigger signal exchanged between scanning control unit 930 and deflector 350 and represents the time Ci during which the plurality of primary charged particle beamlets 3 is deflected into the beam dump 130 (see FIG. 2). TL is an example of trigger signals provided to the image data acquisition unit 810, each of which triggers a collection of a stream of image data corresponding to one scan line. The operation is illustrated at the following example.

At time t1, a next line position in q-direction of the plurality of charged particle beamlets 3 is reached and scanning control unit 930 triggers deflector 350 to deflect back the plurality of primary charged particle beamlets 3 from the beam dump 130. At t2, the deflector 350 is in an off state and each of the plurality of primary charged particle beamlets 3 reach the substrate. The trigger TD is set to a low value and the voltage ramp for scanning deflection in p-direction is initiated at t2. At time t3, each of the plurality of primary charged particle beamlets 3 reach the start points for image acquisition of the next scan lines. At t3, a trigger signal initiates the recording of the digital values corresponding to image pixels by image data acquisition unit 810. Image data acquisition unit 810 selects and writes to memory a sequence of S digital image data corresponding to a predetermined number S of pixels in one scan line. The predetermined number S of pixels can for example by S=8000 pixels, collected at a frequency of for example 100 MHz. In an example, the scan control unit 930 operates at scanning frequency which is a multiple of the collection frequency, for example 200 MHz, and each second clock signal of the scanning clock unit 938, the driving voltage Up is increased. The ADC unit 1808 collects and converts each second scanning clock signal a plurality of J analog voltages of the J photodetectors of sensor unit 207 to a plurality of J digital data values, until S=8000 data values of 16000 clock signals are reached at time t4. At time t4, a trigger signal is provided to deflector 350. At time t5, the deflector 350 sets the trigger TD to a high value, when the plurality of primary charged particle beamlets 3 is deflected to the beam dump. At time t5, the scan control unit 930 triggers the fly back to the start position of the next scan line. Up is lowered to the start position of a line in p-direction and Uq is increased to the next deflection voltage corresponding to the next line in q-position.

The voltage ramps illustrated in FIG. 12 typically consists of a plurality of small voltage steps corresponding the plurality of scan positions. In an example, however, the focus spots 5 of the plurality of J primary charged particle beamlets 3 is continuously moving over the surface of the object. In this example, the pixels size and shape if determined by the moving velocity of a focus spots 5 of the primary charged particle beamlets divided by the clock frequency used during the AD Conversion step 752 of the image data acquisition step 750.

FIG. 18 is a further illustration of the first operation of a charged particle microscope 1 with the first scan program 712. A subfield 31.*mn* (see FIG. 3) of an image patch 17 of the charged particle microscope 1 is raster scanned with a primary charged particle beamlet, and a digital image segment of a surface area of an object located in the object plane 101 is generated. The raster scanning is performed according the first scan program 712 with horizontal lines 53 with line numbers q=1 to Q. The number of lines can for example be Q=8000. During the raster scanning according the scan program 712, the focus point 5 of the primary charged particle beam is directed on a sequence of adjacent pixel positions, which are illustrated as squares 55. The positions in each line 53 are arranged in columns with numbers p=1 to p=P. The number P of positions 55 in each line 53 can be equal to the number Q of lines 53, such that for example Q=P=8000, but the number P can also differ from the number Q of lines 53.

In the parallel access memory 1816, an address area 61.*mn* is reserved or allocated by image data sorter 1820. The address locations 63 within address area 61.*mn* are represented as squares. The address area 61.*mn* can be one out of many address areas 61 within the parallel access memory 1816. The address locations 63 within the address area 61.*mn* is given by lines 65, with line numbers a=1 to A. The number A of lines 65 can be equal to the number Q. Each line 65 comprises B memory locations or columns with column numbers b=1 to B. The number B of memory locations per line 65 is for example equal to the number of image pixels P in each line 53.

Depending on the number S of primary charged particle beamlets with are allocated for one image data acquisition unit 810, the number of address areas 61.*mn* for each parallel access memory 1816 of an image data acquisition unit 810 is selected accordingly, and in each parallel access memory 1816 of each of the plurality of L image data acquisition units 810, a number of S address areas 61.1 to 61. S can be allocated In a first operation mode, both the raster scanning and the image acquisition operate at the same clock frequency, synchronized by clock signal 760. With a pixel rate of for example 100 MHz and 8000 pixels per scan line, a line scanning frequency of up to 12.5 kHz is achievable, corresponding to an image frequency of 1.56 Hz. Each detector signal corresponding to image pixel 55 of the subfield 31.*mn* is transferred and stored in a corresponding single memory location 55 of the corresponding address area 61.*mn*, illustrated by arrows 67. In the first operation mode, the number P of image pixels 55 within one line 53 is smaller or equal to the number B of address locations 63 within the corresponding line of the address area 61.*mn* (Q<=B), and the P detector signals corresponding to the image pixel 55 in a single line 53 are written into the address area 61.*mn* in a single address line 65, as indicated by arrows 69. The same applies in analogy to the number Q of lines 53, with Q<=A. Control unit 800 is then configured to read out the digital image data from the parallel access memory 1816, and for example an image stitching can be performed.

As illustrated in FIG. 12B, the time Ci can be variable and depend on the actual time for the response of deflector 350. In this example, pixel averaging unit 1822 and line averaging unit 1824 are set to no averaging. In another example, the collection frequency of the ADC unit 1808 is set to a higher value compared to the scanning clock and the plurality of streams of digital data generated by the ADC unit 1808 operates for example at 200 MHz, while the scanning operates at 100 MHz. In this example, the pixel averaging unit 1822 averages each pair of subsequent digital data values of the plurality of streams of digital data to form the stream of digital pixel data provided to pixel addressing unit 1826.

For the purpose of a pixel or a line averaging, each of the pixel averaging unit 1822 or the line averaging unit 1824 can comprise a separate memory unit. In another example, the pixel averaging unit 1822 or the line averaging unit 1824 utilize the frame grabber memory bank or parallel access memory 1816. The digital data values of the plurality of streams of digital data is then written by the pixel averaging unit 1822 and the pixel addressing unit 1826 to temporary memory locations of the frame grabber memory bank or parallel access memory 1816. The digital data values are then read out from the temporary memory locations of the frame grabber memory bank 1816 and pixel or line averaging is formed accordingly. More details are described in German patent application 102020102779.6, filed Feb. 4, 2020, which is incorporated hereby be reference. In a first step, pixel averaging unit 1822 or line averaging unit 1824 write a first set of digital data values via pixel addressing unit 1826 to parallel access memory 1816 to first memory addresses. In a second step, pixel averaging unit 1822 or line averaging unit 1824 receive a second set of digital data. In a third step, the pixel averaging unit 1822 or line averaging unit 1824 read the first set of digital values from the first memory addresses of the parallel access memory 1816. In a forth step, the pixel averaging unit 1822 or line averaging unit 1824 performs a processing of the first set of digital values and the second set of digital values, and generate a third set of digital values. In a fifth step, the third set of digital values is written via pixel addressing unit 1826 to second memory addresses to the parallel access memory 1816. In an example, the second memory addresses are identical to the first memory addresses. In a second example, the first memory addresses are temporary memory addresses. The second memory addresses are in these examples the memory addresses corresponding to the pixel positions within the digital image data.

An example of the processing by the pixel averaging unit 1822 or line averaging unit 1824 can be an averaging, and pixel averaging unit 1822 or line averaging unit 1824 generate an average value or average values of the first and second digital values. In another example, pixel averaging unit 1822 or line averaging unit 1824 can be configured and triggered by a control command to perform other processing methods of the first and second digital values. For example, a difference value of the first and second digital values can be computed. Thereby, for example, edges can be detected.

For a pixel or line data processing according a selected scan program 762, pixel averaging unit 1822, line averaging unit 1824 and pixel addressing and memory allocating unit 1826 are configured to receive a selection control signal 744 from the generic scan command processing step 724. Thereby, pixel addressing and memory allocating unit 1826 receives and allocates for example temporary memory locations in the parallel access memory 1816. The pixel averaging unit 1822 or line averaging unit 1824 receive processing information according the processing of the selected scan program 762, for example a computation of an average or of a difference of data values.

FIG. 19 illustrates a second operation mode of the scanning and image acquisition with the charged particle microscope 1. The scan program is similar to the first scan program 712. Image subfield 31.*mn* again has Q lines 53 and P columns of image pixels 55. However, the dwell time at each pixel 55 is increased by a factor of two, and at each image pixel position, two digital data values are generated by the image data acquisition unit 810. FIG. 19 illustrates an example of operation of the pixel averaging unit 1822. During each time a primary charged particle is directed to a pixel location 55, two digital data values are generated and written by pixel addressing unit 1826 to two adjacent memory locations within the address area 61.*nm* of the parallel access memory 1816. During the first clock interval, a primary charged particle beam is directed to a first pixel position, and a first digital image value is generated by ADC module 1808 and written to a first memory location. During the second clock interval, a primary charged particle beam is still directed to the first pixel position, and a second digital image value is generated by the ADC module 1808 and written to a second memory location, such that after each scanning line 53, two adjacent memory lines 65 are filled with the sequence of digital image data values. This is also illustrated by arrows 69, indicating that each pixel line 53 is written to at least two memory address lines 65. In this example, the number A of memory address lines 65 are desirably twice as large as the number Q of image pixel lines 53.

In an example, the control unit 800 can be configured to derive from each address area 61.*nm* of the parallel access memory 1816 a digital image segment of the surface of the object, for example by averaging each of the first and second digital image values from the first and second memory locations. In another example, the pixel averaging unit 1822 performs the averaging internally, and first and second digital image values are averaged and combined to one digital image value within the pixel averaging unit 1822 the before being written to memory address locations.

FIG. 20 illustrates a third example of an operation mode of the scanning and image acquisition of the charged particle microscope 1. In the third operation mode, a modified scan program 712.2 is applied, during which each pixel line 53 is raster scanned twice. The modified scan program 712.2 is illustrated schematically. In an example, the scan program 712 can just be repeated. During a first raster scanning in the first direction along pixel line 53.1, a first number P of pixels is illuminated with a primary charged particle beamlet, and a first sequence of digital image data is generated and written to the address area 61.*nm* of the parallel access memory 1816 in a first line 65.1. In a subsequent second raster scanning in the first direction along the same pixel line 53.1, the first number P of pixels is illuminated again with the primary charged particle beamlet, and a second sequence of digital image data is generated and written to the address area 61.*nm* of the parallel access memory 1816 in a first line 65.2. In this example, each pixel position is illuminated by a primary charged particle beamlet at least twice. This is also illustrated by arrows 69, indicating that each pixel line 53 is written to at least two memory address lines 65. As in the second example, the number A of memory address lines 65 are desirably twice as large as the number Q of image pixel lines 53.

In an example, the control unit 800 can be configured to derive from each address area 61.*nm* of the parallel access memory 1816 a digital image segment of the surface of the object, for example by averaging each of the first and second digital image values from the first and second memory locations. Other processing operations are possible as well, as described above.

In the examples of FIGS. 19 and 20, each pixel position on the surface of the object is raster scanned twice, and the address areas 61 involves twice as much memory locations as the example of FIG. 18. It is therefore possible, that the capacity of the parallel access memory 1816 is exceeded by the sequences of digital data values generated by illumination, detection and conversion of the sequences of data corresponding to the J subfields 31. In an example, the method raster scanning and image acquisition can be separated into at least two phases, whereby in a first phase a first set of lines is raster scanned and a first set of digital image data is written to memory locations 61 of memory 1816. The first set of digital image data is then read out by control unit 800. In a second phase, a second set of lines is raster scanned and a second set of digital image data is written to memory locations 61 of memory 1816. The second set of digital image data is then read out by control unit 800 and for example processed together with the first set of digital image data by image stitching unit 812. During the transition from the first to the second phase, the first set of digital image data is relocated from the memory address areas 61 into a temporary memory of control unit 800. After the relocation, the address areas 61 can be used for the second set of digital image data. This process can also be performed continuously with a larger number of phases.

In an example of a scan program, a scanning operation of each subsequent scanning line according for example the first scan program 712 is repeated in reverse order, and each line of each image subfield is scanned subsequently twice in positive and negative p-direction. In this example, the line averaging unit 1824 is provided with a trigger signal to perform a line averaging of the two subsequent streams of digital data values and to generate a plurality of streams of pixel data values representing the image pixel values of one line in the digital image of each subfield. By averaging the line scanning signals generated in opposite scanning directions and averaging by the line averaging unit 1824, a symmetrical image signal for example of lines or edges of semiconductor features is generated. In another example, the first signal from the first scanning of a line in a first, positive direction and the second signal from the second scanning of a line in a second, negative direction are subtracted and thereby edges are detected and enhanced.

In the example illustrated, the first and the second scanning of the first pixel line 53.1 are performed in sequence, and the address lines 65.1 and 65.2 are arranged in sequence, but that is not required, and other configurations are also possible. For example, a first sequence of digital data according a first scanning operation can be written to a first memory area 61.mn.1, and a second sequence of digital data according a second scanning operation can be written to a second memory area 61.mn.2 (not shown), separated from the first memory area 61.mn.1. Another example is illustrated in FIG. 21A-21B. In this example, the line averaging unit 1824 and the pixel addressing unit 1826 are configured to write a first sequence of digital data values to a temporary memory location 75. The digital data values collected and converted from pixel locations 55.1 in the first scanning line 53.1 are allocated to temporary memory locations 75. The allocation is illustrated by arrows 67.1. In a second step, illustrated in FIG. 21B, a second sequence of digital data values are collected and converted from pixel locations 55.2 in the first scanning line 53.1. In parallel, line averaging unit 1824 reads out the first sequence of digital data values from the temporary memory location 75 and performs a processing 73 of the first and second digital data values to compute a third digital data value. The third digital data value is finally written to the parallel access memory 1816 into the address area 61.mn (indicated by arrows 67.2 together with arrows 71). The address area 61.mn is allocated for the subfield 31.mn, as described in the examples above. In another example, the line averaging unit 1824 can also be configured to compute an average value over a sequence of digital data values for a selected set of scanning positions and can be configured to perform statistical analysis of the sequence of digital data values.

The different pixel or line averaging methods of FIG. 19 to FIG. 21 are illustrated at the example of a single primary charged particle beamlet. It is understood that in a multi-beam charged particle microscope 1 with a plurality of J primary charged particle beamlets 3, the illustrations of FIGS. 18 to 21 apply to each of the plurality of J primary charged particle beamlets.

The different pixel or line averaging methods of FIG. 19 to FIG. 21 are illustrated at the example of the first scan program 712, but the examples of pixel or line averaging are not limited to the first scan program 712. In the examples, each primary charged particle beamlet is directed at least twice to each pixel position at the surface of the object, and the accumulated time interval, during which a primary charged particle beamlet is directed to a pixel, is increased. The accumulated time interval corresponds to the dwell time.

In the examples above, the dwell time is increased by a factor of two. However, with the pixel averaging unit 1822 or line averaging unit 1824, every even numbered increase of the dwell time is possible. For example, to increase the dwell time by a factor of three, each pixel is illuminated by a primary charged particle beamlet three times, and an average of three digital data values can be computed in equivalence to the examples described above.

According the operation mode including an averaging be pixel or line averaging units 1822, 1824, a multi-beam scanning and image acquisition method 707 comprises a selection of a selected scan program 762, for example scan program 712 or 716, collectively deflecting the plurality of J primary charged particle beamlets 3 over the plurality of J image subfields on a surface 25 of a sample 7 according the selected scan program 762, acquiring J streams of fluctuating voltages 786, converting the J streams of fluctuating voltages 786 with a clock rate 760, to form J streams of digital image data values 790, processing at least two digital image data values from each of the J streams of digital image data values 790 to form a sum, an average digital image data value, or a difference of the digital image data values, and writing the J streams of digital image data values 790 including the sum, an average digital image data value, or a difference of the digital image data values into a common access memory 1816 at predefined memory locations. In the example of FIG. 19, each pixel location 55 within each of the plurality of image subfield 31 is illuminated by a primary charged particle beamlet with an extended dwell time. For example, with a sampling clock frequency of 100 Hz, the data sampling frequency corresponds to a sampling rate of 10 ms. In the example above with for example a dwell time of 20 ms, the dwell time was doubled compared to an inverse of the sampling clock frequency 760. In general, the dwell time can correspond to G times the inverse of a clock rate 760, with G being an integer with G=2, 3, 4 or more. In the example of FIG. 19, the scan program 762 comprises a scan pattern, for example scan patterns 712, 714, 716.1, 716.2 or 716.3, and further comprises a repeated scanning illumination of each pixel location 55 with at least one of the scan patterns 712, 714, 716.1, 716.2 or 716.3 with each of the plurality of J primary charged particle beamlets 3 within each of the plurality of image subfield 31. With this method, it is possible to increase the signal to noise ratio (SNR) for the digital image data collected from the surface area of the object. With a third example of a scan program 716 described below (see FIG. 14), it is also possible to apply the increasing of the accumulated dwell time only for one selected scan pattern, for example scan pattern 716.3, out of several scan patterns 716.1 to 716.3, within each subfield 31.mn. Thereby it is for example possible to achieve an overview image of the surface area of an object in combination with an image of a selected area with higher SNR.

FIG. 13A illustrates a second example of a scan program 714. In this example, each of the scan paths follows a path of a meander shape, as illustrated for one image subfield 31.mn. Examples of the corresponding signals are illustrated in FIG. 13B. The second example of a scan program 714 is faster that the first scan program 712 and does not involve a beam deflection by beam deflector 350 into the beam dump 130 during a fly back. At time t6, a new image data acquisition by the image data acquisition unit 810 is started during a ramp down phase of Up, corresponding to a line scan from an end position to a start position. The trigger signal TL provided to the image data acquisition unit 810 is set to a second value, for example a low trigger signal, and the pixel addressing unit 1826 provides pixel addresses in reverse order to consider the reverse scanning direction. After time interval Ai, for example S=8000 collected pixels, the trigger TL is set to zero to stop the image acquisition. During time Ci, the scan process is reverted and stepped to the next scan line by switching Uq to the next deflection voltage for deflection of plurality of J primary charged particle beamlets in the J next scanning lines in each of the J image subfields. At time t7, the start positions of a next scan lines is reached and the scanning voltage ramp Up for scanning to line end in positive p-direction is started. The trigger TL is switched to the first trigger signal level, which is in this example a high value, and the pixel addressing unit 1826 provides pixel addresses in linear order to consider the scanning direction in positive p-coordinates.

FIG. 14 illustrates a third example of a scan program 716 at the example of image subfield 31.*mn*. The third example of a scan program 716 comprises several scan patterns in each image subfield, for example a first scan pattern 716.1, a second scan pattern 716.2 and a third scan pattern 716.3. The scan patterns 716.1 to 716.3 are arranged disjunct to each other. Scan pattern 716.3 is rotated with respect to the p-q-coordinate systems. The separation of the scan patterns 716.1 to 716.3 can be arranged to minimize or mitigate a charging effect of the sample. A rotation of a scan pattern 716.3 can be utilized to measure structures of interest in different scanning directions. For example, semiconductor structures are typically arranged in horizontal (H) or vertical (V) direction. In such a scenario, an additional scan in a direction deviating from the H-V-direction can be advantageous. In this example, the image stitching unit 812 can be skipped and the image data is only used for image data processing in image data processor and output unit 814, such as line width measurements, line edge roughness measurements or similar.

With the apparatus and method described above, complex scan programs like the third example of the scan program with scan patterns 716.1 to 716.3 is achieved. In a first step, the scan program is described by control unit 800. In the second step, the scan program is segmented by scan generator module 932 in scan command processing step 724 in line or point commands as described above. The line or point commands are processed by vertex postprocessing step 726 and provided to the amplifier modules 936.1 to 936.*n* for performing the specific scanning deflection control step 730. A plurality of drive voltages 972 is provided to for example the electrodes of the collective multi-beam raster scanners 110 and 222. Further trigger signals are provided to the image data acquisition unit 810 for synchronized data collection and pixel data writing into a parallel access memory 1816 at memory address values corresponding to unit pixel coordinates.

Other examples of scan programs can comprise an interlaced scanning technique which subsequently scans the image subfields with separated scan lines. For example, in a first scan pattern, every third line, for example line 1-4-7 and following is scanned either in a scan pattern similar to the first or second scan program, and in a second scan pattern, the next set of each third line, for example line 2-5-8 and following is scanned either in a scan pattern similar to the first or second scan program. In another example, a scan program follows a raster scan strategy of increasing resolution, for example starting with a first raster scan pattern of first 512×512 pixels per image subfield, and a second raster scan pattern of second 512×512 pixels arranged in between the first 512×512 pixels of the first raster scan pattern. The operation is continued by a third raster scan pattern of 1024×1024 pixels arranged in between the first and second plurality of pixels for each image subfield and further raster scan patterns are added with for example 2048×2048 pixels, until an image acquisition of desired resolution of for example 8000×8000 pixels for each image subfield is reached.

In another example of a scan program, the scan program comprises a first, small scan pattern at a predetermined position for each image subfield, for example similar to scan pattern 716.3. The scan program comprises a second scan pattern similar to for example the second scan program 714. During performance of the second scan pattern, the second scan pattern is interrupted at least once, and the first scan pattern is repeated for example a second time or a third time, and a drift of the multi-beam charged particle microscope 1 is monitored. Depending on the result of the repeated scanning operation and image acquisition of the first scan pattern, a drift compensation by active compensators can be triggered or a calibration or adjustment of the multi-beam charged particle microscope 1 is triggered. Methods and solutions to provide an active drift control are for example disclosed in German patent application 102020206739.2, filed on May 28, 2020 which is hereby incorporated by reference.

Another advantage of a scan program comprising at least a scan pattern of a smaller area compared to a subfield 31.*mn* is given in special inspection tasks, when only surface segments of a wafer surface have to be inspected, for example to perform a metrology task, or a task which is frequently known as die-to-die comparison or die-to-database comparison. In such an inspection task, only segments of a surface of a wafer are inspected and for example compared with each other or for example with data derived from CAD data of an ideal wafer surface. The scanning and image acquisition method according the disclosure is thereby increasing the throughput of a wafer inspection task.

FIG. 15 describes another example of a scan program 762. In an example, the plurality of J primary charged particle beamlets 3 of a multi-beam charged particle microscope 1 is arranged in a hexagonal raster configuration, with center of image subfields 29 distributed at a hexagonal array. FIG. 15 shows an example of 10 centers 29.*ij* of primary charged particle beamlets 3 indicated as crosses (beamlets not shown). In certain known systems, the corresponding image subfields 31 are configured as rectangular image subfields as illustrated in FIG. 3. However, with the image data acquisition unit 810 and the multi-beam scanning and image acquisition method 707 and according the embodiments of the disclosure, it is also possible to raster scan the plurality of primary charged particle beamlets 3 in hexagonal patterns 27*h*. In a hexagonal scan program 762 according hexagonal patterns 27*h*, the length of scanning lines in p direction is variable and changes during scanning of different lines, depending on the q-coordinate. The corresponding image subfields 31.*ij*, which are raster scanned according the hexagonal scan patterns 27*h* therefore have a hexagonal shape (only two of them illustrated without scanning lines 27*h*). Thereby, compared to a rectangular scan pattern according FIG. 3, the maximum value of scanning deflection of each primary charged particle 3 is reduced by about 10% and a scanning induced distortion of third order is reduced by at least 20%, for example 25% to 30%.

A multi-beam charged particle microscope 1 according an embodiment therefore comprises
- a multi-beam generator 300 for generation of a plurality of J primary charged particle beamlets 3 in a hexagonal raster configuration,
- a first collective raster scanner 110 and a second collective raster scanner 222, and
- a detection unit 200 including a detector 207, and
- an imaging control module 820, comprising a scan control unit 930 and an image acquisition unit 810, for scanning and imaging an inspection site of a sample with a plurality of J image subfields 31, each of the plurality of J image subfields 31 having a hexagonal shape.

Figure 16A:
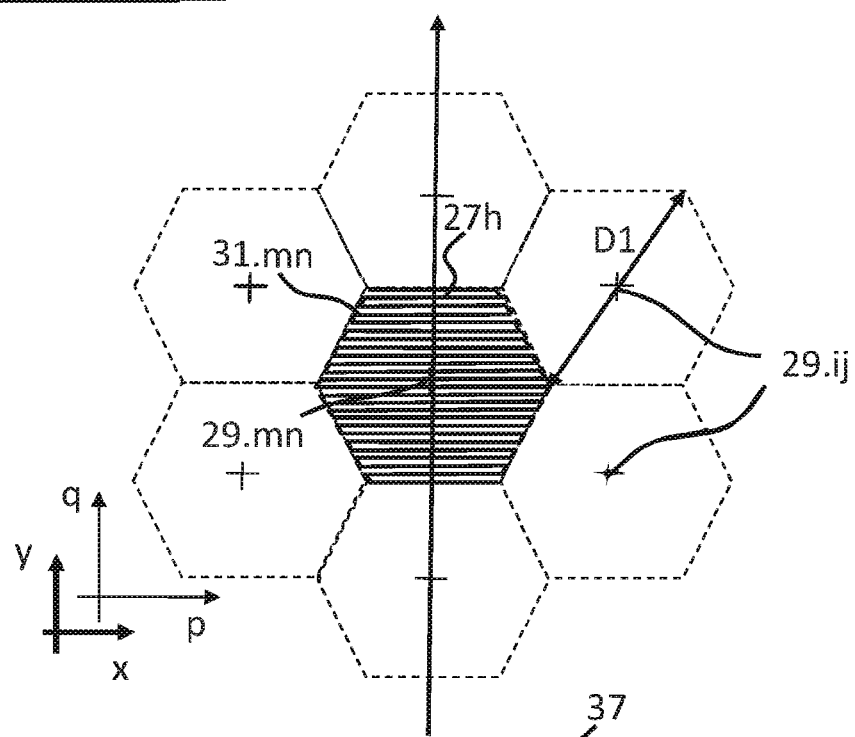
Figure 16B:
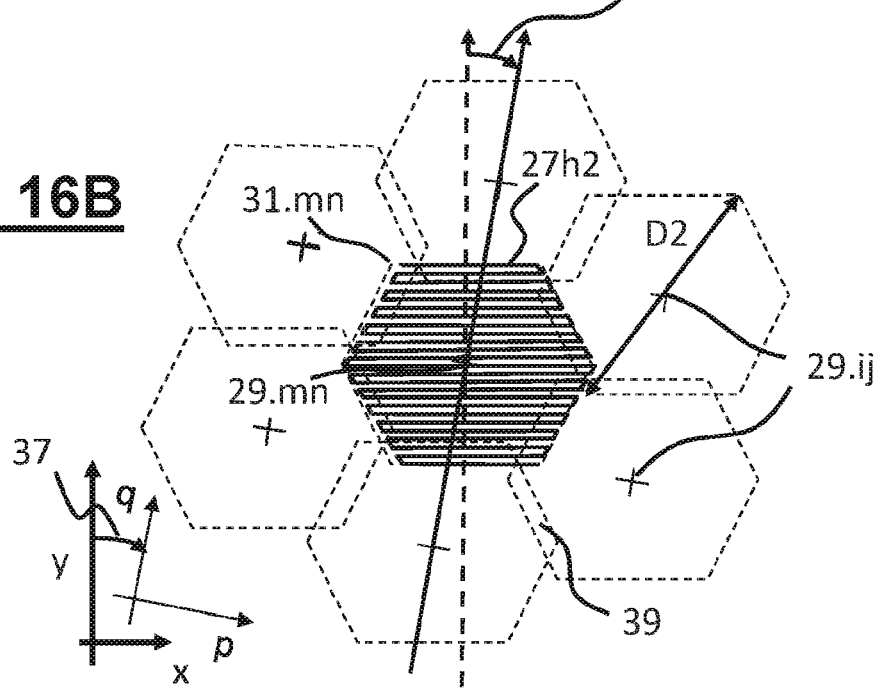

FIG. 16A-16B describes an example of an operation of the multi-beam charged particle microscope 1 with a hexagonal raster configuration of the plurality of primary charged particle beamlets according FIG. 15. Only seven center coordinates 29.*ij* of the plurality of image subfields 31 are illustrated by crosses. Each center coordinate 29.*ij* represents a focus point 5 of one of the plurality of primary charged particle beamlets 3 when the collective multi-beam deflector 110 is in an off state. In FIG. 16a, the configuration of FIG. 15 is shown, with the arrangement of center coordinates arranged in columns and lines parallel to the x-y coordinates. The diameter of one hexagonal subfield 31.*ij*, which is raster scanned by scan pattern 27*h* according the predefined scan program, has a diameter of D1. During operation of the multi-beam charged particle microscope 1, for example due to an adjustment of the working distance or image plane, a rotation 37 of the raster configuration or primary charged particle beamlets 3 may arise due to change of the operating conditions of the objective lens 102, which can be configured as a magnetic immersion lens. With a conventional scanning operation with an unchanged scanning program 27*h*, orientation of the scanning lines would be rotated by the same rotation angle 37 and a scanning operation is not parallel or perpendicular to the x-y-coordinate system, which is coincident with the coordinate system of the sample table 500 and the sample surface 25. A scanning operation with an unmodified scan program for scanning with scan pattern 27*h* would generate scan lines for example along the p-axis, which is rotated with respect to the x axis by angle 37. In such a situation, an imaging result of scanning imaging with the multi-beam charged particle microscope 1 can be depending on the working distance of focus position. With the image data acquisition unit 810 and the multi-beam scanning and image acquisition method 707 according the embodiments above, however, the multi-beam charged particle microscope 1 is configured to maintain a scanning direction for example parallel to an x-direction even when the raster configuration with the center coordinates 29.*ij* and the p-q-coordinate system is rotated by an angle 37. According a rotation 37 of the raster configuration, the first scan program with scan pattern 27*h* is changed to second scan program 27*h*2, which can cover a slightly larger area corresponding to slightly larger image subfields 31 with diameter D2 and with scanning lines in parallel to the x-direction. With a change of at least a length of a scanning line or the number of scanning lines between the first scan program 27*h* and the second scan program 27*h*2, the size of the plurality of J image subfields 31 is changed and the image patch is covered with the plurality of image subfields at the expense of a slight increase of the overlapping areas 39. In addition, during the scan command processing step 724, the scan program 762 comprises a rotation of the sequence of unit scan commands 764 to compensate the rotation of the scanning coordinate system p and q.

The change of the scan program or scan pattern is not limited to hexagonal raster configurations, but can also be applied to one-dimensional raster configurations, circular raster configurations or rectangular raster configurations as illustrated in FIG. 3.

With the image data acquisition unit 810 and the multi-beam scanning and image acquisition method 707 according the embodiments, the multi-beam charged particle microscope 1 is configured for an image scanning with arbitrary scanning orientation of scanning lines, for example parallel to an x-direction, parallel to a y-direction, or parallel to a direction at an arbitrary angle, and thereby maintaining a full coverage of an image patch with a plurality of image subfields of adapted size. For example, the x-y coordinate system represents an orientation of a sample such as a wafer, and the orientation of the scanning lines is oriented at the orientation of structures of the wafer. Such structures can for example be comprising horizontal and vertical lines or edges (so called HV-structures), and in some example it can be desirable to raster scan the lines or edges at a predefined, constant angle, for example normal to the lines or edges. A multi-beam charged particle microscope 1 according an embodiment therefore comprises a multi-beam generator 300 for generation of a plurality of J primary charged particle beamlets 3, a first collective raster scanner 110 and a second collective raster scanner 222, and a detection unit 200 including a detector 207, and an objective lens 102, an imaging control module 820, comprising a scan control unit 930 and an image acquisition unit 810, for controlling of the scanning the plurality of J primary charged particle beamlets 3 and for controlling the acquisition of an image patch of a surface of a sample with a plurality of scanning lines arranged in a plurality of J image subfields 31, wherein the imaging control module 820 is configured to change an orientation of the plurality the scanning lines with respect to an orientation of the sample, and to change the at least a length of a scanning lines or the number of scanning lines in order to change the size of the plurality of J image subfields 31 for covering the image patch. In an example, the change an orientation of the plurality the scanning lines is in accordance with a rotation of the raster configuration of the plurality of J primary charged particle beamlets 3 by change of an operation condition of the objective lens 102.

Throughout the figures, the scan programs 762 are illustrated simplified by illustrating few scanning lines only. It is understood that the number of image pixels can be for example 8000×8000 or more, comprising in such an example 8000 scanning lines.

As will be clear from the description, combinations and various modifications to the examples and embodiments are possible and can be applied in analogy to the embodiments or examples. Charged particle of the primary beam can for example be electrons, but also other charged particles such as He-Ions. Secondary electrons comprise secondary electrons in its narrow sense, but also any other secondary charged particle created by interaction of the primary charged particle beamlets with the sample, such as backscattered electrons or secondary electrons of second order, which are generated by backscattered electrons. In another example, secondary ions can be collected instead of secondary electrons.

The disclosure is described by following clauses:

Clause 1: A method of calibration of a multi-beam charged particle scanning electron microscope 1, comprising a first step of performing a calibration measurement by raster scanning a plurality of primary charged particle beamlets 3 by a collective multi-beam raster scanner 110 with a first driving signal V1(p,q) over the surface 25 of a calibration sample, a second step of deriving a plurality of scanning induced subfield distortion patterns from the calibration measurement, comprising deriving a scanning induced distortion pattern for each of a plurality of primary charged particle beamlets 3, a third step of analyzing the plurality of scanning induced subfield distortion patterns and deriving a correction signal C(p,q), a forth step of modifying the first driving signal V1(p,q) with the correction signal C(p,q) and deriving a modified driving signal V2(p,q) for driving the collective multi-beam raster scanner 110, whereby a maximum scanning induced distortion is reduced.

Clause 2: The method according clause 1, wherein the third step of analyzing comprises deriving a reference distortion pattern of the plurality of scanning induced distortion patterns by statistical methods, the statistical methods comprise any of the computations of an average, a weighted average, or a median; and deriving the correction signal C(p,q) from the reference distortion pattern.

Clause 3: The method according clauses 1 or 2, wherein the first to forth steps are repeated, until a maximum scanning induced subfield distortion of each of the plurality of primary charged particle beamlets 3 is minimized below a predetermined threshold.

Clause 4: The method according clauses 1 or 2, wherein a majority of the maximum scanning induced subfield distortions of the plurality of primary charged particle beamlets 3 is reduced below the predetermined threshold, and a maximum scanning induced subfield distortion of a few individual primary charged particle beamlets exceeds the predetermined threshold.

Clause 5: The method according any of the clauses 1 to 4, wherein the correction signal C(p,q) is stored in a memory of a control unit of the collective multi-beam raster scanner 110, for pre-compensation of a scanning induced distortion according a selected scan program.

Clause 6: A multi-beam scanning and image acquisition method 707 for controlling a collective scanning of a plurality of J primary charged particle beamlets 3 over a plurality of J image subfields and acquiring a plurality of J digital image data corresponding to a plurality of J image subfields with a multi-beam charged particle microscope 1, comprising:

a configuration step 710 for providing a plurality of scan programs and for selection of a selected scan program 762;

a generic scan processing step 720, during which the selected scan program 762 is received and at least a first sequence of pre-compensation digital scan commands 766 and a selection control signal 744 is generated from the selected scan program 762;

a specific scanning deflection control step 730, during which at least a first amplified sequence of drive voltages 774 is generated from the at least first sequence of pre-compensation digital scan commands 766 and during which the at least first amplified sequence of drive voltages 774 is provided to a collective deflection step 742, the collective deflection step 742 for collective deflection of the plurality of J primary charged particle beamlets 3 over the plurality of J image subfields on a surface 25 of a sample 7;

an image data acquisition step 750, during which J streams of fluctuating voltages 786, collected during an analog data collection step 748 from an image sensor unit 207, are converted and selected to form J streams of digital image data values 790, the J streams of digital image data values 790 being written into a common access memory at a plurality of J memory locations to form the plurality of J digital image data corresponding to the plurality of J image subfields, whereby the selection and writing is controlled by the selection control signal 744 generated in and provided by the generic scan processing step 720.

Clause 7: The method of clause 6, further comprising a parallel read out and image processing step 758, during which the plurality of J digital image data corresponding to the plurality of J image subfields is read out from the common access memory and image processing is performed.

Clause 8: The method of clause 7, wherein the image processing step comprises one of an image filtering, an image registration, a threshold operation, an object detection, dimension measurement of image objects, a distortion compensation, a contrast enhancement, a deconvolution operation, or an image correlation applied to each of the plurality of J digital image data corresponding to the plurality of J image subfields.

Clause 9: The method of clause 7, wherein the image processing step comprises a stitching operation to form a single digital image file from the plurality of J digital image data.

Clause 10: The method of any of the clauses 6 to 9, wherein during the generic scan processing step 720, at least a first sequence of unit scan commands 764 is generated in normalized subfield coordinates (u,v) and the first sequence of unit scan commands 764 is converted to the sequence of pre-compensation digital scan commands 766 in image subfield coordinates (p,q) by application of operations including one of a rotation, a change of scale, or a consideration of pre-determined correction function C(p,q).

Clause 11: The method of clause 10, wherein the selection control signal 744 generated during the generic scan processing step 720 comprises the first sequence of unit scan commands 764 and during image data acquisition step 750, the J streams of digital image data values 790 are written to the common access memory at a plurality of J memory locations corresponding to the first sequence of unit scan commands 764.

Clause 12: The method of any of the clauses 6 to 11, wherein the method further comprises a scanning synchronized control step 718 and wherein during the generic scan processing step 720, a synchronized control command 768 is exchanged with the scanning synchronized control step 718.

Clause 13: The method of any of the clauses 6 to 12, wherein plurality of J primary charged particle beamlets 3 is configured in a raster configuration which is during use rotated by a rotation angle with respect to an orientation of a coordinate system of a stage or a sample mounted on the stage, and wherein during the generic scan processing step 720, the sequence of unit scan commands 764 is adjusted to compensate the rotation of the raster configuration.

Clause 14: A multi-beam charged particle microscope 1, comprising at least a first collective raster scanner 110 for collective scanning a plurality of J primary charged particle beamlets 3 over a plurality of J image subfields 31.11 to 31.MN; and a detection system 200, comprising a detector 207 for detecting a plurality of J secondary electron beamlets 9, each corresponding to one of the J image subfields 31.11 to 31.MN; and an imaging control module 820, the imaging control module 820 comprising:
a scan control unit 930, connected to the first collective raster scanner 110 and configured for controlling during use a raster scanning operation of a plurality of J primary charged particle beamlets 3 with the first collective raster scanner 110 according a first selected scan program 762,
at least one image data acquisition unit 810, connected to the scan control unit 930 and the detector 207, configured for acquiring and selecting during use a plurality of S image data from a detector 207 synchronized with a clock signal provided by the scan control unit 930, and configured for writing the plurality of S image data into a parallel access memory 1816 at memory locations corresponding according the first selected scan program 762, wherein S<=J.

Clause 15: The multi-beam charged particle microscope 1 according clause 14, wherein the scan control unit 930 comprises a clock signal generator 938, configured to provide during use the clock signal to scan control unit 930 and image acquisition unit 810.

Clause 16: The multi-beam charged particle microscope 1 according clause 15, wherein the scan control unit 930 is further connected to at least a further system 960, which is configured for synchronized operation with the raster scanning operation.

Clause 17: The multi-beam charged particle microscope 1 according clause 16, wherein at least a further system 960 is a collective deflector 350, configured for collectively deflecting during use the plurality of J primary charged particle into a beam-dump 130.

Clause 18: The multi-beam charged particle microscope 1 according any of the clauses 14 to 16, further comprising in the detection system 200 a second collective raster scanner 222, and the scan control unit 930 is further connected to the second collective raster scanner 222.

Clause 19: The multi-beam charged particle microscope 1 according clause 18, wherein the imaging control module 820 further comprises a voltage supply 925, configured to supply voltages to the scan control unit 930 and image acquisition unit 810, and configured to supply during use driving voltages to the first collective raster scanner 110 or the second collective raster scanner 222.

Clause 20: The multi-beam charged particle microscope 1 according any of the clauses 14 to 19, wherein the scan control unit 930 further comprises
a scan generator module 932, connected to the clock unit 938; and
a first amplifier module 936.1, connected to the first collective raster scanner 110; and
a second amplifier module 936.2, connected to the second collective raster scanner 222;
the scan generator module 932 being configured to generate and provide during use a sequence of pre-compensation digital scan commands to the first amplifier module 936.1 and the second amplifier module 936.2; and
the first amplifier module 936.1 being configured to generate during use at least a first amplified sequence of drive voltages to an electrode of the first collective raster scanner 110;
the second amplifier module 936.2 being configured to generate during use at least a second amplified sequence of drive voltages to an electrode of the second collective raster scanner 110.

Clause 21: The multi-beam charged particle microscope 1 according any of the clauses 14 to 20, wherein the scan generator module 932 is further connected to the image acquisition module 810.

Clause 22: The multi-beam charged particle microscope 1 according any of the clauses 14 to 21, wherein the scan control unit 930 comprises at least a further amplifier module 936.3, connected to a system 960.3 configured for synchronized operation during use with the raster scanning deflection.

Clause 23: The multi-beam charged particle microscope 1 according any of the clauses 14 to 22, wherein the at least one image data acquisition unit 810, or each of the image data acquisition units 810 comprises
an ADC module 1808, comprising a plurality of AD converters connected to the image sensor 207 and configured for converting during use the plurality of S fluctuation voltages 786 into a plurality of S streams of digital sensor data 788; and
an acquisition control unit 1812, connected to the ADC module 1808 and the scan control unit 930 and configured for selecting during use a plurality of S streams of digital image data values 790 from the plurality of S streams of digital sensor data 788 and from a selection control signal 744 provided during use by the scan control unit 930 according the selected scan program 762; and
and image data sorter 1820, connected to the acquisition control unit 1812, the scan control unit 930, and to the parallel access memory 1816;
wherein the image data sorter 1820 is configured for writing during use the plurality of S streams of digital image data values 790 into the parallel access memory 1816 at a plurality of memory addresses corresponding to scan positions of the plurality of J primary charged particle beamlets 3 according the selected scan program 762.

Clause 24: The multi-beam charged particle microscope 1 according clauses 23, wherein the ADC module 1808 is connected to clock unit 938 and configured to receive during use a clock signal from clock unit 938 and to synchronize an operation of the plurality of AD converters for converting during use the plurality of S fluctuation voltages 786 into a plurality of S streams of digital sensor data 788.

Clause 25: The multi-beam charged particle microscope 1 according clauses 24, wherein the clock unit 938 is connected to control unit 800 and configured to receive a control signal from the control unit 800 and is configured to change during use a clock frequency of the clock unit 938.

Clause 26: The multi-beam charged particle microscope 1 according to any of the clauses 14 to 25, wherein the imaging control module 820 comprises a plurality of L image data acquisition units 810, with L being L=8, 10, or more.

Clause 27: The multi-beam charged particle microscope 1 according to clauses 26, wherein the number S is given by S=6, 8, 10 or 12.

Clause 28: A multi-beam charged particle microscope 1, comprising
a multi-beam generator 300 for generation of a plurality of primary charged particle beamlets,
a first collective raster scanner 110 and a second collective raster scanner 222, and
a detection unit 200 including a detector 207, and
an imaging control module 820, comprising a scan control unit 930 and an image acquisition unit 810, for scanning and imaging an inspection site of a sample with a selected scan program 762;

the scan control unit 930 is comprising a generic scan generator module 932 and at least a first amplifier module 936.1 for providing at least a sequence of high voltages to an electrode of the first collective raster scanner 110 and a second amplifier module 936.2 for providing at least a sequence of high voltages to an electrode of the second collective raster scanner 220, wherein the scan control unit 930 is adapted to optionally include a third or a further amplifier module 936.3 or 936.n for control of a third or further operating unit 960.3 or 960.n for synchronized operation during use with the selected scan program 762.

Clause 29: The multi-beam charged particle microscope 1 according clause 28, wherein the generic scan generator module 932 comprises a vertex postprocessing unit which is configured during use for a pre-compensation of a systematic scanning induced aberration of the multi-beam charged particle microscope 1.

Clause 30: The multi-beam charged particle microscope 1 according clause 28, wherein each amplifier module comprises a vertex postprocessing unit, a digital to analog converter and an amplifier, whereby in each amplifier module, a nonlinearity of an operation of the amplifier module in conjunction with the operating unit 960.i for synchronized operation is pre-compensated individually for each operating unit 960.i.

Clause 31: The multi-beam charged particle microscope 1 according clause 30, wherein the operating unit 960.i is the first collective multi-beam raster scanner 110 or second collective multi-beam raster scanner 222.

Clause 32: The multi-beam charged particle microscope 1, configured to perform any of the methods of clauses 1 to 13.

Clause 33: A multi-beam charged particle microscope 1, comprising
a multi-beam generator 300 for generation of a plurality of J primary charged particle beamlets 3 in a hexagonal raster configuration,
a first collective raster scanner 110 and a second collective raster scanner 222, and
a detection unit 200 including a detector 207, and
an imaging control module 820, comprising a scan control unit 930 and an image acquisition unit 810, for scanning and imaging an inspection site of a sample with a plurality of J image subfields 31, each of the plurality of J image subfields 31 having a hexagonal shape.

Clause 34: A multi-beam charged particle microscope 1, comprising
a multi-beam generator 300 for generation of a plurality of J primary charged particle beamlets 3,
a first collective raster scanner 110 and a second collective raster scanner 222, and
a detection unit 200 including a detector 207, and
an objective lens 102,
an imaging control module 820, comprising a scan control unit 930 and an image acquisition unit 810, for controlling of the scanning the plurality of J primary charged particle beamlets 3 and for controlling the acquisition of an image patch of a surface of a sample with a plurality of scanning lines arranged in a plurality of J image subfields 31,
wherein the imaging control module 820 is configured to change an orientation of the plurality the scanning lines with respect to an orientation of the sample.

Clause 35: The multi-beam charged particle microscope 1 according clause 34, wherein the imaging control module 820 is further configured to change the at least a length of a scanning line or the number of scanning lines in order to change the size of the plurality of J image subfields 31 for covering the image patch.

Clause 36: The multi-beam charged particle microscope 1 according clause 34 or 35, further comprising a control unit 800 for controlling an operation condition of the objective lens 102 and wherein the change of the orientation of the plurality the scanning lines is in accordance with a rotation of the raster configuration of the plurality of J primary charged particle beamlets 3 induced by the change of an operation condition of the objective lens 102.

Clause 37: A multi-beam scanning and image acquisition method 707 for controlling a collective scanning of a plurality of J primary charged particle beamlets 3 over a plurality of J image subfields and acquiring a plurality of J digital image data corresponding to a plurality of J image subfields with a multi-beam charged particle microscope 1, comprising:

selection of a selected scan program 762;

collectively deflecting the plurality of J primary charged particle beamlets 3 over the plurality of J image subfields on a surface 25 of a sample 7 according the selected scan program 762;

acquiring J streams of fluctuating voltages 786, converting the J streams of fluctuating voltages 786 with a clock rate 760, to form J streams of digital image data values 790, processing at least two digital image data values from each of the J streams of digital image data values 790 to form a sum, an average digital image data value, or a difference of the digital image data values, writing the J streams of digital image data values 790 including the sum, an average digital image data value, or a difference of the digital image data values into a common access memory 1816 at predefined memory locations.

Clause 38: A method according clause 37, further comprising the steps of:

generating at least a first sequence of pre-compensation digital scan commands 766 and a selection control signal 744 from the selected scan program 762;

generating at least a first amplified sequence of drive voltages 774 from the at least first sequence of pre-compensation digital scan commands 766 providing the at least first amplified sequence of drive voltages 774 to a collective deflection step 742.

Clause 39: A method according clause 37 or 38, wherein the scan program 762 comprises a scanning illumination of a pixel location 55 with each of the plurality of J primary charged particle beamlets 3 within each of the plurality of image subfield 31 with a dwell time corresponding to G times the inverse of a clock rate 760 applied in the step of converting the J streams of fluctuating voltages 786 to form J streams of digital image data values 790, and with G being an integer with G=2, 3, 4 or more.

Clause 40: A method according clause 37 or 39, wherein the scan program 762 comprises a scan pattern 712, 714, 716.1, 716.2 or 716.3, and further comprises a repeated scanning illumination of each pixel location 55 with at least one of the scan patterns 712, 714, 716.1, 716.2 or 716.3 with each of the plurality of J primary charged particle beamlets 3 within each of the plurality of image subfield 31.

A LIST OF REFERENCE NUMBERS IS PROVIDED 1 multi-beamlet charged-particle microscopy and inspection system
3 primary charged particle beamlet or beamlets, forming the plurality of primary charged particle beamlets
5 primary charged particle beam or focus spot
7 object, for example wafer
9 secondary electron beamlet, forming the plurality of secondary electron beamlets
11 secondary electron beam path
13 primary charged particle beam path
15 secondary charged particle image spot
17 image patch
19 overlap area of image patches
21 center position of an image patch
25 wafer surface
27 scanpath of primary beamlet
29 center of an image subfield
31 image subfield or image subfields
33 first inspection site
35 second inspection site
37 rotation of raster configuration
39 overlap areas of subfields 31
53 pixel lines
55 pixels or illuminations spot positions
61, 61.mn address area allocated to one subfield 31, for example subfield 31.mn
63 address locations
65 address lines
67 pixel allocation
69 line allocation
71 temporary memory relocation
73 processing operation
75 temporary memory addresses
100 object irradiation unit
101 object or image or focus plane
102 objective lens
103 field lens group
105 optical axis of multi-beamlet charged-particle microscopy system
108 first beam cross over
109 cross over plane
110 collective multi-beam raster scanner
130 beam dump
153 Deflector electrodes
157 off axis or field beamlet
189 intersection volume of traversing beamlets
200 detection unit
205 projection system
206 electrostatic lens
207 image sensor
208 imaging lens
209 imaging lens
210 imaging lens
212 second cross over
214 aperture filter
216 active element
218 third deflection system
220 multi-aperture corrector
222 second deflection system
300 charged-particle multi-beamlet generator
301 charged particle source
303 collimating lenses
305 primary multi-beamlet-forming unit
306 active multi-aperture plates
307 first field lens
308 second field lens
309 electron beam
311 primary electron beamlet spots
321 intermediate image surface
350 first deflector
351 second deflector
390 beam steering multi aperture plate
400 beam splitter unit
420 magnetic element
500 sample stage
503 Sample voltage supply
601 scanning distortion compensator array
602 scanning compensator array of telecentricity aberration
641 voltage combiner
707 multi-beam scanning and image acquisition method
710 configuration step
712 first example of a scan program
714 second example of a scan program
716 third example of a scan program
718 scanning synchronized control step
720 generic scan processing step
722 receiving step
724 scan command processing step
726 vertex postprocessing step
730 specific scanning deflection control step
732 conversion step
734 vertex postprocessing step
736 DA converting step
738 offset voltage filter step
740 amplification step
742 collective deflection step
744 selection control signal
748 Analog data collection step
750 image data acquisition step
752 AD Conversion step
754 Digital image Data selection
756 Digital Image Data addressing and writing step
758 Parallel read out and image processing step
760 clock signal
762 scan program
764 sequence of unit scan commands
766 sequence of pre-compensation digital scan commands
768 synchronized control commands
770 digital drive signals
772 non-linear voltage signals
774 amplified sequence of drive voltages
776 sequence of digitally corrected drive signals
778 set of digital offsets
780 offset voltage(s)
782 filtered offset voltage(s)
784 stream of image data
786 streams of fluctuating voltages
788 streams of digital sensor data
790 streams of digital image data values
792 plurality of image pixel data
800 control unit
804 scan program selection module
806 nonvolatile memory
810 image data acquisition unit
812 image stitching unit
814 image data processor and output
820 imaging control module
830 primary beam-path control module
925 power supply unit 930 scan control unit
932 Scan Generator module
934 GPIO
936 amplifier modules
938 Clock
940 Conversion and Vertex Postprocessing unit
942 memory and control unit
944 Offset DAC
946 Scan DACs
948 high voltage amplifiers
950 auxiliary scan system
960 scanning synchronized systems
972 high voltage connection
974 digital data connection line
1808 ADC module
1810 Recorder
1812 ACQ
1814 Test Pattern
1816 frame grabber memory bank
1820 Image Data Sorter
1822 pixel averager
1824 line averager
1826 pixel addressing and memory allocating unit

What is claimed is:

1. A method of operating a multi-beam charged particle microscope, the method comprising:
    selecting a scan program from a plurality of scan programs;
    generating, from the selected scan program: i) a first sequence of pre-compensation digital scan commands to pre-compensate a scanning induced distortion of the multi-beam charged particle microscope; and ii) a selection control signal;
    generating, from the first sequence of pre-compensation digital scan commands, a first amplified sequence of drive voltages;
    using the first amplified sequence of drive voltages to collectively deflect a plurality of primary charged particle beamlets generated by the multi-beam charged particle microscope over a plurality of image subfields of the multi-beam charged particle microscope on a surface of a sample in the multi-beam charged particle microscope;
    collecting streams of fluctuating voltages from an image sensor unit of the multi-beam charged particle microscope;
    converting the streams of fluctuating voltages;
    using the selection control signal to control selection of the converted streams of fluctuating voltage to provide streams of digital image data values; and
    using the selection control signal to control writing the streams of digital image data values into a parallel access memory at a plurality of memory locations to provide a plurality of digital image data corresponding to the plurality of image subfields.

2. The method of claim 1, further comprising:
    reading out the plurality of digital image data corresponding to the plurality of image subfields from the common access memory; and
    performing image processing.

3. The method of claim 2, wherein image processing comprises at least one member selected from the group consisting of image filtering, image registration, a threshold operation, object detection, dimension measurement of image objects, distortion compensation, contrast enhancement, a deconvolution operation, and applying an image correlation to each of the plurality of digital image data corresponding to the plurality of image subfields.

4. The method of claim 2, wherein image processing comprises a stitching operation to form a single digital image file from the plurality of digital image data.

5. The method of claim 1, further comprising generating a first sequence of unit scan commands in normalized subfield coordinates and converting the first sequence of unit scan commands to the sequence of pre-compensation digital scan commands in image subfield coordinates by applying operations comprising: i) at least one member selected from the group consisting of rotation, scale change; and ii) consideration of a pre-determined correction function.

6. The method of claim 5, wherein:
    the selection control signal comprises the first sequence of unit scan commands; and
    the method further comprises writing the streams of digital image data values to the common access memory at a plurality of memory locations corresponding to the first sequence of unit scan commands.

7. The method of claim 1, further comprising, generating a control command and using the command signal when generating the first sequence of pre-compensation digital scan commands and the selection control signal to interrupt the selected scan program.

8. The method of claim 1, further comprising:
    rotating the plurality of primary charged particle beamlets by a rotation angle with respect to an orientation of a coordinate system of a stage or a sample mounted on the stage; and
    while generating the first sequence of pre-compensation digital scan commands and the selection control signal, adjusting the sequence of unit scan commands to compensate the rotation of the plurality of primary charged particle beamlets.

9. One or more machine-readable hardware storage devices comprising instructions that are executable by one or more processing devices to perform operations comprising the method of claim 1.

10. A system, comprising:
    one or more processing devices; and
    one or more machine-readable hardware storage devices comprising instructions that are executable by the one or more processing devices to perform operations comprising the method of claim 1.

11. A multi-beam charged particle microscope, comprising:
    a first collective raster scanner configured to collectively scan a plurality of primary charged particle beamlets over a plurality of image subfields;
    a detection system comprising a detector configured to detect a plurality of secondary electron beamlets, each secondary electron beamlet corresponding to one of the image subfields; and
    a scan control unit connected to the first collective raster scanner to control raster scanning of the plurality of primary charged particle beamlets over the plurality of image subfields; and
    an image data acquisition unit connected to the scan control unit and the detector to acquire and select a plurality of image data from the detector in a manner that is synchronized with a clock signal provided by the scan control unit,
    wherein:
        the image data acquisition unit is configured to write the plurality of image data into a parallel access memory at memory locations according to the first selected scan program, and a number of the plurality of image data is at most equal to a number of the plurality of primary charged particle beamlets;
the scan control unit further comprises:
a scan generator module connected to the clock unit; and
a first amplifier module connected to the first collective raster scanner;
the scan generator module is configured to: i) generate a sequence of pre-compensation digital scan commands to pre-compensate a scanning induced distortion of the multi-beam charged particle microscope; and ii) provide the sequence of pre-compensation digital scan commands to the first amplifier module; and
the first amplifier module is configured to: i) generate a first amplified sequence of drive voltages; and ii) provide the first amplified sequence of drive voltages to an electrode of the first collective raster scanner.

12. The multi-beam charged particle microscope of claim 11, wherein the scan control unit comprises a clock signal generator configured to provide the clock signal.

13. The multi-beam charged particle microscope of claim 12, further comprising an additional system connected to the scan control unit and configured to synchronizedly operate with the raster scan.

14. The multi-beam charged particle microscope of claim 13, wherein the additional system comprises a collective deflector configured to collectively deflect the plurality of primary charged particle into a beam-dump.

15. The multi-beam charged particle microscope of claim 11, wherein the detection system further comprises a second collective raster scanner connected to the control unit.

16. The multi-beam charged particle microscope of claim 15, further comprising a voltage supply configured to: i) supply voltages to the scan control unit and the image acquisition unit; and ii) supply driving voltages to the first and second collective raster scanners.

17. The multi-beam charged particle microscope of claim 15, wherein:
the scan control unit further comprises:
a scan generator module connected to the clock unit; and
a second amplifier module connected to the second collective raster scanner; and
the scan generator module is configured to provide the sequence of pre-compensation digital scan commands to the second amplifier module;
the second amplifier module is configured to: i) generate a second amplified sequence of drive voltages; and ii) provide the second amplified sequence of drive voltages to an electrode of the second collective raster scanner.

18. A multi-beam charged particle microscope, comprising:
a multi-beam generator configured to generate a plurality of primary charged particle beamlets;
a first collective raster scanner configured to collectively scan a plurality of primary charged particle beamlets over a plurality of image subfields;
a second collective raster scanner;
a detection unit comprising a detector configured to detect a plurality of secondary electron beamlets, each secondary electron beamlet corresponding to one of the image subfields; and
a scan control unit connected to the first collective raster scanner to control raster scanning of the plurality of primary charged particle beamlets over the plurality of image subfields; and
an image acquisition unit connected to the scan control unit and the detector to acquire and select a plurality of image data from the detector in a manner that is synchronized with a clock signal provided by the scan control unit,
wherein:
the scan control unit comprises:
a generic scan generator module comprising a vertex postprocessing unit configured to pre-compensate a scanning induced aberration of the multi-beam charged particle microscope;
a first amplifier module configured to provide a sequence of high voltages to an electrode of the first collective raster scanner; and
a second amplifier module configured to provide a sequence of high voltages to an electrode of the second collective raster scanner, and
wherein the image data acquisition unit is configured to write the plurality of image data into a parallel access memory at memory locations according to the first selected scan program, and a number of the plurality of image data is at most equal to a number of the plurality of primary charged particle beamlets.

19. The multi-beam charged particle of claim 18, wherein:
each amplifier module comprises a vertex postprocessing unit, a digital to analog converter and an amplifier; and
the multi-beam charged particle is configured so that during use of the multi-beam charged particle, in each amplifier module, a nonlinearity of an operation of the amplifier module in conjunction with the operating unit for synchronized operation is pre-compensated individually for each operating unit.

20. The multi-beam charged particle microscope of claim 19, wherein the operating unit is the first collective multi-beam raster scanner or the second collective multi-beam raster scanner.

21. A multi-beam charged particle microscope, comprising:
a multi-beam generator configured to generate a plurality of primary charged particle beamlets forming a hexagon;
a first collective raster scanner configured to collectively scan the plurality of primary charged particle beamlets over a plurality of hexagonal image subfields;
a second collective raster scanner;
a detection unit comprising a detector configured to detect a plurality of secondary electron beamlets, each secondary electron beamlet corresponding to one of the hexagonal image subfields;
a scan control unit connected to the first collective raster scanner to control raster scanning of the plurality of primary charged particle beamlets over the plurality of hexagonal image subfields; and
an image acquisition unit connected to the scan control unit and the detector to acquire and select a plurality of image data from the detector in a manner that is synchronized with a clock signal provided by the scan control unit,
wherein:
the image data acquisition unit is configured to write the plurality of image data into a parallel access memory at memory locations according to the first selected scan program, and a number of the plurality of image data is at most equal to a number of the plurality of primary charged particle beamlets;

the scan control unit further comprises:
- a scan generator module connected to the clock unit; and
- a first amplifier module connected to the first collective raster scanner;

the scan generator module is configured to: i) generate a sequence of pre-compensation digital scan commands to pre-compensate a scanning induced distortion of the multi-beam charged particle microscope; and ii) provide the sequence of pre-compensation digital scan commands to the first amplifier module; and the first amplifier module is configured to: i) generate a first amplified sequence of drive voltages; and ii) provide the first amplified sequence of drive voltages to an electrode of the first collective raster scanner.

22. A multi-beam charged particle microscope, comprising:
- a multi-beam generator configured to generate a plurality of primary charged particle beamlets;
- a first collective raster scanner configured to collectively scan a plurality of primary charged particle beamlets over a plurality of image subfields;
- a second collective raster scanner;
- a detection unit comprising a detector configured to detect a plurality of secondary electron beamlets, each secondary electron beamlet corresponding to one of the image subfields;
- an objective lens; and
- an imaging control module, comprising:
  - a scan control unit connected to the first collective raster scanner to control raster scanning of the plurality of primary charged particle beamlets; and
  - an image acquisition unit connected to the first collective raster scanner to control raster scanning of the plurality of primary charged particle beamlets over the plurality of image subfields, the image acquisition unit configured to control acquisition of an image patch of a surface of a sample with a plurality of scanning lines arranged in a plurality of image subfields, wherein:
the imaging control module is configured to change an orientation of the plurality the scanning lines with respect to an orientation of the sample;

the image data acquisition unit is configured to write the plurality of image data into a parallel access memory at memory locations according to the first selected scan program, and a number of the plurality of image data is at most equal to a number of the plurality of primary charged particle beamlets;

the scan control unit further comprises:
- a scan generator module connected to the clock unit; and
- a first amplifier module connected to the first collective raster scanner;

the scan control generator is configured to: i) generate a sequence of pre-compensation digital scan commands to pre-compensate a scanning induced distortion of the multi-beam charged particle microscope; and ii) provide the sequence of pre-compensation digital scan commands to the first amplifier module;

the first amplifier module is configured to: i) generate a first amplified sequence of drive voltages; and ii) provide the first amplified sequence of drive voltages to an electrode of the first collective raster scanner.

* * * * *